(12) United States Patent
Pugh

(10) Patent No.: US 7,818,361 B1
(45) Date of Patent: Oct. 19, 2010

(54) METHOD AND APPARATUS FOR PERFORMING TWO'S COMPLEMENT MULTIPLICATION

(75) Inventor: Daniel J. Pugh, San Jose, CA (US)

(73) Assignee: Tabula, Inc., Santa Clara, CA (US)

(*) Notice: Subject to any disclaimer, the term of this patent is extended or adjusted under 35 U.S.C. 154(b) by 1224 days.

(21) Appl. No.: 11/269,858

(22) Filed: Nov. 7, 2005

(51) Int. Cl.
G06F 7/52 (2006.01)
H03K 19/177 (2006.01)

(52) U.S. Cl. .................................... 708/625
(58) Field of Classification Search ............... 708/232, 708/625
See application file for complete search history.

(56) References Cited

U.S. PATENT DOCUMENTS

| | | | |
|---|---|---|---|
| 4,128,890 A * | 12/1978 | Irwin et al. | 708/320 |
| 4,135,249 A * | 1/1979 | Irwin | 708/626 |
| 4,432,066 A * | 2/1984 | Benschop | 708/626 |
| 4,873,459 A | 10/1989 | El Gamal et al. | |
| 5,224,065 A | 6/1993 | Yoshida | |
| 5,245,575 A | 9/1993 | Sasaki et al. | |
| 5,349,250 A | 9/1994 | New | |
| 5,357,153 A | 10/1994 | Chiang et al. | |
| 5,365,125 A | 11/1994 | Goetting et al. | |
| 5,369,622 A | 11/1994 | McLaury | |
| 5,386,156 A | 1/1995 | Britton et al. | |
| 5,426,378 A | 6/1995 | Ong | |
| 5,521,835 A | 5/1996 | Trimberger | |
| 5,532,958 A | 7/1996 | Jiang et al. | |
| 5,552,721 A | 9/1996 | Gould | |
| 5,600,263 A | 2/1997 | Trimberger et al. | |
| 5,610,829 A | 3/1997 | Trimberger | |
| 5,629,637 A | 5/1997 | Trimberger et al. | |
| 5,631,578 A | 5/1997 | Clinton et al. | |
| 5,646,544 A | 7/1997 | Iadanza | |
| 5,646,545 A | 7/1997 | Trimberger et al. | |
| 5,659,484 A | 8/1997 | Bennett et al. | |
| 5,682,107 A | 10/1997 | Tavana et al. | |
| 5,692,147 A | 11/1997 | Larsen et al. | |
| 5,694,057 A | 12/1997 | Gould | |
| 5,701,441 A | 12/1997 | Trimberger | |
| 5,719,889 A | 2/1998 | Iadanza | |

(Continued)

OTHER PUBLICATIONS

U.S. Appl. No. 11/269,869, filed Nov. 7, 2005, Pugh, Daniel, et al.

(Continued)

*Primary Examiner*—Chuong D Ngo
(74) *Attorney, Agent, or Firm*—Adeli & Tollen LLP

(57) ABSTRACT

Some embodiments provide a novel way of performing a signed multiplication. Each individual bit of a first operand is multiplied by every bit of a second operand to generate partial multiplication results. Each partial result is shiftably added to other partial results except one partial result which is shiftably subtracted. For the partial result that is subtracted, the most significant bit of the second operand is negated and is utilized as carry in of the subtraction operation. The most significant bit of each operand is considered to have a negative sign when generating the partial multiplication results. Also, one of the partial results is appended with the most significant bit of the second operand. Some embodiments utilize a configurable IC that performs subtraction with the same circuitry and at the same cost as addition. The configurable IC also utilizes hybrid interconnect/logic circuits to perform part of the multiplication operation.

14 Claims, 36 Drawing Sheets

U.S. PATENT DOCUMENTS

| | | |
|---|---|---|
| 5,732,246 A | 3/1998 | Gould et al. |
| 5,737,235 A | 4/1998 | Kean et al. |
| 5,745,422 A | 4/1998 | Iadanza |
| 5,745,734 A | 4/1998 | Craft et al. |
| 5,761,483 A | 6/1998 | Trimberger |
| 5,764,954 A | 6/1998 | Fuller et al. |
| 5,768,178 A | 6/1998 | McLaury |
| 5,777,360 A | 7/1998 | Rostoker et al. |
| 5,796,268 A | 8/1998 | Kaplinsky |
| 5,802,003 A | 9/1998 | Iadanza et al. |
| 5,805,477 A | 9/1998 | Perner |
| 5,815,726 A | 9/1998 | Cliff |
| 5,825,662 A | 10/1998 | Trimberger |
| 5,889,411 A | 3/1999 | Chaudhary |
| 5,914,616 A | 6/1999 | Young et al. |
| 5,914,906 A | 6/1999 | Iadanza et al. |
| 5,944,813 A | 8/1999 | Trimberger |
| 5,982,655 A | 11/1999 | Doyle |
| 6,002,991 A | 12/1999 | Conn, Jr. |
| 6,023,421 A | 2/2000 | Clinton et al. |
| 6,038,192 A | 3/2000 | Clinton et al. |
| 6,044,031 A | 3/2000 | Iadanza et al. |
| 6,054,873 A | 4/2000 | Laramie |
| 6,069,490 A | 5/2000 | Ochotta et al. |
| 6,075,745 A | 6/2000 | Gould et al. |
| 6,078,191 A | 6/2000 | Chan et al. |
| 6,084,429 A | 7/2000 | Trimberger |
| 6,086,631 A | 7/2000 | Chaudhary et al. |
| 6,091,263 A | 7/2000 | New et al. |
| 6,091,645 A | 7/2000 | Iadanza |
| 6,097,212 A | 8/2000 | Agrawal et al. |
| 6,107,821 A | 8/2000 | Kelem et al. |
| 6,110,223 A | 8/2000 | Southgate et al. |
| 6,118,707 A | 9/2000 | Gould et al. |
| 6,130,854 A | 10/2000 | Gould et al. |
| 6,134,154 A | 10/2000 | Iwaki et al. |
| 6,140,839 A | 10/2000 | Kaviani et al. |
| 6,150,838 A | 11/2000 | Wittig et al. |
| 6,163,168 A | 12/2000 | Nguyen et al. |
| 6,169,416 B1 | 1/2001 | Eaton et al. |
| 6,172,521 B1 | 1/2001 | Motomura |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,184,709 B1 | 2/2001 | New |
| 6,205,076 B1 | 3/2001 | Wakayama et al. |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,396,303 B1 | 5/2002 | Young |
| 6,462,577 B1 | 10/2002 | Lee et al. |
| 6,469,540 B2 | 10/2002 | Nakaya |
| 6,480,954 B2 | 11/2002 | Trimberger |
| 6,483,343 B1 | 11/2002 | Faith et al. |
| 6,487,709 B1 | 11/2002 | Keller et al. |
| 6,490,707 B1 | 12/2002 | Baxter |
| 6,496,918 B1 | 12/2002 | Dehon et al. |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,593,771 B2 | 7/2003 | Bailis et al. |
| 6,601,227 B1 | 7/2003 | Trimberger |
| 6,603,330 B1 | 8/2003 | Snyder |
| 6,611,153 B1 | 8/2003 | Lien et al. |
| 6,629,308 B1 | 9/2003 | Baxter |
| 6,636,070 B1 | 10/2003 | Altaf |
| 6,642,744 B2 | 11/2003 | Or-Bach et al. |
| 6,650,142 B1 | 11/2003 | Agrawal et al. |
| 6,667,635 B1 | 12/2003 | Pi et al. |
| 6,668,361 B2 | 12/2003 | Bailis et al. |
| 6,675,309 B1 | 1/2004 | Baxter |
| 6,686,769 B1 | 2/2004 | Nguyen et al. |
| 6,703,861 B2 | 3/2004 | Ting |
| 6,714,041 B1 | 3/2004 | Darling et al. |
| 6,731,133 B1 | 5/2004 | Feng et al. |
| 6,732,068 B2 | 5/2004 | Sample et al. |
| 6,806,730 B2 | 10/2004 | Bailis et al. |
| 6,809,979 B1 | 10/2004 | Tang |
| 6,810,513 B1 | 10/2004 | Vest |
| 6,829,756 B1 | 12/2004 | Trimberger |
| 6,831,479 B2 | 12/2004 | Lo |
| 6,838,902 B1 | 1/2005 | Elftmann et al. |
| 6,882,182 B1 | 4/2005 | Conn et al. |
| 6,920,627 B2 | 7/2005 | Blodget et al. |
| 6,924,663 B2 | 8/2005 | Masui et al. |
| 6,937,535 B2 | 8/2005 | Ahn et al. |
| 6,956,399 B1 | 10/2005 | Bauer |
| 6,992,505 B1 | 1/2006 | Zhou |
| 6,998,872 B1 | 2/2006 | Chirania et al. |
| 7,010,667 B2 | 3/2006 | Vorbach et al. |
| 7,028,281 B1 | 4/2006 | Agrawal et al. |
| 7,075,333 B1 | 7/2006 | Chaudhary et al. |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 7,129,747 B1 | 10/2006 | Jang et al. |
| 7,138,827 B1 | 11/2006 | Trimberger |
| 7,154,299 B2 | 12/2006 | Swami et al. |
| 7,212,448 B1 | 5/2007 | Trimberger |
| 7,242,216 B1 | 7/2007 | Schmit et al. |
| 7,253,660 B1 | 8/2007 | Leventis et al. |
| 7,259,587 B1 | 8/2007 | Schmit et al. |
| 7,282,950 B1 | 10/2007 | Schmit et al. |
| 7,295,037 B2 | 11/2007 | Schmit et al. |
| 7,301,368 B2 | 11/2007 | Schmit et al. |
| 7,358,765 B2 | 4/2008 | Verma et al. |
| 7,372,297 B1 | 5/2008 | Pugh et al. |
| 2001/0007428 A1 | 7/2001 | Young et al. |
| 2002/0008541 A1 | 1/2002 | Young et al. |
| 2002/0010853 A1 | 1/2002 | Trimberger et al. |
| 2002/0113619 A1 | 8/2002 | Wong |
| 2002/0125910 A1 | 9/2002 | New et al. |
| 2002/0125914 A1 | 9/2002 | Kim |
| 2002/0161568 A1 | 10/2002 | Sample et al. |
| 2002/0163357 A1 | 11/2002 | Ting |
| 2003/0009731 A1 | 1/2003 | Wallace |
| 2003/0042931 A1 | 3/2003 | Ting |
| 2003/0080777 A1 | 5/2003 | Baxter |
| 2003/0110430 A1 | 6/2003 | Bailis et al. |
| 2003/0141898 A1 | 7/2003 | Langhammer et al. |
| 2004/0010767 A1 | 1/2004 | Agrawal et al. |
| 2004/0103265 A1 | 5/2004 | Smith |
| 2004/0196066 A1 | 10/2004 | Ting |
| 2004/0233758 A1 | 11/2004 | Kim et al. |
| 2005/0007155 A1 | 1/2005 | Young |
| 2005/0134308 A1 | 6/2005 | Okada et al. |
| 2005/0146352 A1 | 7/2005 | Madurawe |
| 2006/0186920 A1 | 8/2006 | Feng et al. |
| 2007/0143577 A1 | 6/2007 | Smith |
| 2007/0244957 A1 | 10/2007 | Redgrave |
| 2007/0244958 A1 | 10/2007 | Redgrave et al. |
| 2007/0244959 A1 | 10/2007 | Teig et al. |
| 2007/0244960 A1 | 10/2007 | Schmit et al. |
| 2007/0244961 A1 | 10/2007 | Schmit et al. |
| 2007/0285124 A1 | 12/2007 | Schmit et al. |
| 2008/0018359 A1 | 1/2008 | Schmit et al. |
| 2008/0061823 A1 | 3/2008 | Schmit et al. |

| | | | |
|---|---|---|---|
| 2008/0100339 A1 | 5/2008 | Schmit et al. | |
| 2008/0116931 A1 | 5/2008 | Schmit et al. | |

OTHER PUBLICATIONS

U.S. Appl. No. 12/050,143, filed Mar. 17, 2008, Pugh, Daniel, et al.
U.S. Appl. No. 11/269,518, filed Nov. 7, 2005, Pugh, Daniel, et al.
Non-Final Office Action of U.S. Appl. No. 11/082,222, mailing date Jun. 4, 2008, Schmit, Herman, et al.
Non-Final Office Action of U.S. Appl. No. 11/082,220, mailing date Jun. 6, 2008, Teig, Steven, et al.
Non-Final Office Action of U.S. Appl. No. 11/082,219, mailing date Jun. 4, 2008, Redgrave, Jason, et al.
Non-Final Office Action of U.S. Appl. No. 11/081,878, mailing date Apr. 22, 2008, Redgrave, Jason.
Andraka Consulting Group, Inc., "Multiplication in FPGAs," http://www.andraka.com/multipli.htm, Jan. 25, 2006, pp. 1-7.
Chiricescu, S., et al., "Morphable Multipliers," *FPL 2002, LNCS 2438*, Sep. 2002, pp. 647-656, Springer-Verlag Berlin Heidelberg.
Dehon, A., "Dynamically Programmable Gate Arrays: A Step Toward Increased Computational Density," *Proceedings of the Fourth Canadian Workshop on Field-Programmable Devices*, May 1996, pp. 47-54.
Dehon, A., "Transit Note #121: Notes on Programmable Interconnect," *M.I.T. Transit Project*, Feb. 1995, pp. 1-13.
Dehon, A., et al., "Reconfigurable Computing: What, Why, and Implications for Design Automation," *DAC 1999*, Jun. 1999, ACM, New Orleans, Louisiana.
Giraud-Carrier, C., "A Reconfigurable Data Flow Machine for Implementing Functional Programming Languages," *SIGPLAN Notices*, Sep. 1994, vol. 29 (9): 22-28.
Hauck, S., et al., "High-Performance Carry Chains for FPGAs," *FPGA 98*, Feb. 1998, pp. 223-233, ACM, Monterey, California, USA.
Xing, S., et al., "FPGA Adders: Performance Evaluation and Optimal Design," *IEEE Design & Test of Computers*, Jan.-Mar. 1998, pp. 24-29, IEEE.
Trimberger, S., "Effects of FPGA Architecture on FPGA Routing," *32nd ACM/IEEE Design Automation Conference*, Jun. 1995, ACM.
Non-Final Office Action of U.S. Appl. No. 11/082,222, mailing date Sep. 15, 2009, Schmit, Herman, et al.
Final Office Action of U.S. Appl. No. 11/082,222, mailing date Jan. 28, 2009, Schmit, Herman, et al.
Final Office Action of U.S. Appl. No. 11/082,220, mailing date Mar. 9, 2009, Teig, Steven, et al.
Non-Final Office Action of U.S. Appl. No. 11/081,878, mailing date Sep. 14, 2009, Redgrave, Jason.
Final Office Action of U.S. Appl. No. 11/081,878, mailing date Jan. 28, 2009, Redgrave, Jason.
Non-Final Office Action of U.S. Appl. No. 11/269,869, mailing date Oct. 5, 2009, Pugh, Daniel J., et al.
Non-Final Office Action of U.S. Appl. No. 11/269,518, mailing date Sep. 29, 2009, Pugh, Daniel J., et al.
"§3 Programmable Logic Devices," *Digital System Design*, 2001 Month N/A, slides 3.1-3.28.
"Design for Low Power in Actel Antifuse FPGAs", Actel Application Note, 2000 Actel Corporation, Sep. 2000, pp. 1-8.
"The Xilinx Virtex Series FPGA," Jan. 22, 2001, slides 1-22.
"Unifying Sequential and Spatial Computing with a Single Instruction Set Architecture," *ISCA '04*, Jun. 19-23, 2004, ACM, Munchen, Oberbayern, Germany.
Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, CA, USA.
Ahmed, E., et al., "The Effect of LUT and Cluster Size on Deep-Submicron FPGA Performance and Density," *FPGA 2000*, Feb. 2000, ACM, Monterey, CA, USA.
Altera Corp., "6. DSP Blocks in Stratix II Devices," *SII52006-1.0*, Feb. 2004, pp. 1-32.
Altera, "Stratix II DSP Performance," *White Paper*, Feb. 2004, pp. 1-9, ver. 1.0, Altera Corporation, San Jose, CA.

Backus, J., "Can Programming be Liberated from the Von Neumann Style? A Functional Style and its Algebra of Programs," *Communications of the ACM*, Aug. 1978, pp. 613-641, vol. 21, No. 8, ACM.
Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California.
Brand, D., et al., "Minimization of AND-EXOR Expressions Using Rewrite Rules," *IEEE Transactions on Computers*, May 1993, pp. 568-576, IEEE.
Butts, M., "Future Directions of Dynamically Reprogrammable Systems," *IEEE 1995 Custom Integrated Circuits Conference*, May 1995, pp. 487-494, IEEE.
Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.
Caspi, E., et al., "A Streaming Multi-Threaded Model," *MSP-3*, Dec. 2, 2001, pp. 1-23.
Caspi, E., et al., "Stream Computations Organized for Reconfigurable Execution (SCORE): Introduction and Tutorial," Aug. 25, 2000, pp. 1-31, Version 1.0.
Ciemat, J.V., et al., "Annealing Placement by Thermodynamic Combinatorial Optimization," *ACM Transactions on Design Automation of Electronic Systems*, Jul. 2004, pp. 310-332, vol. 9, No. 3, ACM, New York, NY.
Compton, K., et al., "An Introduction to Reconfigurable Computing," *IEEE Computer*, Apr. 2000.
Compton, K., et al., "Reconfigurable Computing: A Survey of Systems and Software," *ACM Computing Surveys*, Jun. 2002, pp. 171-210, vol. 34, No. 2, ACM, New York, NY.
Cong, J., et al., "A Theory on Partially-Dependent Functional Decomposition with Application in LUT-based FPGA," 1997 Month N/A, pp. 1-22.
Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.
Coudert, O., "Chapter 13: Doing Two-Level Logic Minimization 100 Times Faster," Proceedings of the 6th annual ACM-SIAM symposium on Discrete algorithms, Jan. 1995, pp. 112-121.
Damiani, M., et al., "The Disjunctive Decomposition of Logic Functions," *Proceedings of the 1997 IEEE/ACM International Conference on Computer-Aided Design*, Nov. 1997, pp. 78-82, San Jose, California, USA.
Davare, A., et al., "The Best of Both Worlds: The Efficient Asynchronous Implementation of Synchronous Specifications," *DAC '04*, Jun. 7-11, 2004, ACM, San Diego, California, USA.
Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, 10 pages.
Dehon, A., "DPGA Utilization and Application," *Proceedings of the 1996 ACM Fourth International Symposium on Field-Programmable Gate Arrays FPGA*, Feb. 11-13, 1996, Monterey, California, USA.
Dehon, A., "Reconfigurable Architectures for General-Purpose Computing," *A.I. Technical Report No. 1586*, Oct. 1996, pp. i-353.
Dehon, A., "The Density Advantage of Configurable Computing," Apr. 2000, pp. 41-49, IEEE.
Dehon, A., et al., "Design Patterns for Reconfigurable Computing," *Proceedings of the IEEE Symposium on Field-Programmable Custom Computing Machines*, Apr. 2004.
Dehon, A., et al., "DPGA-Coupled Microprocessors: Commodity ICs for the Early 21st Century," *FCCM '94-IEEE Workshop on FPGAs for Custom Computing Machines*, Apr. 1994, Napa Valley, California, USA.
Enzler, R., et al., "Virtualizing Hardware with Multi-Context Reconfigurable Arrays," *Lecture Notes in Computer Science*, Sep. 2003, pp. 151-160.
Gayasen, A., et al., "Reducing Leakage Energy in FPGAs Using Region-Constrained Placement," *FPGA '04*, Feb. 22-24, 2004, pp. 51-58, ACM, Monterey, California, USA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley*, Fall 2000 Month N/A, pp. 1-190.

Goldstein, S.C., et al., "PipeRench: A Coprocessor for Streaming Multimedia Acceleration", *In International Symposium on Computer Architecture (ISCA)*, pp. 28-39, May 1999.

Goldstein, S.C., et al., "PipeRench: A Reconfigurable Architecture and Compiler," Apr. 2000, pp. 70-77, IEEE.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319, USA.

IBM, "SPU Application Binary Interface Specification, Version 1.3," *CBEA JSRE Series*, Aug. 1, 2005, pp. iv-26, USA.

IBM, "SPU Assembly Language Specification, Version 1.2," *CBEA JSRE Series*, Aug. 1, 2005, pp. iii-22, USA.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

Kaviani, A., et al., "Computational Field Programmable Architecture," *Custom Integrated Circuits Conference, 1998, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Kravets, V.N, et al., "Generalized Symmetries in Boolean Functions," Proceedings of the 2000 IEEE/ACM International Conference on Computer-Aided Design, Nov. 2000, San Jose, California.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, California, USA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005) 2005*, Apr. 18-20, 2005.

Lewis, D., et al., "The Stratix-II Routing and Logic Architecture," *Proceedings of the 2005 ACM/SIGDA 13th International Symposium on Field-Programmable Gate Arrays*, pp. 1-22, Feb. 20-22, 2005, Monterey, California, USA.

Ling, A., "The Search for the Optimal FPGA Logic Block," 2001 Month N/A, ACM.

M2000, "FlexEOS Embedded FPGA Cores," 2003 Month N/A, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

MathStar, Inc., "MathStar FPOA Architecture: A New Approach to High Throughput, Scalable, and Reprogrammable Design," *Technology Overview*, 2003 Month N/A, MathStar, Inc.

Mirsky, E., et al., "Matrix: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "Matrix: A Reconfigurable Computing Device with Configurable Instruction Distribution and Deployable Resources (Extended Abstract)," *Hot Chips Symposium 1997*, Aug. 1997.

Mishchenko, A., "Fast Computation of Symmetries in Boolean Functions," Computer-Aided Design of Integrated Circuits and Systems, Nov. 2003.

Mishchenko, A., et al., "A New Enhanced Constructive Decomposition and Mapping Algorithm," *DAC 2003*, Jun. 2-6, 2003, pp. 143-148, ACM, Anaheim, California, USA.

Morris, K., "Lattice Launches XP: Non-Volatility at the Forefront of FPGA," *FPGA and Programmable Logic Journal*, Mar. 1, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Ochotta, E.S., et al., "A Novel Predictable Segmented FPGA Routing Architecture," *FPGA 98*, Feb. 1998, pp. 3-11, ACM, Monterey, CA, USA.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.

Parhami, B., "Part IV: Low-Diameter Architectures," *ECE 254B: Advanced Computer Architecture: Parallel Processing, UCSB*, Spring 2005 Month N/A, slides 1-93, Behrooz Parhami, Santa Barbara, California, USA.

Perissakis, S., et al., "Embedded DRAM for a Reconfigurable Array," *Proceedings of the 1999 Symposium on VLSI Circuits*, Jun. 1999, slides 1-24.

Perissakis, S., et al., "Embedded DRAM for a Reconfigurable Array," *Proceedings of the 1999 Symposium on VLSI Circuits*, Jun. 1999.

Perkowski, M.A., "A New Representation of Strongly Unspecified Switching Functions and its Application to Multi-Level AND/OR/EXOR Synthesis," Proc. Of the $2^{nd}$ Workshop on Applications of Reed-Muller Expansion in Circuit Design, Aug. 27-29, 1995, pp. 143-151, Chiba City, Japan.

Plunkett, B., "In Search of the SDR Holy Grail," *A Technology Application Whitepaper*, Apr. 28, 2004 but © 2003, pp. 1-7, QuickSilver Technology, Inc., San Jose, California.

Plunkett, B., et al., "Adapt2400 ACM Architecture Overview," *A Technology Whitepaper*, 2004 Month N/A, pp. 1-9, QuickSilver Technology, Inc.

QuickLogic Corp., "Ultra-Low Power FPGA Combining Performance, Density, and Embedded RAM", *Eclipse II Family Data Sheet*, Nov. 2005, pp. 1-92, QuickLogic Corporation, US.

QuickSilver Technology, Inc., "Adapt2000 ACM System Platform," Apr. 2004, pp. 1-39, QuickSilver Technology, Inc., San Jose, California.

QuickSilver Technology, Inc., "InSpire SDK Tool Set," *Product Brief*, 2004 Month N/A, QuickSilver Technology, Inc., San Jose, California, USA.

QuickSilver Technology, Inc., "QS2412 Adaptive Computing Machine," *Product Brief*, 2004 Month N/A, QuickSilver Technology, Inc., San Jose, California, USA.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," *34th International Symposium on Multiple-Valued Logic (ISMVL '04)*, May 2004, pp. 2-5.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, California.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, Nevada, USA.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18, 1997.

Schmit, H., et al., "FPGA Switch Block Layout and Evaluation," *FPGA '02*, Feb. 24-26, 2002, ACM, Monterey, California, USA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Scholl, C., "Multi-output Functional Decomposition with Exploitation of Don't Cares," May 19-21, 1997.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Sheeran, M., "Generating Fast Multipliers Using Clever Circuits", Lecture Notes in Computer Science, Springer Berlin/Heidelberg, 2004 Month N/A, 15 pages.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, California, USA.

Soviani, et al., "Optimizing Sequential Cycles through Shannon Decomposition and Retiming", *Design, Automation, and Test in Europe*, Mar. 10, 2006, pp. 1085-1090.

Stankovic, R.S., et al., "Remarks on the Number of Logic Networks with Same Complexity Derived from Spectral Transform Decision Diagrams," Proceedings Int. TICS Workshop on Spectral Methods and Multi-Rate Signal Processing, SMMSP '02, Sep. 7-8, 2002, pp. 163-170, Toulouse, France.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, California, USA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs" *University of British Columbia, Department of Elecrical and Computer Engineering*, Jun. 2005, slides 1-39, Vancouver, British Columbia, Canada.

Tom, M., et al., "Logic Block Clustering of Large Designs for Channel-Width Constrained FPGAs" *DAC 2005*, Jun. 13-17, 2005, pp. 726-731, ACM, Anaheim, California, USA.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20.

Weaver, N., et al., "The SFRA: A Corner-Turn FPGA Architecture," *FPGA '04*, Feb. 22-24, 2004, ACM, Monterey, California, USA.

Wegener, I., "The Complexity of Boolean Functions," *Wiley-Teubner Series in Computer Science*, 1987 Month N/A, John Wiley & Sons Ltd. and B.G. Teubner, Stuttgart, New York.

Wilton, S.J.E., "Memory-to-Memory Connection Structures in FPGAs with Embedded Memory Arrays," *FPGA 97*, Feb. 1997, pp. 10-16, ACM, Monterey, California, USA.

Xilinx, Inc., "Virtex-4 Family Overview," *Advance Product Specification*, Sep. 10, 2004, pp. 21-30, v1.1, Xilinx, Inc.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

Zuchowski, P.S., "A Hybrid ASIC and FPGA Architecture," 2002 Month N/A, IEEE.

* cited by examiner

| 2405 | 2410 | 2415 |
|---|---|---|
| LUT 3 in a 4-LUT tile is utilized to compute $A_0*B_0$ in the first of the three sub-cycles needed for a 2-by-8 multiplication | The 4-LUT tile comprising LUTs 1-4 is utilized as a 4-bit adder in the second of three sub-cycles needed for a 2-by-8 multiplication | The 4-LUT tile comprising LUTS 1-4 is utilized as a 4-bit adder in the third of three sub-cycles needed for a 2-by-8 multiplication |

METHOD AND APPARATUS FOR PERFORMING TWO'S COMPLEMENT MULTIPLICATION

CROSS REFERENCE TO RELATED APPLICATIONS

This Application is related to the following applications: U.S. patent application Ser. No. 11/269,869, filed Nov. 7, 2005; U.S. patent application Ser. No. 11/269,505, filed Nov. 7, 2005, now issued as U.S. Pat. No. 7,372,297; U.S. patent application Ser. No. 12/050,143, filed Mar. 17, 2008; and U.S. patent application Ser. No. 11/269,518, filed Nov. 7, 2005, now issued as U.S. Pat. No. 7,765,249.

FIELD OF THE INVENTION

The present invention is directed towards using configurable and reconfigurable ICs to perform mathematical operations.

BACKGROUND OF THE INVENTION

The use of configurable integrated circuits ("IC's") has dramatically increased in recent years. One example of a configurable IC is a field programmable gate array ("FPGA"). An FPGA is a field programmable IC that often has logic circuits, interconnect circuits, and input/output (I/O) circuits. The logic circuits (also called logic blocks) are typically arranged as an internal array of circuits. These logic circuits are typically connected together through numerous interconnect circuits (also called interconnects). The logic and interconnect circuits are often surrounded by the I/O circuits. Like some other configurable IC's, the logic circuits and interconnect circuits of an FPGA are configurable.

FIG. 1 illustrates a portion of a prior art configurable IC 100. As shown in this figure, the IC 100 includes an array of configurable logic circuits 105 and configurable interconnect circuits 110. The IC 100 has two types of interconnect circuits 110a and 110b. Interconnect circuits 110a connect interconnect circuits 110b and logic circuits 105, while interconnect circuits 110b connect interconnect circuits 110a to other interconnect circuits 110a. In some cases, the IC 100 includes hundreds or thousands of logic circuits 105 and interconnect circuits 110.

FPGA's have become popular as their configurable logic and interconnect circuits allow the FPGA's to be adaptively configured by system manufacturers for their particular applications. Also, in recent years, several configurable IC's have been suggested that are capable of reconfiguration at runtime. However, there has not been much innovation regarding IC's that can configure one or more times during one clock cycle. Consequently, most reconfigurable IC's take several cycles (e.g., tens, hundreds, or thousands of cycles) to reconfigure.

There is a need in the art for configurable IC's that can configure at least once during each clock cycle. Ideally, the configurable IC can configure multiple times within one clock cycle. Such configurability would have many advantages, such as enabling an IC to perform numerous functions within any given clock cycle. There is also a need in the art to make the interconnect circuits configurable. It is desirable to enable some of the interconnect circuits to configurably perform either interconnect operations or logic operations.

SUMMARY OF THE INVENTION

Some embodiments of the invention provide a configurable integrated circuit ("IC"). The configurable IC includes a set of configurable logic circuits for configurably performing a set of functions on a set of inputs. The IC also includes several input select interconnect circuits for selecting the input set supplied to each configurable logic circuit. Each input select interconnect circuit is associated with a particular configurable logic circuit. When a configurable logic circuit is used to perform a multiplication operation, at least one of its associated input select interconnect circuits performs a logic operation that implements part of the multiplication operation.

Some embodiments provide a reconfigurable IC. This IC includes a set of reconfigurable circuits for performing a mathematical operation in more than one reconfiguration cycle. To perform the mathematical operation when at least one operand has n bits, the reconfigurable circuits performs a first sub-operation on m of n bits in a first reconfiguration cycle, and a second sub-operation on p of n bits in a second reconfiguration cycle. The reconfigurable IC also includes at least one storage element for storing at least a portion of the results of the first sub-operation for use during the second reconfiguration cycle in the second sub-operation.

Some embodiments provide a novel way of performing a signed multiplication. In this multiplication, each individual bit of a first operand is multiplied by every bit of a second operand to generate partial multiplication results. Each partial result is shiftably added to other partial results except one partial result which is shiftably subtracted. For the partial result that is subtracted, the most significant bit of the second operand is negated and is utilized as carry in of the subtraction operation. The most significant bit of each operand is considered to have a negative sign when generating the partial multiplication results. The partial multiplication result, which was generated by multiplying the least significant bit of the first operand to every bit of the second operand, is appended with a most significant bit equal to the most significant bit of the second operand. Some embodiments implement this signed multiplication operation using a configurable IC that performs subtraction with the same circuitry and at the same cost as addition. The configurable IC also utilizes hybrid interconnect/logic circuits to perform part of the multiplication operation.

Some embodiments provide a reconfigurable IC that implements a design that is designed at a particular design clock rate. The reconfigurable IC includes reconfigurable circuits for performing operations on a set of inputs in the particular design. The IC further includes routing circuits for routing signals to and from the logic circuits to allow the logic circuits to perform the operations. The reconfigurable IC implements the design by having reconfigurable circuits that reconfigure at a rate faster than the design clock rate. For at least one operation which is defined at the design clock rate, the reconfigurable IC replicates the operation set in at least two reconfiguration cycles to reduce consumption of routing circuits.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

Figure 1:
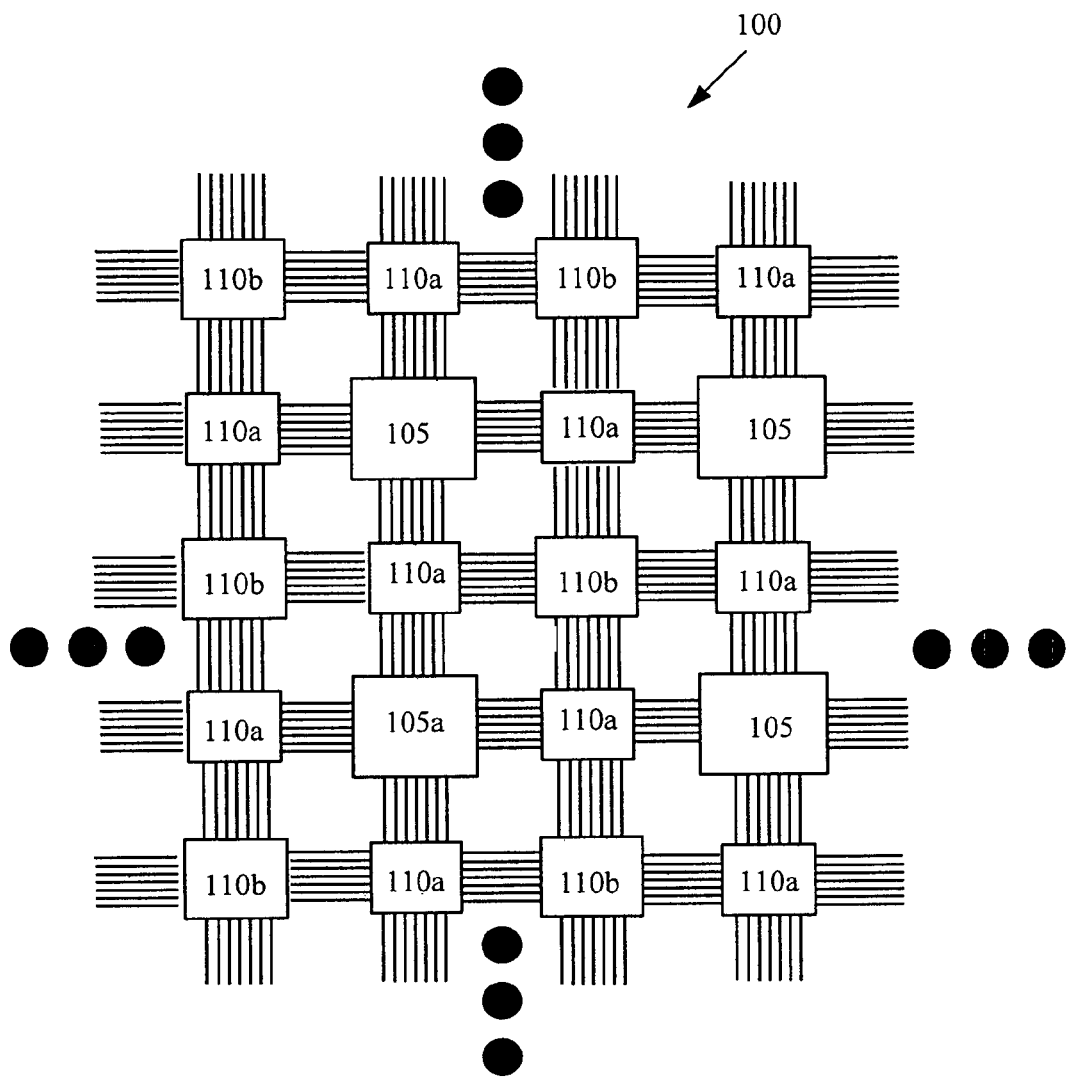
FIG. 1 illustrates an example of a portion of a prior art configurable IC.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Overview

Some embodiments of the invention provide a configurable integrated circuit ("IC"). The configurable IC includes a set of configurable logic circuits for configurably performing a set of functions on a set of inputs. The IC also includes several input select interconnect circuits for selecting the input set supplied to each configurable logic circuit. Each input select interconnect circuit is associated with a particular configurable logic circuit. When a configurable logic circuit is used to perform a multiplication operation, at least one of its associated input select interconnect circuits performs a logic operation that implements part of the multiplication operation.

Some embodiments provide a reconfigurable IC. This IC includes a set of reconfigurable circuits for performing a mathematical operation in more than one reconfiguration cycle. To perform the mathematical operation when at least one operand has n bits, the reconfigurable circuits performs a first sub-operation on m of n bits in a first reconfiguration cycle, and a second sub-operation on p of n bits in a second reconfiguration cycle. The reconfigurable IC also includes at least one storage element for storing at least a portion of the results of the first sub-operation for use during the second reconfiguration cycle in the second sub-operation.

Some embodiments provide a novel way of performing a signed multiplication. In this multiplication, each individual bit of a first operand is multiplied by every bit of a second operand to generate partial multiplication results. Each partial result is shiftably added to other partial results except one partial result which is shiftably subtracted. For the partial result that is subtracted, the most significant bit of the second operand is negated and is utilized as carry in of the subtraction operation. The most significant bit of each operand is considered to have a negative sign when generating the partial multiplication results. The partial multiplication result, which was generated by multiplying the least significant bit of the first operand to every bit of the second operand, is appended with a most significant bit equal to the most significant bit of the second operand. Some embodiments implement this signed multiplication operation using a configurable IC that performs subtraction with the same circuitry and at the same cost as addition. The configurable IC also utilizes hybrid interconnect/logic circuits to perform part of the multiplication operation.

Some embodiments provide a reconfigurable IC that implements a design that is designed at a particular design clock rate. The reconfigurable IC includes reconfigurable circuits for performing operations on a set of inputs in the particular design. The IC further includes routing circuits for routing signals to and from the logic circuits to allow the logic circuits to perform the operations. The reconfigurable IC implements the design by having reconfigurable circuits that reconfigure at a rate faster than the design clock rate. For at least one operation which is defined at the design clock rate, the reconfigurable IC replicates the operation set in at least two reconfiguration cycles to reduce consumption of routing circuits.

Several more detailed embodiments of the invention are described in sections below. Before describing these embodiments further, an overview of the configurable IC architecture that is used by some of these embodiments is first described below in Section II. This discussion is followed by the discussion in Section III of the use of hybrid multiplexers to perform multiplication. Next, Section IV describes implementation of 2's complement multipliers. Next, Section V describes performing mathematical operations in multiple sub-cycles. Last, Section VI describes an electronics system that has an IC which implements some of the embodiments of the invention.

II. Configurable IC Architecture

A configurable integrated circuit (IC) is an IC that has configurable circuits. In some embodiments, a configurable IC includes configurable computational circuit (e.g., configurable logic circuits) and configurable routing circuits for routing the signals to and from the configurable computation units. In addition to configurable circuits, a configurable IC might include non-configurable circuits (e.g., non-configurable logic circuits, interconnect circuits, memories, etc.).

A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

Reconfigurable IC's are one type of configurable IC's. Reconfigurable IC's are configurable IC's that can reconfigure during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data. Some embodiments of the invention are implemented in reconfigurable IC's that are sub-cycle reconfigurable (i.e., can reconfigure circuits on a sub-cycle basis).

In some embodiments, runtime reconfigurability means reconfiguring without resetting the reconfigurable IC. Resetting a reconfigurable IC entails in some cases resetting the values stored in the state elements of the IC, where state elements are elements like latches, registers, and non-configuration memories (e.g., memories that store the user signals as opposed to the memories that store the configuration data of the configurable circuits). In some embodiments, runtime reconfigurability means reconfiguring after the reconfigurable IC has started processing of the user data. Also, in some embodiments, runtime reconfigurability means reconfiguring after the reconfigurable IC has powered up. These definitions of runtime reconfigurability are not mutually exclusive. Configurable and reconfigurable ICs are described in detail in U.S. patent application Ser. No. 11/081,859, "Configurable IC with Interconnect Circuits that also Perform Storage Operations", filed on Mar. 15, 2005, now issued as U.S. Pat. No. 7,342,415.

Figure 2:
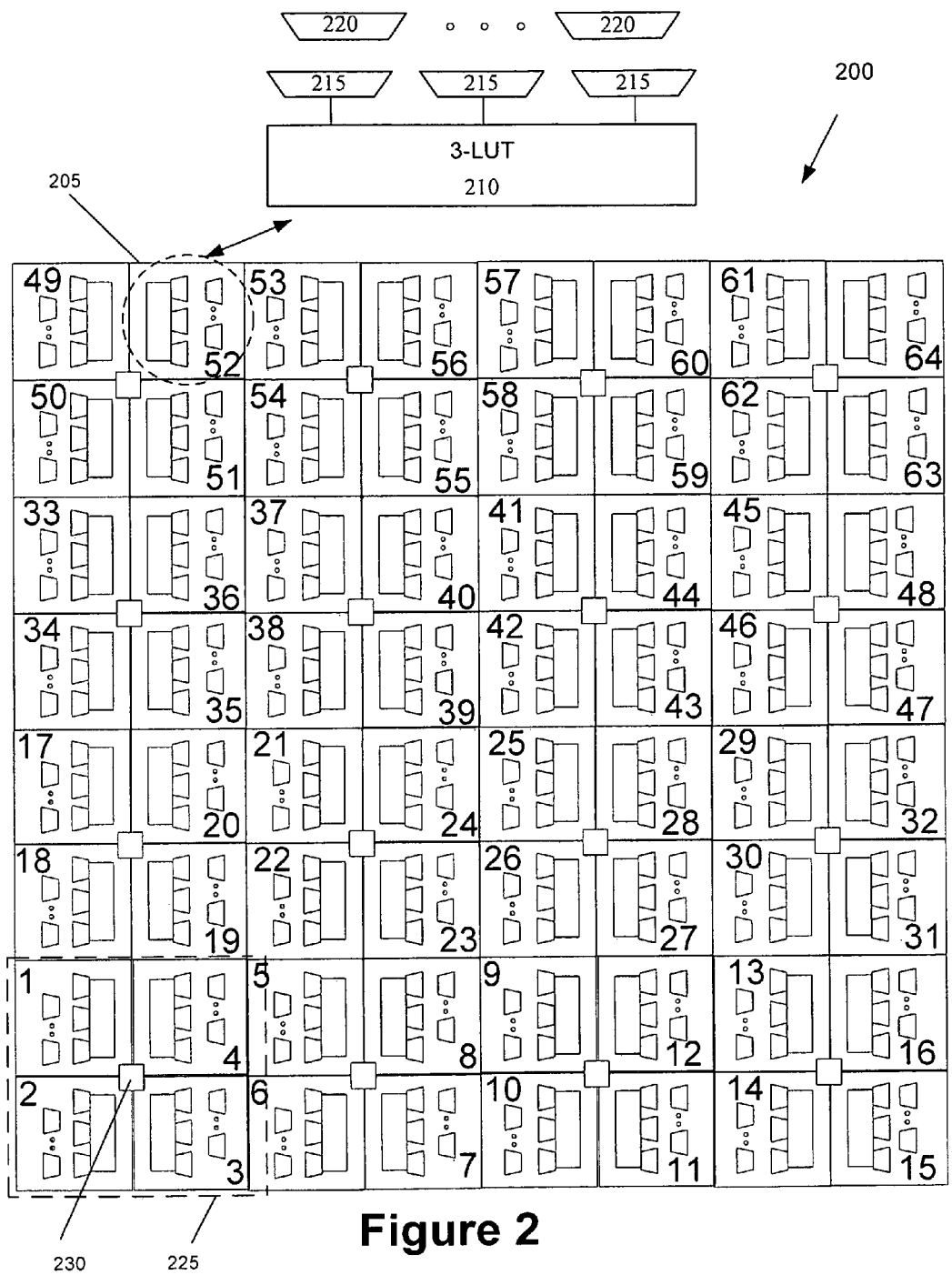
FIG. 2 illustrates a configurable IC of some embodiments in which each four tiles share one carry logic circuit.

FIG. 2 conceptually illustrates a portion of the configurable circuit architecture of some embodiments of the invention. As shown in FIG. 2, this architecture is formed by numerous configurable tiles 205 that are arranged in an array with multiple rows and columns. In FIG. 2, each configurable tile includes a configurable three-input logic circuit 210, three configurable input-select interconnect circuits 215, and several configurable routing interconnect circuits 220. Different embodiments have different number of configurable routing interconnect circuits 220. For instance, some embodiments may have eight configurable routing interconnect circuits while others may have more or less such circuits. For each configurable circuit, the configurable IC 200 includes a set of storage elements for storing a set of configuration data.

In some embodiments, the logic circuits are look-up tables (LUTs) while the interconnect circuits are multiplexers. Also, in some embodiments, the LUTs and the multiplexers are sub-cycle reconfigurable circuits, as described in U.S. Patent Application "Configurable IC with Routing Circuits with Offset Connections", Ser. No. 11/082,193, filed on Mar. 15, 2005, now issued as U.S. Pat. No. 7,295,037. In some of these embodiments, the configurable IC stores multiple sets of configuration data for a sub-cycle reconfigurable circuit, so that reconfigurable circuit can use a different set of configuration data in different sub-cycles. Other configurable tiles can include other types of circuits, such as memory arrays instead of logic circuits.

In FIG. 2, an input-select multiplexer 215 is an interconnect circuit associated with the LUT 210 that is in the same tile as the input select multiplexer. One such input select multiplexer receives input signals for its associated LUT and passes one of these input signals to its associated LUT.

In FIG. 2, a routing multiplexer (also referred to as an RMUX) 220 is an interconnect circuit that at a macro level connects other logic and/or interconnect circuits. In other words, unlike an input select multiplexer in this figure that only provides its output to a single logic circuit (i.e., that only has a fan out of 1), a routing multiplexer in some embodiments either provide its output to several logic and/or interconnect circuits (i.e., has a fan out greater than 1), or provides its output to other interconnect circuits.

In some embodiments, an RMUX is a complementary pass logic (CPL) implemented 8-to-1 multiplexer that has a latch built in its output stage. In a CPL implementation of a circuit, a complementary pair of signals represents each logic signal. In other words, the circuit receives true and complement sets of input signals and provides true and complement sets of output signals. To implement the latch function of an RMUX, the two (true and complement) outputs of the 8-to-1 multiplexer are cross coupled with two NMOS transistors that receive a latch enable signal at their gates. This implementation of an RMUX is further described in the above mentioned U.S. patent application Ser. No. 11/081,859.

In the architecture illustrated in FIG. 2, each tile includes one three-input LUT, three input select multiplexer and several routing multiplexers. In addition, every four tiles 225 share a carry logic circuit 230. In the examples used in this application, the term 4-LUT tile refers to four 1-LUT tiles with a common carry logic circuit. As mentioned above, each LUT is a three-input LUT. For each input, there is an input select multiplexer (IMUX) that selects the input from a variety of inputs.

In the embodiments described below, two of the three IMUXs are hybrid multiplexers called HUMUXs. An HUMUX (or HMUX for short) is a multiplexer that can receive "user-design signals" or configuration data. A user-design signal within a configurable IC is a signal that is generated by a circuit (e.g., logic circuit) of the configurable IC. The word "user" in the term "user-design signal" connotes that the signal is a signal that the configurable IC generates for a particular application that a particular user has configured the IC. User-design signal is abbreviated to user signal in some of the discussion below.

Figure 34:
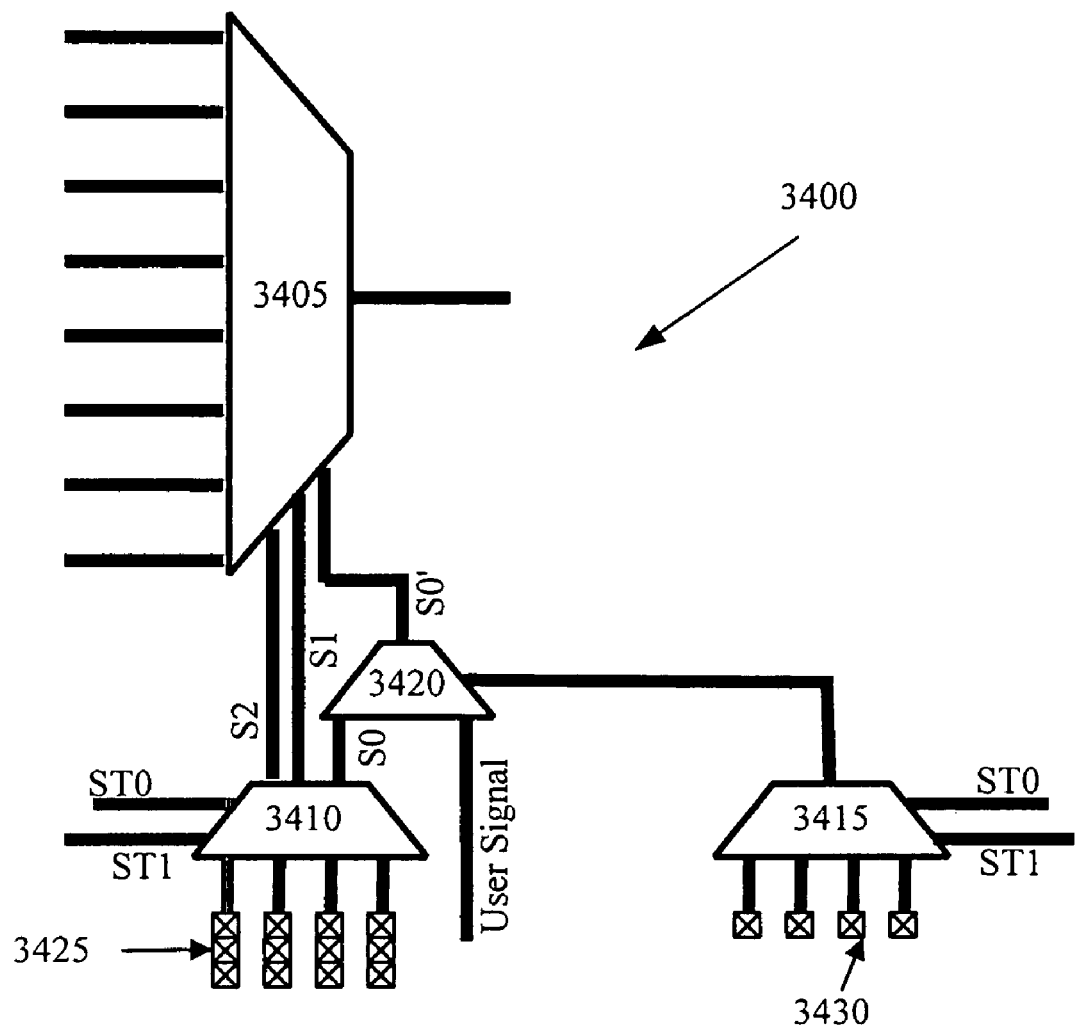
FIG. 34 illustrates an eight-to-one HMUX that is formed by four multiplexers.

FIG. 34 illustrates an example of a sub-cycle configurable HUMUX 3400 that is implemented for a sub-cycle configurable IC of some embodiments of the invention. This example is a sub-cycle configurable HUMUX that is implemented in complementary pass logic (CPL) for a sub-cycle configurable IC. As mentioned above, in a CPL implementation of a circuit, a complementary pair of signals represents each logic signal. In other words, the circuit receives true and complement sets of input signals and provides true and complement sets of output signals.

As shown in FIG. 34, the HUMUX 3400 is an eight-to-one HUMUX that is formed by four multiplexers 3405, 3410, 3415, and 3420. The inputs and outputs of these multiplexers are shown as thick lines to indicate that each of these lines represents a CPL true/complement pair of lines.

As shown in FIG. 34, the multiplexer 3405 is an eight-to-one multiplexer that, on a sub-cycle basis, connects one of its input lines to its output line based on the values of the signals S2, S1, and S0', which it receives along its three select lines. In response to three signals ST0, ST1, and CLK (which is not illustrated in FIG. 34), the multiplexer 3410 supplies two of the select signals S2 and S1 to the multiplexer 3405 on a sub-cycle basis. Specifically, based on the signals ST0 and ST1 that it receives on its select lines, the multiplexer 3410 connects one of its four three-bit input lines (each of which connects to a storage element 3425 that stores configuration data) to its three output lines. Hence, the three output lines of multiplexer 3410 provide three configuration select signals S2, S1, and S0. Two of these output lines connect to the third and second select lines of the multiplexer 3405, in order to provide the select signals S2 and S1.

The first output line of the multiplexer 3410 carries the first select signal S0. This output line connects to one of the two input lines of the multiplexer 3420. The other input line of the multiplexer 3420 receives a user signal. Through its two input lines, the multiplexer 3420 receives two inputs on a sub-cycle basis. The multiplexer 3420 supplies one of its two inputs to its output line based on the signal that it receives on a sub-cycle basis on its select line from the multiplexer 3415. This output line connects to the first select line of the multiplexer 3405 to provide the select signal S0'. Hence, the signal S0' is a signal that in each sub-cycle might be either a user signal or configuration-driven select signal S0.

Which of these signals gets routed to the multiplexer 3405 as the select signal S0' depends on the value of the configuration data output from the multiplexer 3415 on a sub-cycle basis. The multiplexer 3415 is a four-to-one multiplexer that (1) has its four inputs connected to four storage elements storing four configuration data bits, and (2) has one output that receives one of the four configuration data bits in each sub-cycle based on the signals ST0 and ST1 supplied to the select lines of the multiplexer 3415. In some embodiments, one of the inputs to an HMUX is permanently inverted. This inversion can be especially advantageous when the input to some logic circuits need to be inverted.

In some embodiments, a user signal is not a configuration or clock signal that is generated by or supplied to the configurable IC. In some embodiments, a user signal is a signal that is a function of at least a portion of the configuration data received by the configurable IC and at least a portion of the inputs to the configurable IC. In these embodiments, the user signal can also be dependent on (i.e., can also be a function of) the state of the configurable IC. The initial state of a configurable IC is a function of the configuration data received by the configurable IC and the inputs to the configurable IC. Subsequent states of the configurable IC are functions of the configuration data received by the configurable IC, the inputs to the configurable IC, and the prior states of the configurable IC. HMUX structures are described in U.S. patent application Ser. No. 11/082,221 entitled "Hybrid Configurable Circuit for Configurable IC", filed on Mar. 15, 2005, now issued as U.S. Pat. No. 7,224,182.

HMUXs are hybrid interconnect/logic circuits. In other words, HMUXs can serve as logic and interconnect circuits in a configurable IC. An HMUX (such as 3405) operates as an interconnect circuit when all its input select lines (S0-S2 for HMUX 3405) are configuration data and operates as a logic circuit when it receives at least one user signal on one of its input select lines (S0 for multiplexer 3405).

This hybrid quality is especially advantageous since, as logic circuits, HMUXs can be used to decompose and implement functions. In order to decompose and implement functions with HMUXs, some embodiments define one input of some or all HMUXs to be a permanently inverting input. The use of HMUX to decompose functions is further described in the above-mentioned U.S. patent application Ser. No. 11/082,221. This application also further describes the use of HMUXs for some or all of the input select multiplexers. It further describes the use of HMUXs as some or all of the routing multiplexers.

To reiterate, the embodiments described below are described by reference to a configurable IC that has a plurality of 3-input LUTs that are arranged in groups of four tiles as illustrated in FIG. 2. Each 3-input LUT has three associated input select multiplexers that select its inputs. Two of these three input select multiplexers are HMUXs. Each 1-LUT tile has eight routing multiplexers.

Even though the embodiments described below are described with reference to this specific architecture, one of ordinary skill in the art would realize that other embodiments might be implemented in configurable ICs with other architecture that utilize features of this architecture differently. For instance, some embodiments might use HMUXs differently (for example, they might not just use HMUXs as input select multiplexers but might use them as a part of routing multiplexers or other types of interconnects). Other embodiments might use other types of logic circuits other than LUTs and/or might use more complex LUTs such as 4-input or 5-input LUTs. Moreover, the interconnects in the other embodiments might not be multiplexers but might be other types of interconnects.

III. Use of HMUX for Multiplication

A. Multiplying a 2-Bit Value by an n-Bit Value Using 1-Bit Adders

Figure 3:
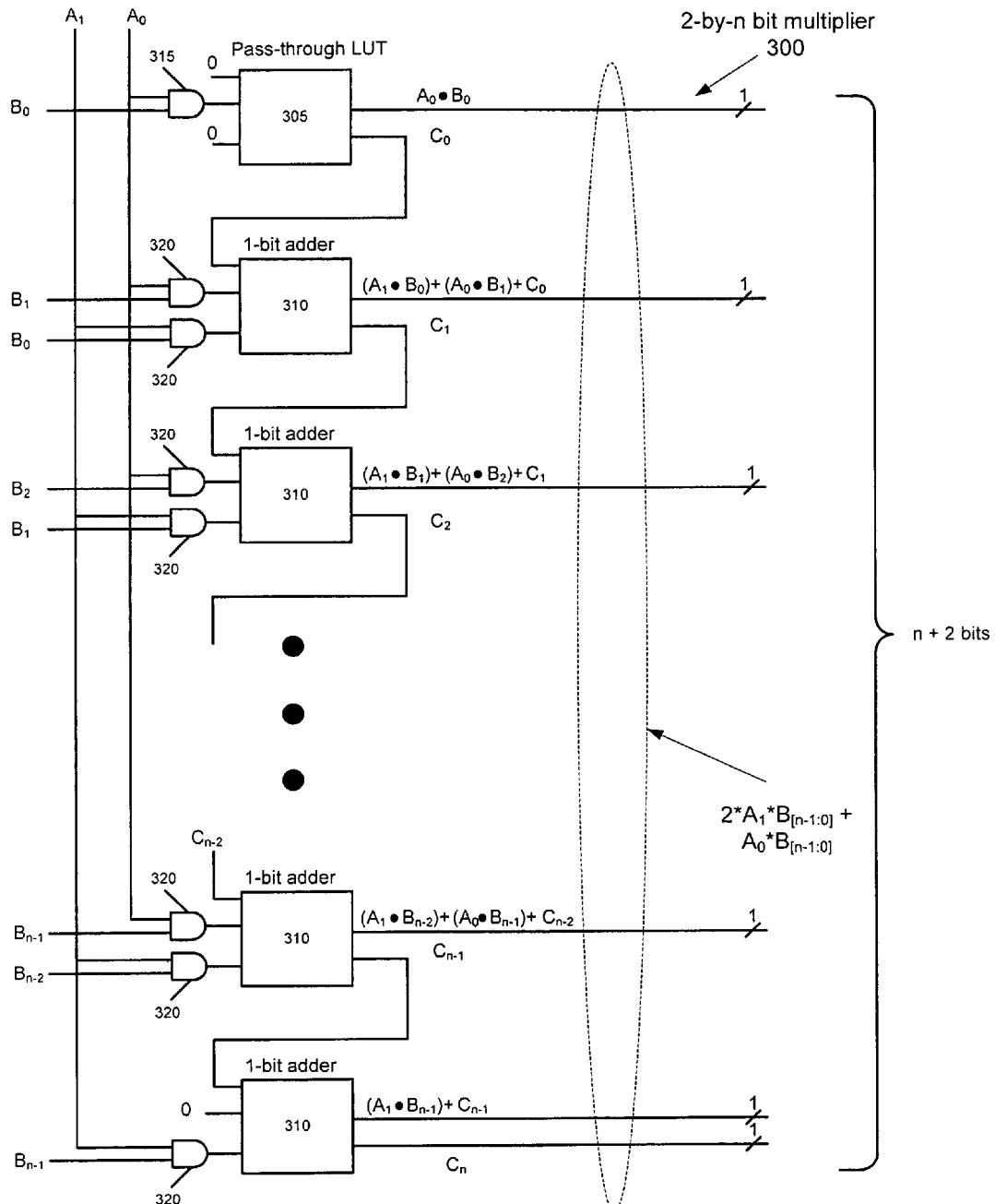
FIG. 3 illustrates an example of a 2-by-n bit unsigned multiplier utilizing 1-bit adders.

In some embodiments, a 2-by-n multiplier is implemented using a series of 1-bit adders. FIG. 3 illustrates a 2-by-n bit unsigned multiplier 300 that is formed by several 1-bit adders 305-310 connected to each other. Each 1-bit adder receives three inputs bits and generates two output bits. The three input bits are the two 1-bit operands and the carry-in. The two output bits are sum and carry-out. The 1-bit adders illustrated in FIG. 3 are chained together by connecting the carry-out of each stage to the carry-in of the next stage.

The multiplier 300 multiplies two binary numbers A and B as multiplier and multiplicand respectively. The binary multiplier, A, has two bits $A_0$ and $A_1$. The binary multiplicand, B, has n bits, $B_0$ to $B_{n-1}$ where $B_{n-1}$ is the most significant bit. The multiplier 300 performs the multiplication by adding two n-bit numbers. The first n-bit number is generated by multiplying $A_0$ by B where a bit-wise multiplication of $A_0$ is done with individual bits of B. Each bit-wise multiplication is performed by one of the input AND gates 315-320.

Similarly, the second n-bit number is generated by multiplying $A_1$ by B where a bit-wise multiplication of $A_1$ is done with individual bits of B. This second n-bit number is shifted to the left by one position and is added to the first n-bit number described above. An example of the partial products generated in a 2-by-n bit multiplication is given below. In this example and throughout this application, the notion $B_jA_k$ is used to denote bit j of binary number B multiplied by bit k of binary number A. If either or both bits are 0, the result would be 0. If both bits are 1, the result would be 1. Therefore, the bitwise multiplication denoted by $B_jA_k$ is logical AND of the two bits $B_j$ and $A_k$. The following example shows the partial products generated by multiplying the n-bit multiplicand B by the 2-bit multiplier A.

| $B_{n-1}$ | ... | $B_3$ | $B_2$ | $B_1$ | $B_0$ |
|---|---|---|---|---|---|
|  |  |  |  | $A_1$ | $A_0$ |
|  | $B_{n-1}A_0$ | ... | $B_2A_0$ | $B_1A_0$ | $B_0A_0$ |
| $B_{n-1}A_1$ | $B_{n-2}A_1$ | ... | $B_1A_1$ | $B_0A_1$ |  |
| $B_{n-1}A_1+C_{n-2}$ | ... | $B_1A_1+B_2A_0+C_1$ | $B_0A_1+B_1A_0$ | $B_0A_0$ |  |

In the above example, $C_i$ is the carry generated after the $i^{th}$ bit of the result is generated. As shown above, every bit of the multiplicand, B, is multiplied by $A_0$. This operation generates n partial results $B_0A_0$ to $B_{n-1}A_0$. Every bit of the multiplicand is also multiplied by $A_1$. Since $A_1$ has a weight of $2*A_0$, the partial results generated by multiplying $A_1$ and B are shifted once to the left before they are added to the corresponding results generated by multiplying $A_0$ to B.

As illustrated in FIG. 3, each partial result, $B_jA_k$, is generated by an AND gate 315-320 and the result is used as an input to one of the adders 305-310. The partial results are then added using the 1-bit adders 305-310. Since the least significant bit of the result, i.e., $B_0A_0$ does not involve an addition operation; it does not generate a carry. Furthermore, as illustrated in FIG. 3, this bit can either be generated by using an AND gate 315 to generate $B_0A_0$ and a LUT 305 as pass-through.

As indicated above, each 1-bit adder generates two 1-bit outputs, sum and carry-out. The "sum" output of the first adder (stage 0 adder) is $A_0B_0$. The "sum" output of other stages such as j, is $(A_0B_j)+(A_1B_{j-1})+C_{j-1}$. The carry-out of the first adder which is a pass-through LUT is always zero. The carry outputs of other adders depend on the values of the adder three inputs. The carry-out from the last adder is the most significant bit of the multiplication. If the multiplicand has n bits, the final result of the multiplication will have n+2 bits.

B. Utilizing 4-Bit Adders to Implement Multipliers

1. Use of 4-Bit Adders to Multiply a 2-Bit Value by a 4-Bit Value

Figure 4:
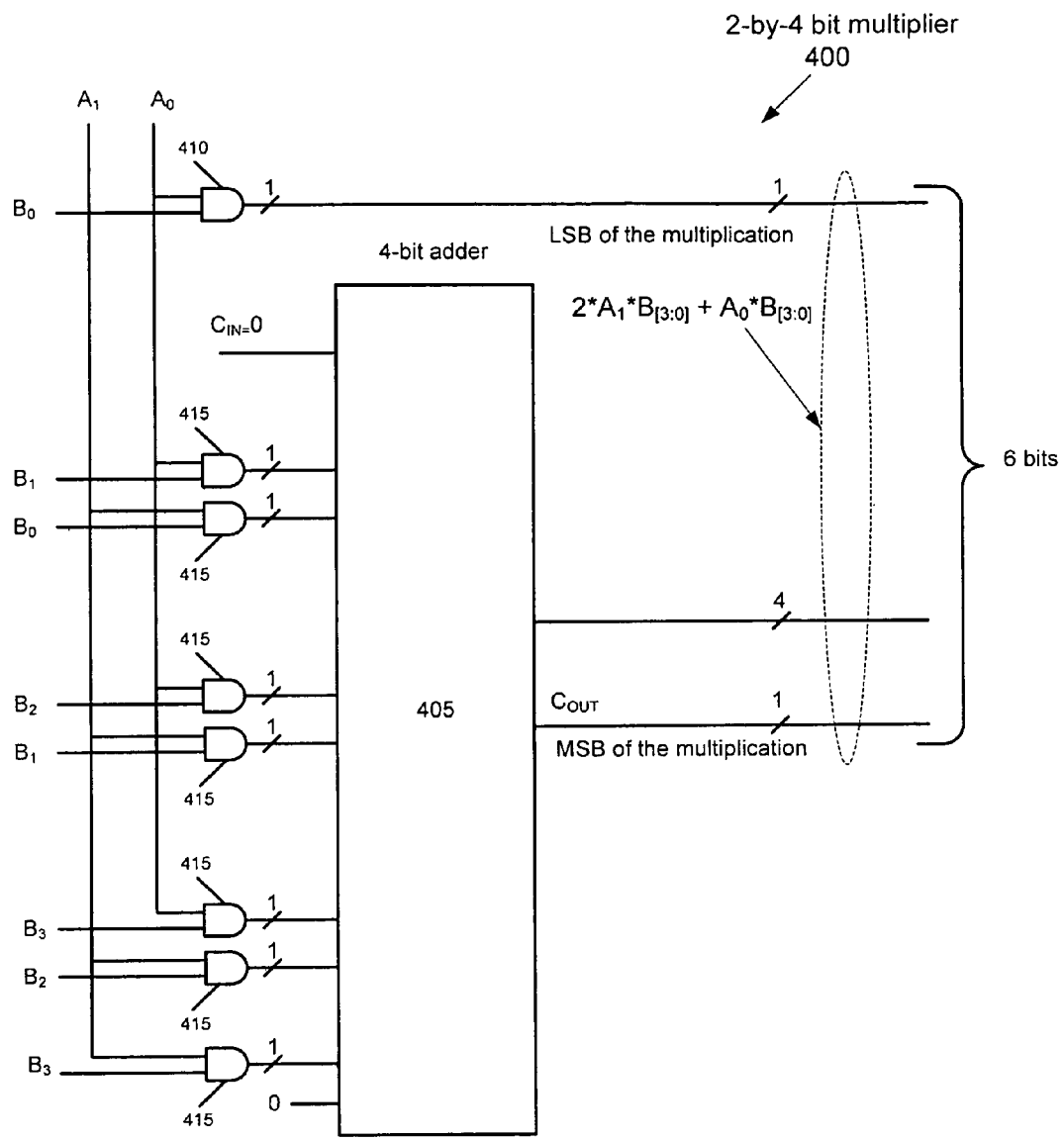
FIG. 4 conceptually illustrates a 2-by-4 bit unsigned multiplier implemented using a 4-bit adder.

As discussed above, several 1-bit adders can be chained together to implement a 2-by-n bit multiplier as illustrated in FIG. 3. This method of chaining the adders has the draw back that the carry has to ripple through the adder in the chain before the final result is generated. Some embodiments utilize a 4-bit adder to implement a 2-by-4 bit multiplier. As is described further below, some of these embodiments implement a 4-bit adder with fast carry logic shared among the logic circuits performing the 4-bit addition operation. FIG. 4 conceptually illustrates the use of a 4-bit adder 405 to implement a 2-by-4 bit multiplier 400. Similar to FIG. 3, AND gates 410-415 are utilized to AND each of the two bits of the binary multiplier A with individual bits of the multiplicand B. The output of the AND gates 410 are used as input to the 4-bit adder 405. The final output has 6 bits. The least significant bit of the final output is $B_0A_0$ which is the output of AND gate 410. Since as mentioned above, $B_0A_0$ is not added to any other bit, it can be directly sent to output without inputting it to the adder. From the other five bits of the result, the most significant bit of the multiplication is the carry out of the 4-bit adder. The other 4 bits of the result are the 4-bit "sum" output of the 4-bit adder.

Figure 5A:
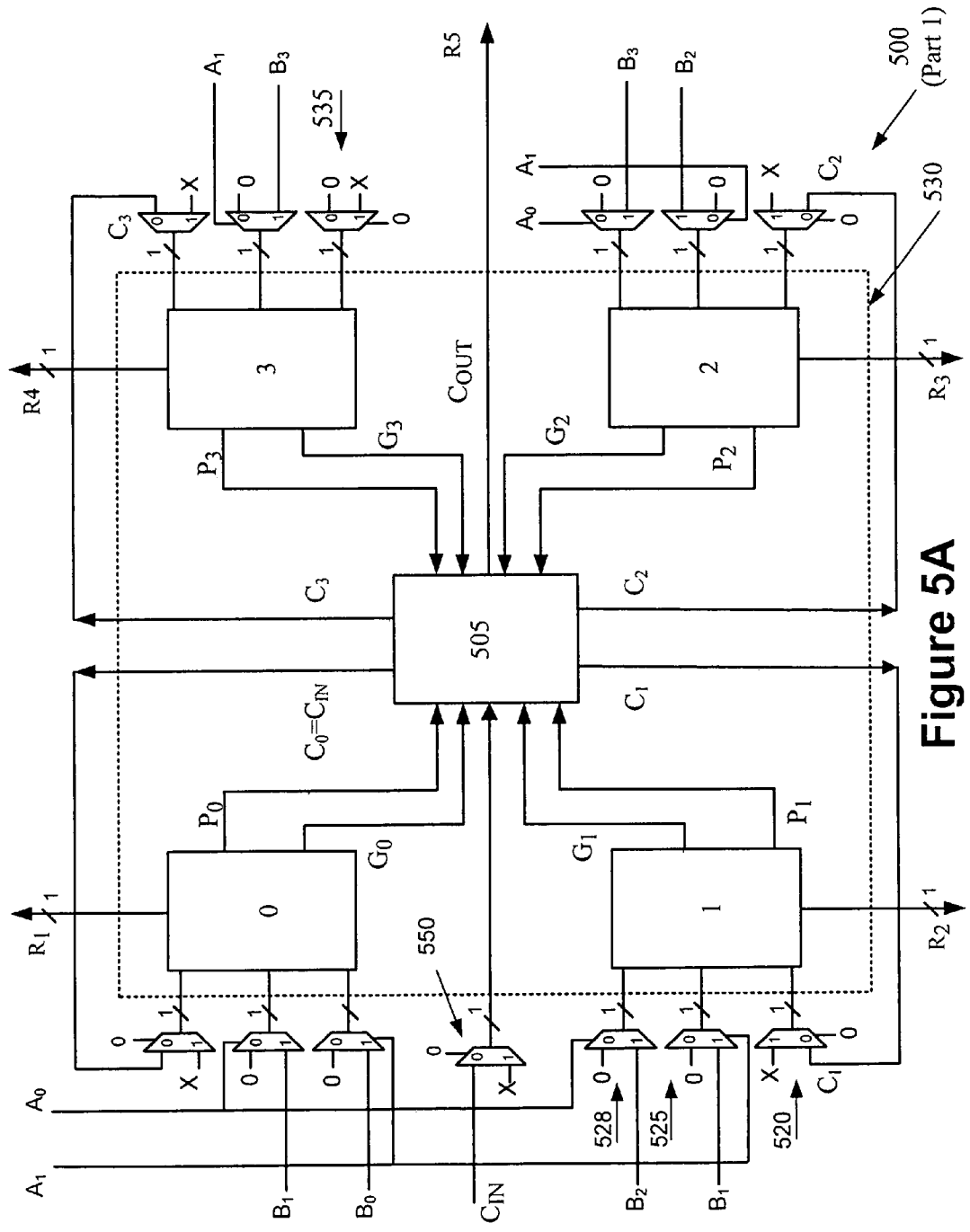
FIG. 5A shows an example of using a 4-bit adder with shared carry and HMUXs as a building block for a 2-by-4 bit unsigned multiplier in some embodiments.
Figure 5B:
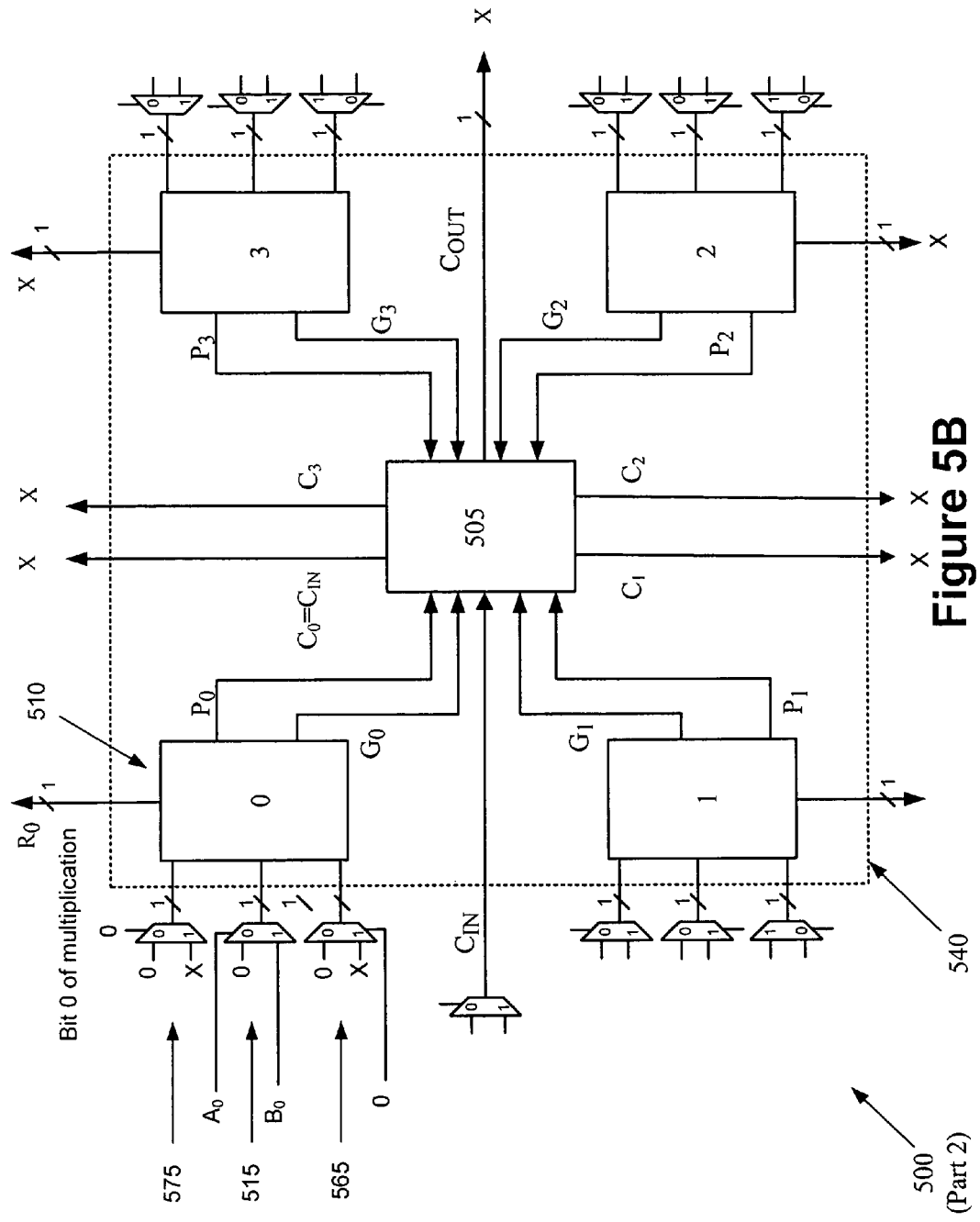
FIG. 5B shows an example of using a 1-input LUT as a building block for a 2-by-4 bit unsigned multiplier in some embodiments.

Some embodiments define one common carry chain that is shared among four logic circuits in the tile layout. FIGS. 5A and 5B illustrate two such layouts 530 and 540. As shown in these figures, each layout includes four logic circuits (0-3) and a shared carry logic 505. In some embodiments, each layout such as 530 or 540 and its associated multiplexers are implemented using a group of four tiles in a configurable IC such as the 4-tile group 225 shown in FIG. 2.

Figure 6:
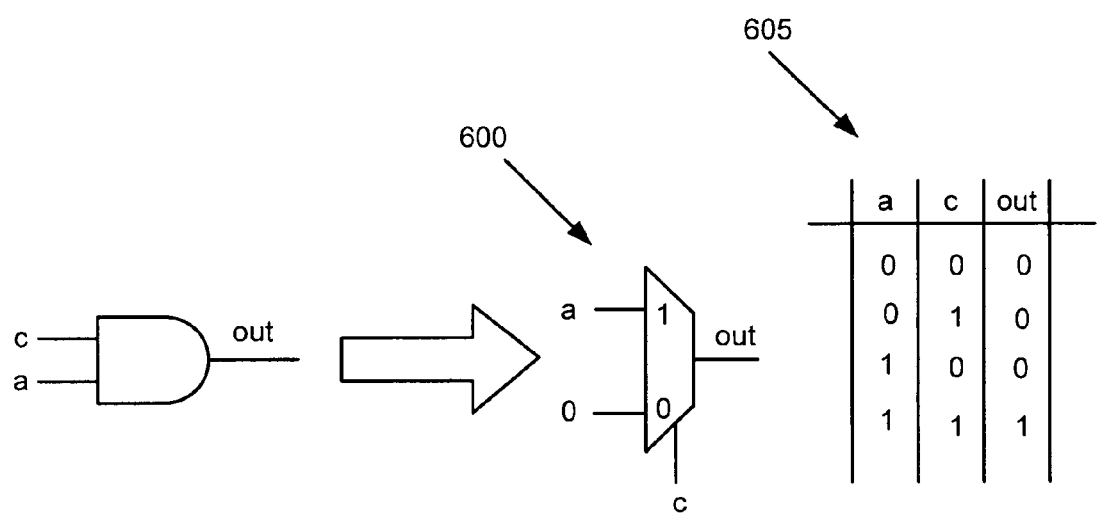
FIG. 6 illustrates how an AND operation can be performed using an HMUX.

One of the tiles in the 4-LUT tile group shown in FIG. 5B is used to implement an AND gate and a pass-through LUT similar to the AND gate 315 and the pass-through LUT 305. As illustrated in FIG. 5B, this tile has a LUT 510, one IMUX 575, and two HMUXs (515 and 565). The IMUX (575) and one of the HMUXs (for example, HMUX 565) are not needed to implement the AND operation. FIG. 5B illustrates one way of connecting these multiplexers to generate a logic 0 on their output. The AND gate is implemented by utilizing one of the HMUXs (for example, HMUX 515, as shown in FIG. 5B). FIG. 6 illustrates how an HMUX can be utilized to perform an AND operation. The HMUX 600 is configured by connecting the first input of the HMUX to 0, one of the AND operands (a) to the second input of the HMUX, and the other AND operand (c) to the HMUX control input. As shown by the logic table 605, the HMUX performs an AND operation on a and c.

Even though some of the figures and discussions in the rest of this specification refer to HMUXs as 2-to-1 multiplexers, as described above with reference to FIG. 34, some embodiments implement the HMUXs as 8-to-1 multiplexers. These HMUXs receive three select lines where two of the select lines always receive configuration data on sub-cycle basis, while the third select line may receive configuration data on some sub-cycles and user data in other sub-cycles. Given this, when an HMUX acts as a logic circuit, two of the select lines always receive configuration data which basically reduces the HMUX to a 2-to-1 multiplexer.

Using the configuration shown in FIG. 6, the AND operation of HMUX 515 in FIG. 5B is performed by connecting $A_0$ to the HMUX control line, the first input of the HMUX to 0, and the second input of the HMUX to $B_0$. When $A_0$ is 0, the output is set to the first input, i.e., to 0. When $A_0$ is 1, the output is set to the value of $B_0$. The HMUX is, therefore, operating as an AND gate. The LUT 510 acts as a pass through such that the output $R_0$ of the LUT is the same as the output of AND gate 515. The other three LUTs (1-3) of the tile are not used for the addition operation and can be used for other operations.

As illustrated in FIGS. 5A and 5B, some embodiments define one common carry chain 505 that is shared among the four logic circuits (0-3). Use of such shared carry logic speeds up carry propagation during a multi-bit add operation. Other techniques to speed the carry logic circuitry such as the use of bypass circuitry and dual carry chains are described in detail in the above mentioned U.S. patent application Ser. No. 11/082,193. As shown in FIG. 5A, each logic circuit in layout 530 receives three input signals $a_i$, $b_i$, $c_i$ through three input-select multiplexers. As described above, one of these multiplexers is an IMUX and the other two are HMUXs. During add or subtract operations, one of the inputs of each LUT (input $c_i$ which the LUT receives through its associated IMUX) is one of the outputs of the carry logic 505.

Based on the three input signals that it receives, each LUT i expresses the result of its addition or subtraction operation in terms of (1) a function $f_i(a_i, b_i, c_i)$ that is dependent on the three input signals, (2) a propagate signal $P_i$ that equals $(a_i \oplus b_i)$ when $a_i$ and $b_i$ are added and equals $(\overline{a \oplus b})$ when $b_i$ is subtracted from $a_i$, and (3) a generate signal $G_i$ that equals $(a_i \bullet b_i)$ when $a_i$ and $b_i$ are added and equals $(a_i \bullet \overline{b_i})$ when $b_i$ is subtracted from $a_i$. In the preceding, symbol • denotes logical AND and ⊕ denotes logical XOR operation.

During an add or subtract operation, each LUT i provides its propagate signal $P_i$ and generate signal $G_i$ to the carry logic 505. The carry logic 505 also receives a carry input $C_{IN}$ through an RMUX 550 associated with the 4-LUT tile group. Based on its input signals, the carry logic 505 generates four carry signals $C_0$, $C_1$, $C_2$, and $C_3$, which it supplies to the four LUTs 0-3 during an add operation. The first carry signal $C_0$ equals the carry input $C_{IN}$, which the carry logic 505 receives. In some embodiments, each other carry signal $C_i$ produced by the carry logic 505 is derived from the propagate, generate, and carry signals from the previous stage LUT. For instance, in some embodiments, the carry signal $C_i$ equals $P_{i-1}C_{i-1} + G_{i-1}$, for cases where i can equal 1, 2, 3, 4 and the last carry signal $C_{OUT}$ equals the carry signal $C_4$.

As illustrated in FIG. 5A, each LUT has three input select multiplexers (such as input select multiplexers 520, 525, and 528). One of these input select multiplexers is an IMUX and the other two are HMUXs. The input select that is an IMUX is utilized to connect the carry input to each LUT. For instance, IMUX 520 is utilized to connect carry input C1 to LUT 1. This multiplexer is configured as a pass through by connecting the carry input to its first input and setting the control input to 0. Therefore, this multiplexer always connects its first input to the output. The other input of the multiplexer is logical "don't care" and is designated with X.

The other two input select multiplexers of each LUT (such as input select multiplexers 525 and 528) are HMUXs that are utilized to produce the partial bit-wise AND products $A_jB_k$. Each of these HMUXs receives one bit of the multiplier and one bit of the multiplicand. As described above, the HMUX functions as an AND gate when the multiplier bit is connected to the HMUX select line, the first input of the HMUX is set to 0, and the second input of the HMUX is connected to the multiplicand bit. As shown above, the partial product, $B_{n-1}A_1$, is added to other partial products. Therefore, in FIG. 5, the third HMUX 535 of LUT 3 generates a 0 as one of the inputs to the LUT. As shown further below, several 4-bit adders can be connected together to implement larger multipliers. In these multipliers, the LUT that generates the most significant bit of the result receives a 0 as one of its inputs.

Figure 7:
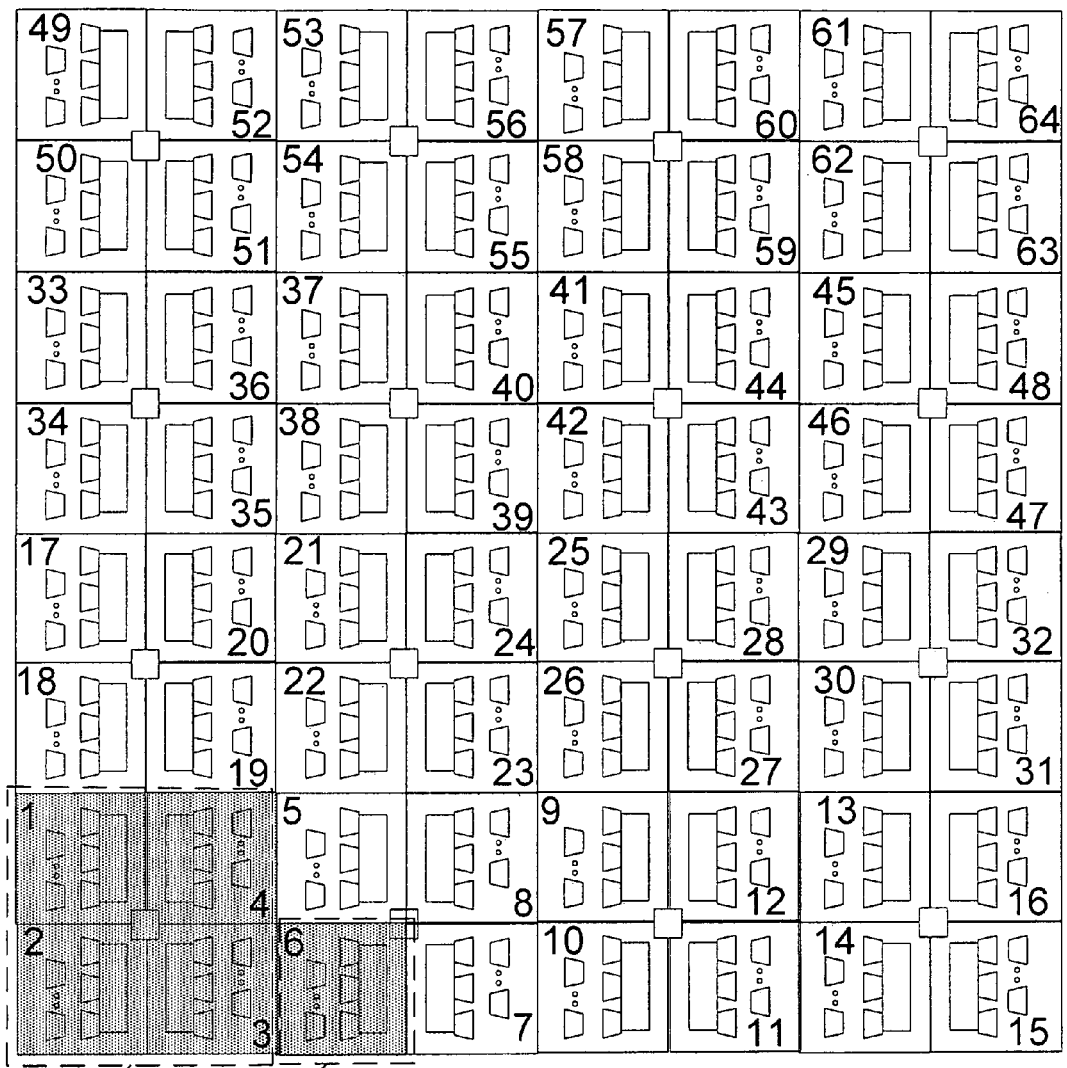
FIG. 7 illustrates a configurable IC doing 2-by-4 bit unsigned multiplication in some embodiments.

The sharing of the carry logic and the clustering of the logic circuits 0-3 allow the tiles in the aligned tile layout 530 to form a fast four-bit adder/subtractor. FIG. 7 illustrates a 4-LUT tile 705 implementing the functions of 530 and its associated HMUXs. FIG. 7 also shows a single tile 710 and its associated HMUXs implementing the functions of the pass-through LUT 510 and its associated HMUX 515. The 4-LUT tile 705 and the single tile 710 implement a 2-by-4 bit unsigned multiplier such as multiplier 400.

2. Use of n-Bit Adders to Multiply an 2-Bit Value by an n-Bit Value

As described above, a 2-by-4 bit multiplier can be implemented by using one 4-bit adder (such as the adder shown in FIG. 5A) and one additional LUT (such as LUT 510) and its associated HMUX (such as 515). The use of this additional LUT 510 is required to perform the AND operation to implement $B_0A_0$. As shown below, the impact of this additional LUT is, however, diminished when larger (2-by-n-bit) multipliers are implemented.

In order to implement larger 2-by-n bit multipliers, several 4-bit adders/subtractors can be ganged together to implement larger 2-by-n bit multipliers. These adders/subtractors can be ganged with other adders/subtractors that are on the same topological row to form fast byte-wise adders/subtractors or other larger adders/subtractors (eight bit adders/subtractors, sixteen bit adders/subtractors, thirty-two bit adders/subtractors, etc.). As described below, these adders/subtractors can, for example, be used to implement m-by-n bit multipliers or perform multi-bit operations (such as comparison) that require subtraction.

Figure 8:
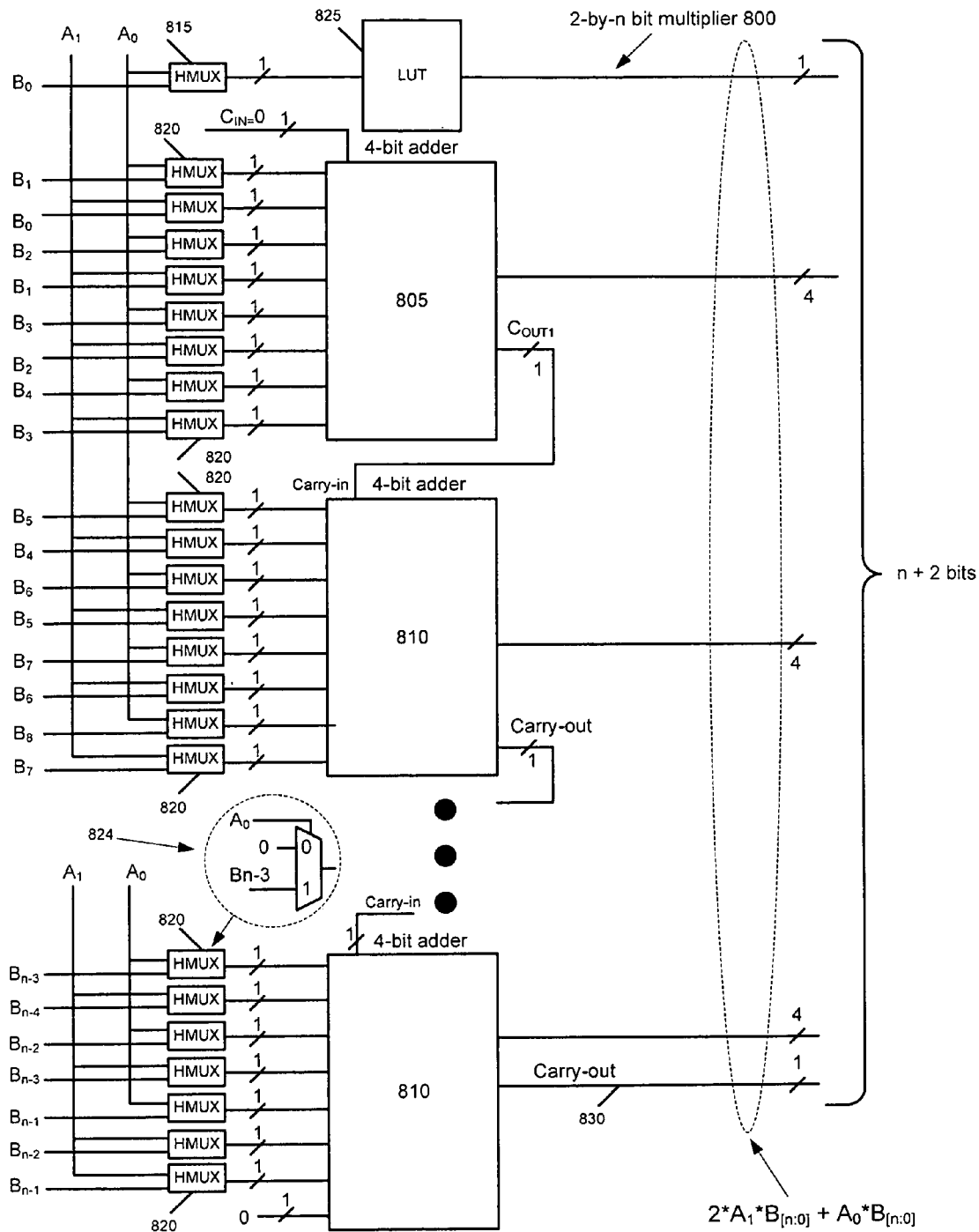
FIG. 8 shows an example of a 2-by-n bit unsigned multiplier using 4-bit adders.

FIG. 8 conceptually illustrates a 2-by-n bit multiplier of some embodiments. This multiplier is implemented by utilizing a 1-input LUT 825, one of LUT 825 HMUXs 815, several 4-bit adders 805-810, and the HMUXs 820 associated with the LUTs in the 4-bit adders 805-810. Each HMUX is configured to perform an AND operation as described above with reference to FIG. 6. To simplify the diagram, the HMUXs are shown with two inputs (a more detailed connection for one of the HMUXs is shown in circle 824). HMUX 824 shows a more detailed The 1-input LUT 825 is used as a pass-through. One of the associated HMUXs 815 of this LUT, is used as an AND gate to generate the least significant bit of the multiplication.

Figure 9:
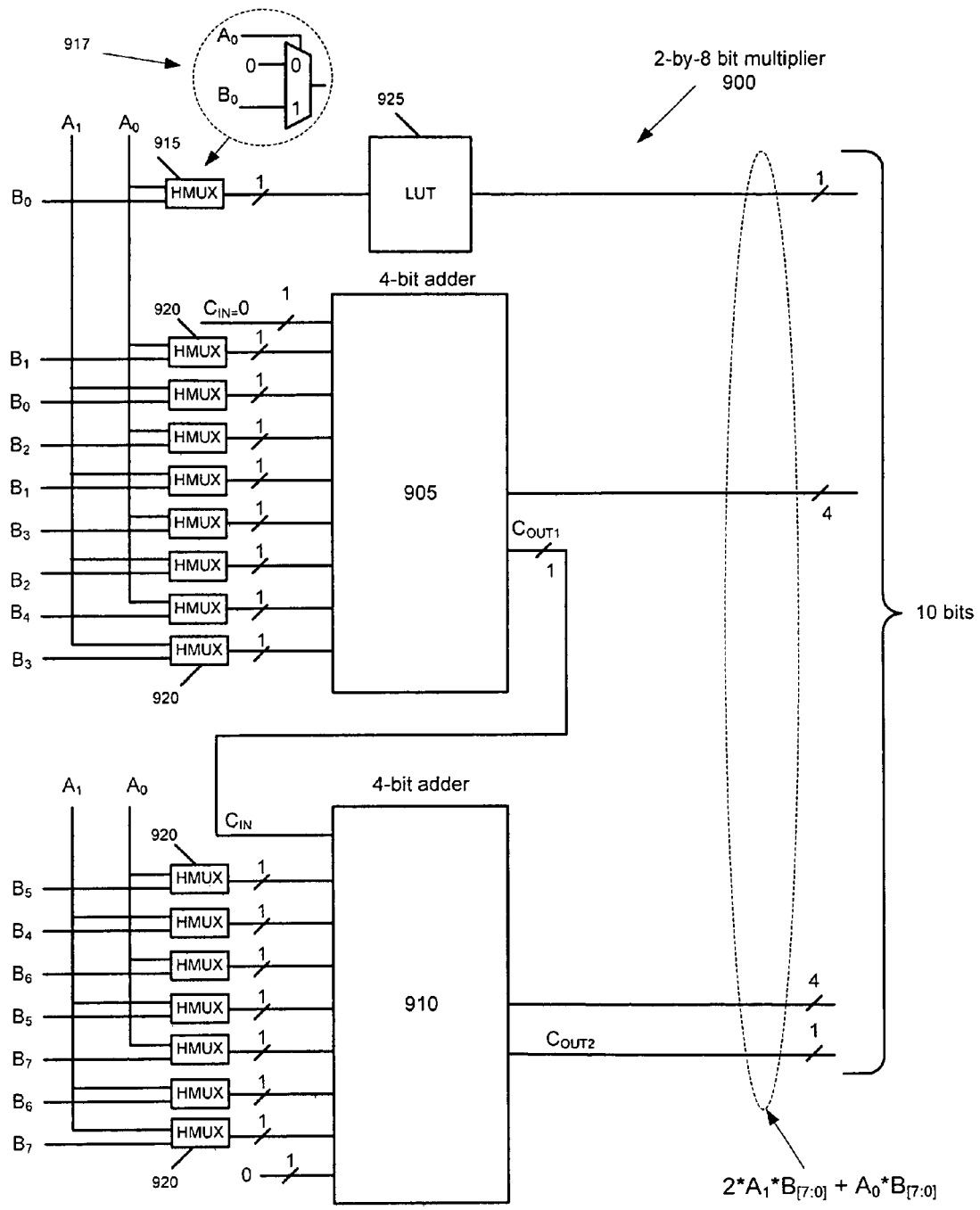
FIG. 9 shows an example of a 2-by-8 bit unsigned multiplier using two 4-bit adders.

As shown in FIG. 8, the next four bits of the multiplication is generated by a 4-bit adder 805 which receives a carry input $(C_{IN})$ of 0. The carry-out $(C_{OUT1})$ of this adder is connected to the carry-in of the next 4-bit adder 810. Similarly, all other 4-bit adders 810 are ganged together by connecting the carry out of the previous 4-bit adder to the carry-in of the next adder. The carry-out 830 from the last 4-bit adder is the most significant bit of the multiplication. Several examples of using the architecture of FIG. 8 to implement specific 2-by-n multipliers are given in the following paragraphs. FIG. 9 conceptually illustrates two 4-bit adders 905 and 910 connected together to form a 2-by-8 bit multiplier 900 in some embodiments. The two adders are connected together by connecting the carry-out of the first adder 905 to carry-in of the second adder 910. The result is a 10 bit binary number.

As shown in FIG. 9, a group of HMUXs associated with the four LUTs in each 4-bit adder are utilized to perform the bitwise AND operations. Each one of these HMUXs 920 are configured as was described above with reference to FIG. 6. To simplify the diagram, the HMUXs are shown with two inputs (a more detailed connection for one of the HMUXs is shown in circle 917). The least significant bit of the multiplication is generated by the HMUX 915 and the pass-through LUT 925. The next 4 bits are the "sum" outputs of the first adder 905. The next 4 bits are the "sum" outputs of the second adder 910 and the most significant bit is the carry-out of the second adder 910.

Figure 10:
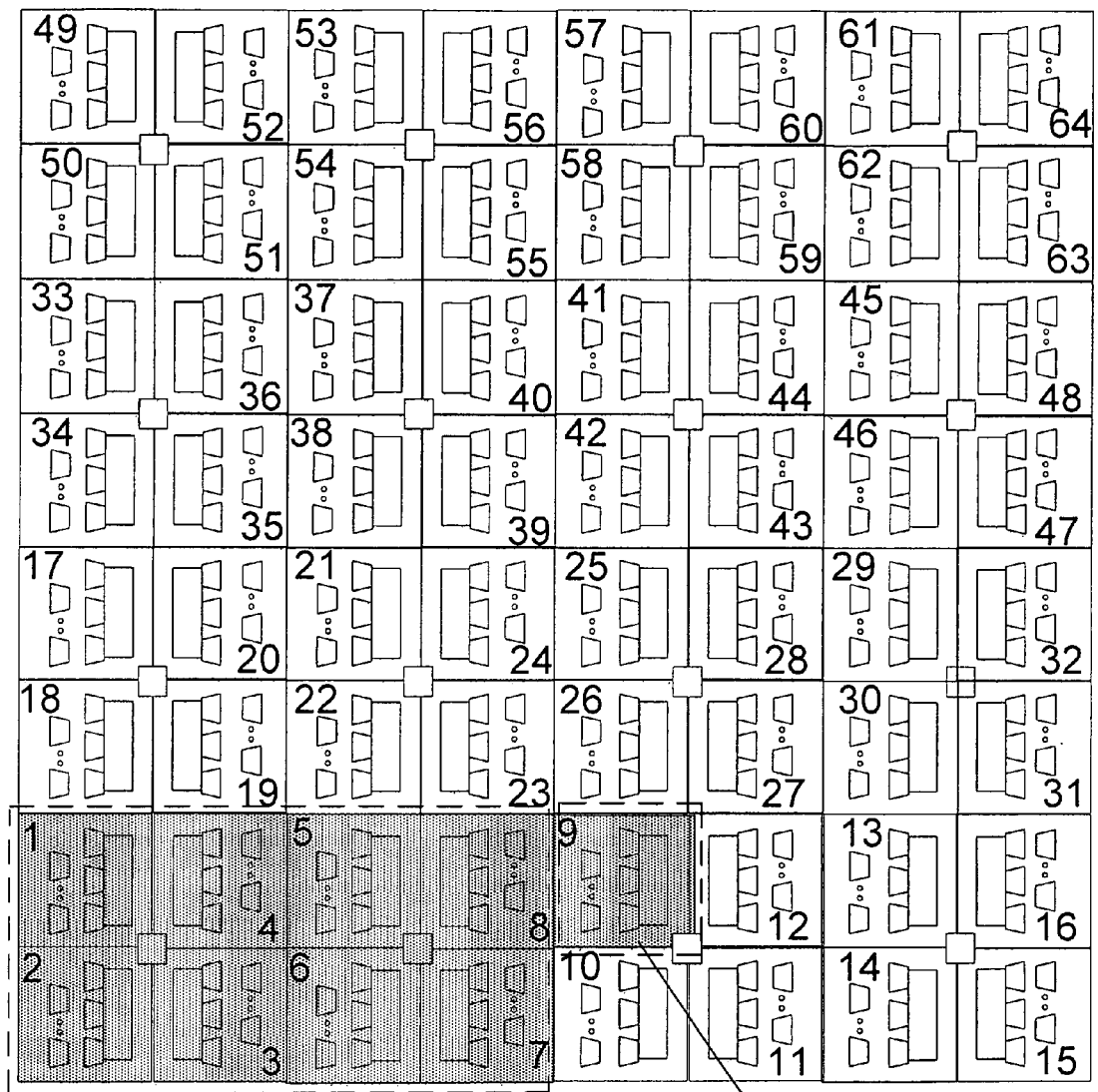
FIG. 10 illustrates a configurable IC doing 2-by-8 bit unsigned multiplication in some embodiments.

FIG. 10 illustrates a portion of a configurable IC implementing the 2-by-8 bit multiplier of FIG. 9. As shown in FIG. 10, two 4-LUT tiles 1005 and a 1-LUT tile 1010 are connected together to form the 2-by-8 bit multiplier similar to multiplier. The tile 1010 in FIG. 10 is used to generate the least significant bit of the multiplication. A one-input LUT and one of its associated HMUXs in this tile are used to implement the HMUX 915 and the pass-through LUT 925 of FIG. 9.

Figure 11:
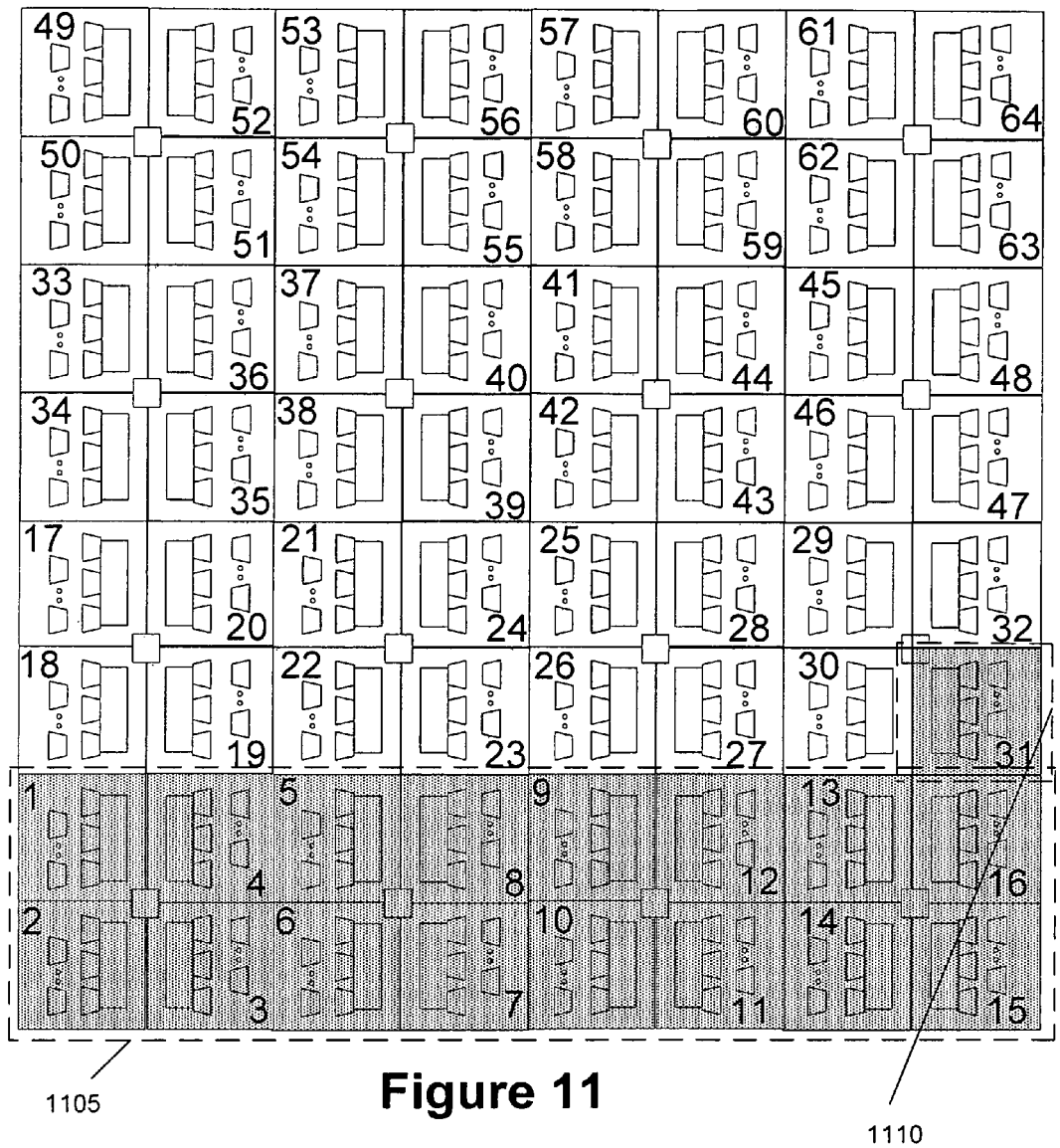
FIG. 11 illustrates a configurable IC doing 2-by-16 bit unsigned multiplication.

Similarly, FIG. 11 illustrates a 2-by-16 bit multiplier implemented by utilizing four 4-LUT tiles with shared logics 1105 and a 1-LUT tile 1110. The group of four 4-LUT tiles 1105 is preferably located in the same topological row 1105 of the configurable IC layout to speedup carry propagation between the 4-LUT tiles. Similar to FIG. 10, the tile 1110 in FIG. 11 is used to generate the least significant bit of the multiplication. As shown in FIGS. 7, 10, and 11, in addition to the 4-LUT tiles required to perform the multiplication, each one of these multipliers requires only one extra 1-input LUT to generate the least significant bit of the multiplication. Therefore, as the size and complexity of the 2-bit adders increase, the proportion of the circuits used to generate this bit to the total circuits used to implement the multiplier decreases.

Figure 12A:
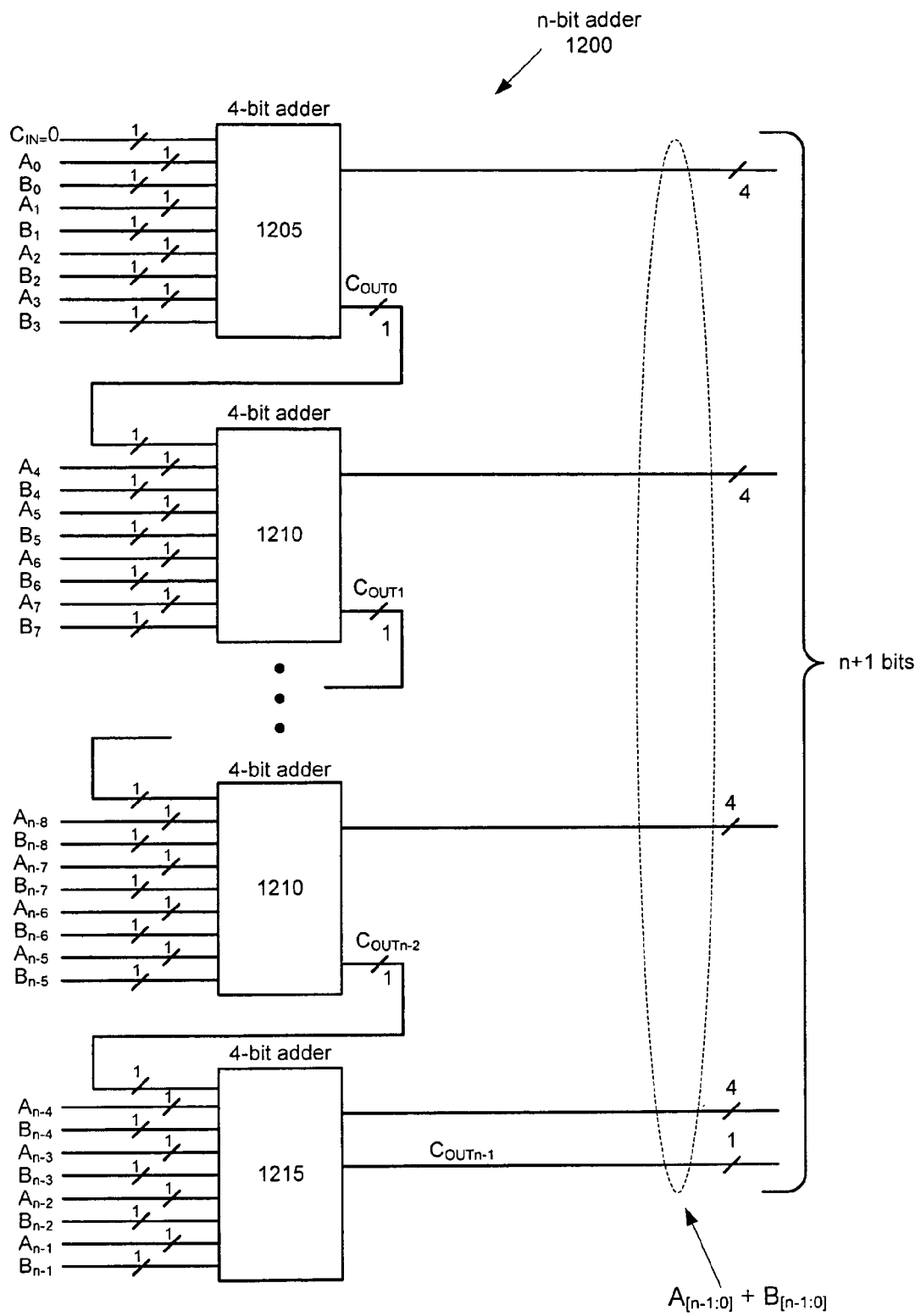
FIG. 12A shows an example of an n-bit adder implemented using several 4-bit adders.

An n-bit adder can be implemented by connecting several adders with smaller number of bits. FIG. 12A illustrates an n-bit adder 1200 implemented by connecting several 4-bit adders 1205-1215 in some embodiments. The carry-out of each 4-bit adder is connected to carry-in of the next 4-bit adder. The output has n+1 bits. Adder 1205 generates the four least significant bits of the results. Adder 1215 generates the five most significant bits of the results. Carry-out of adder 1215 is the most significant bit of the result.

An n-bit subtractor can be implemented in a similar way. As described above with reference to FIG. 5, the same circuits that perform a 4-bit add operation can also perform a 4-bit subtraction operation. These 4-bit subtractors can be connected together as shown in FIG. 12A to implement n-bit subtractors. Some embodiments require $C_{IN}$ (which is the borrow-in for the first 4-bit subtractor 1205) to be set to 1.

Figure 12B:
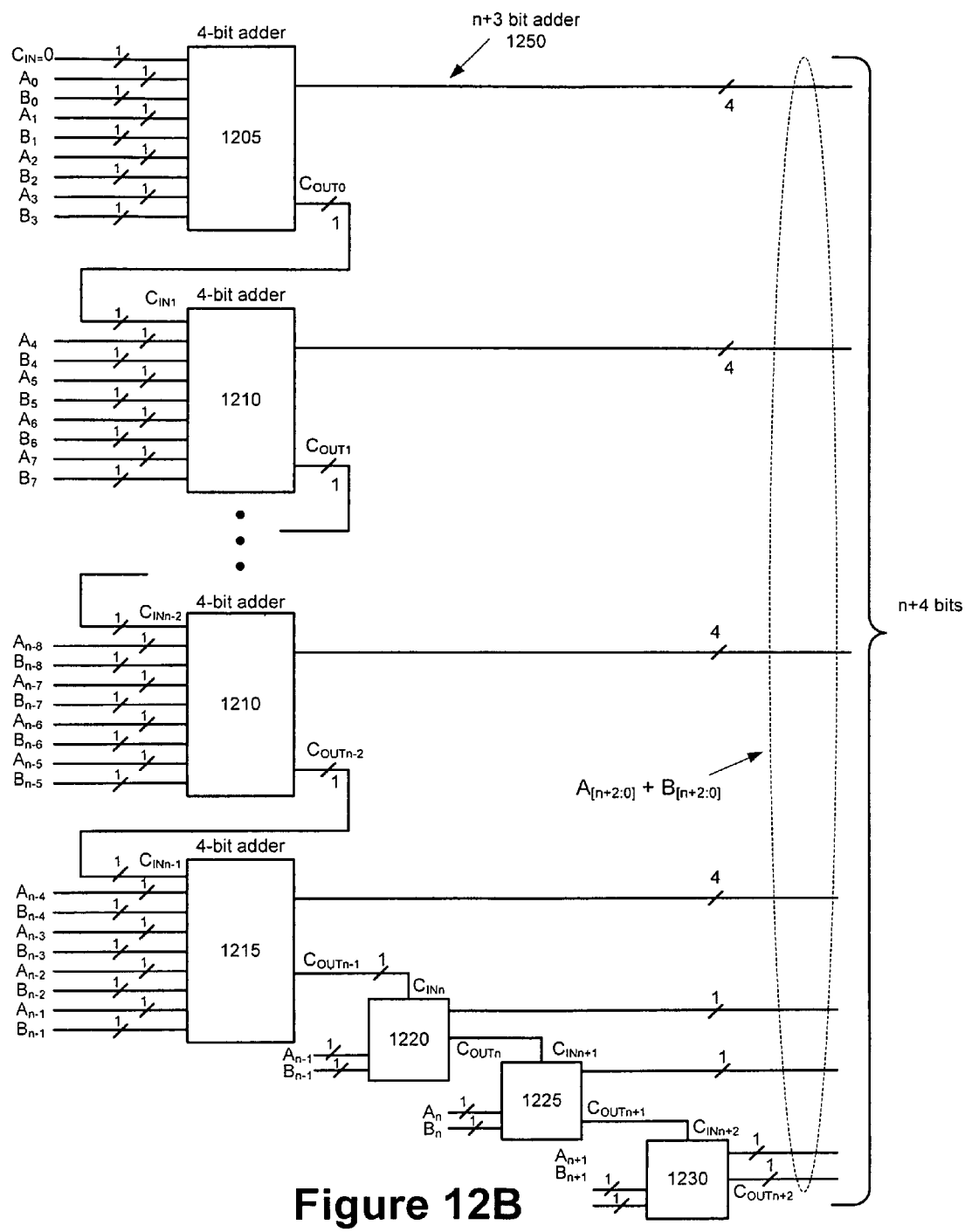
FIG. 12B shows an example of an n-bit adder implemented using several 4-bit adders and several 1-bit adders.

Although the examples given above were for multipliers that have a second operand with a multiple of four bits, with simple modifications, a 2-by-n bit multiplier with an arbitrary number for the second operand can be implemented. FIG. 12B illustrates three 1-bit adders 1220-1230 are added to the n-bit adder of FIG. 12A to implement an n+3 bit adder 1250. As shown, the carry out of the last 4-bit adder 1215 is connected to the carry-in of the first 1-bit adder. The carry-out of the first 1-bit adder 1220 is connected to carry-in of the second 1-bit adder 1225 and carry-out of the second 1-bit adder 1225 is connected to the carry-in of the third 1-bit adder 1230. The 1-bit output of each 1-bit adder 1220-1230 is used as a part of the multiplication result. The carry-out of the third 1-bit adder 1230 is the most significant bit of the multiplication.

Similarly by using only one 1-bit adder or only two 1-bit adders, an n+1 and n+2 bit adder can be implemented respectively. A multi-bit adder with an arbitrary number of bits (i.e., not a multiple of four) can be used to implement a 2-by-n bit multiplier where n is not a multiple of four. For instance, a 2-by-6 bit multiplier can be implemented by using one 4-bit adder and two 1-bit adders. Although FIG. 12B shows the 1-bit adders at the end of the adder chain, some embodiments implement the chain by arbitrarily mixing the 4-bit adders and 1-bit adders in the chain.

C. Use of More Complex Adders to Perform More Complex Multiplications

1. Multiplying Two 4-Bit Values

Some embodiments utilize the design illustrated in FIG. 12 to implement adders for adding values larger than four bits. These adders are used to implement more complex multipliers. For instance, a 6-bit-adder can be utilized to implement a 4-by-4 multiplier. As shown below, a 4-by-4 multiplier generates 16 partial results. If B is a 4-bit multiplicand and A is a 4-bit multiplier, the partial products generated are as follows:

|          |          |          | $B_3$    | $B_2$    | $B_1$    | $B_0$    |
|----------|----------|----------|----------|----------|----------|----------|
|          |          |          | $A_3$    | $A_2$    | $A_1$    | $A_0$    |
|          |          |          | $B_3A_0$ | $B_2A_0$ | $B_1A_0$ | $B_0A_0$ |
|          |          | $B_3A_1$ | $B_2A_1$ | $B_1A_1$ | $B_0A_1$ |          |
|          | $B_3A_2$ | $B_2A_2$ | $B_1A_2$ | $B_0A_2$ |          |          |
| $B_3A_3$ | $B_2A_3$ | $B_1A_3$ | $B_0A_3$ |          |          |          |

Figure 13:
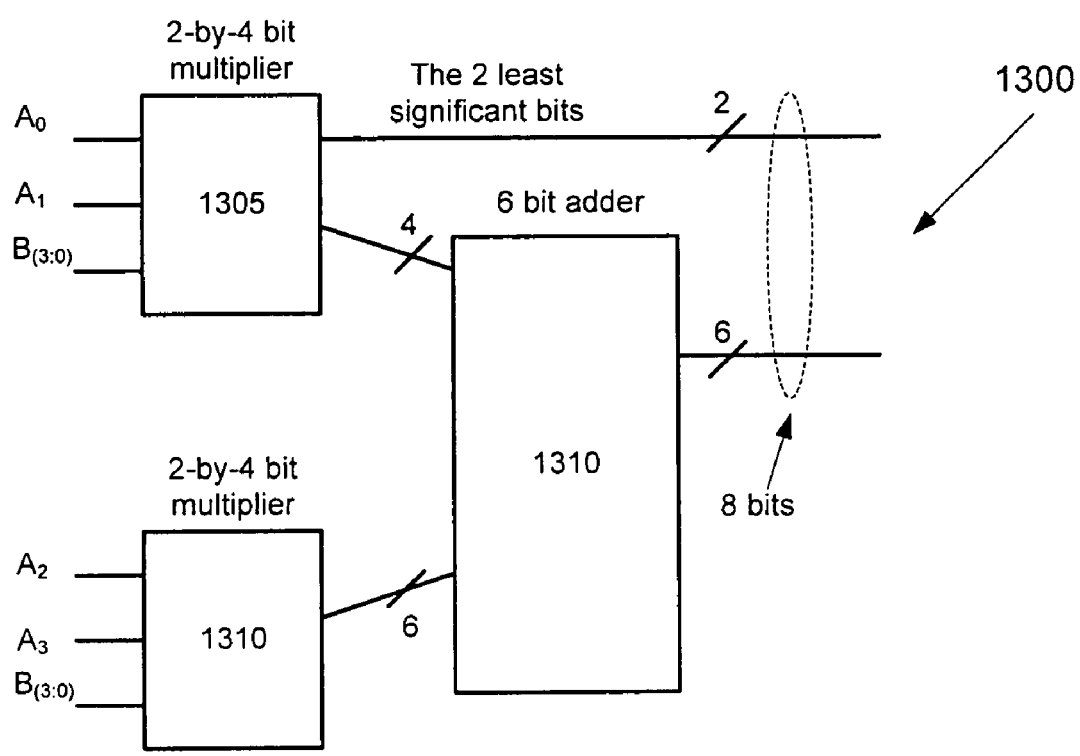
FIG. 13 shows an example of a 4-by-4 bit multiplier for multiplying two unsigned numbers.

FIG. 13 illustrates a 4-by-4 multiplier 1300 of some embodiments. This multiplier is comprised of two 2-by-4 bit multipliers 1305 and 1310 connected to a 6-bit adder 1310. The two multipliers are similar to multiplier 400 described in Section III above. The least significant 2 bits of the first multiplier 1305 is directly used as the least significant bits of the result. The other 4 bits of this multiplier are added to the 6 bits results of the second multiplier 910 which is equivalent of shifting the results of the second multiplier left by two bits before adding the two results. As shown in FIG. 13, the final multiplication result has 8 bits.

Figure 14:
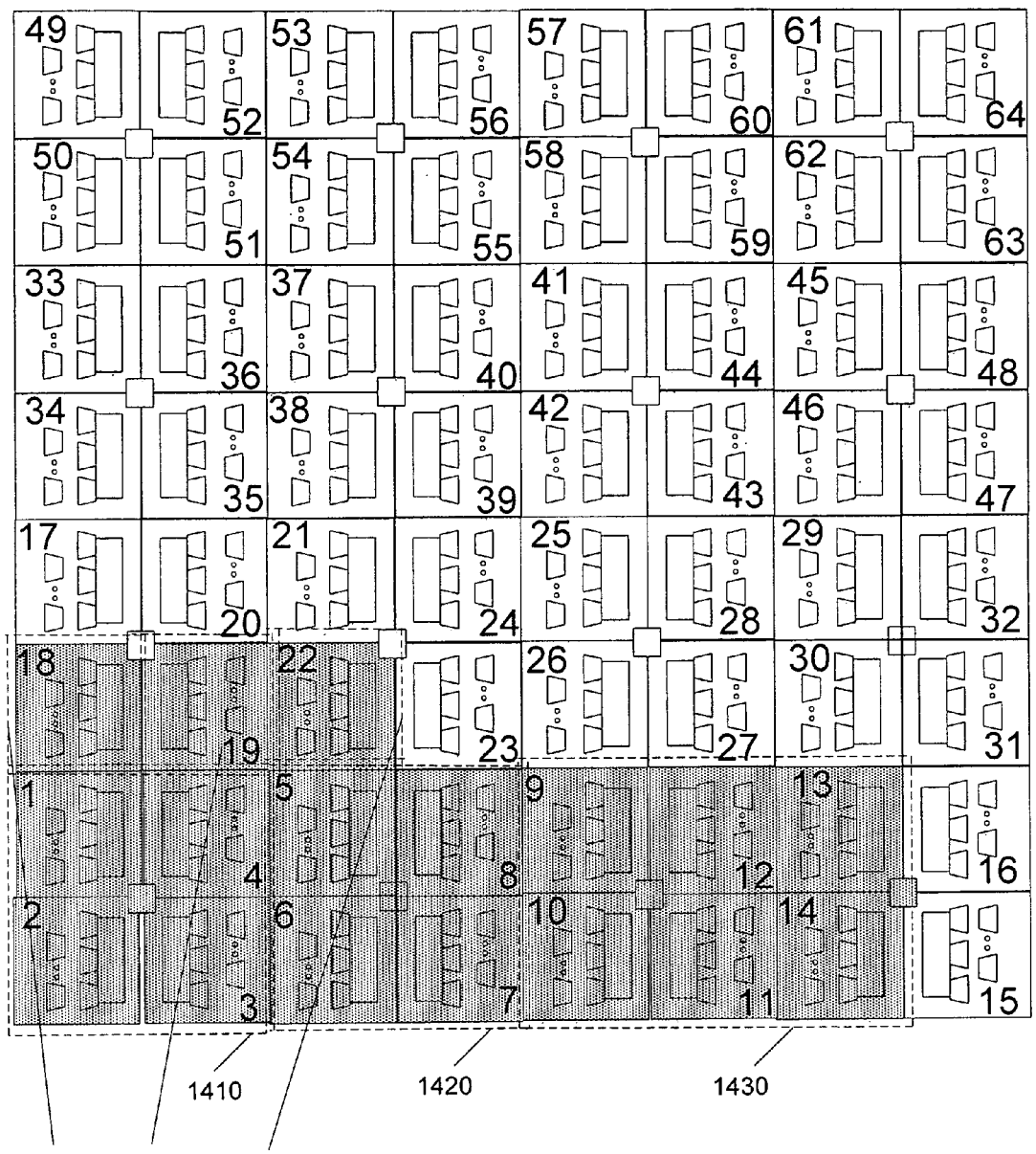
FIG. 14 illustrates a configurable IC doing 4-by-4 bit unsigned multiplication.

Some embodiments implement the 4-by-4 bit multiplier 1300 using a configurable IC. FIG. 14 illustrates one possible way of implementing this multiplier. The multiplier utilizes an individual tile 1405 and a 4-LUT tile 1410 to implement the first 2-by-4 bit multiplier in a similar fashion described above with reference to FIG. 7. Similarly, a second individual tile 1415 and a second 4-LUT tile 1420 are utilized to implement the second 2-by-4 bit multiplier. An individual tile 1425 and a group of 6 tiles 1430 are used to implement the 6-bit adder. Some embodiments implement a 6-bit by connecting a 4-bit adder such as adder 500 to two additional tiles to generate the extra two bits required for a 6-bit adder.

FIG. 14 is only one way of arranging tiles to implement a 4-by-4 bit multiplier. A person of ordinary skill in the art would realize that many other tile arrangements may be used. For instance, the three individual tiles 1405, 1415, and 1425 may be located anywhere in the IC layout without a major impact on overall performance.

The design of the 4-by-4 bit multiplier can be further generalized to implement m-by-n bit multipliers. In the next two subsections, two alternative ways of implementing such a multiplier are described.

Figure 15:
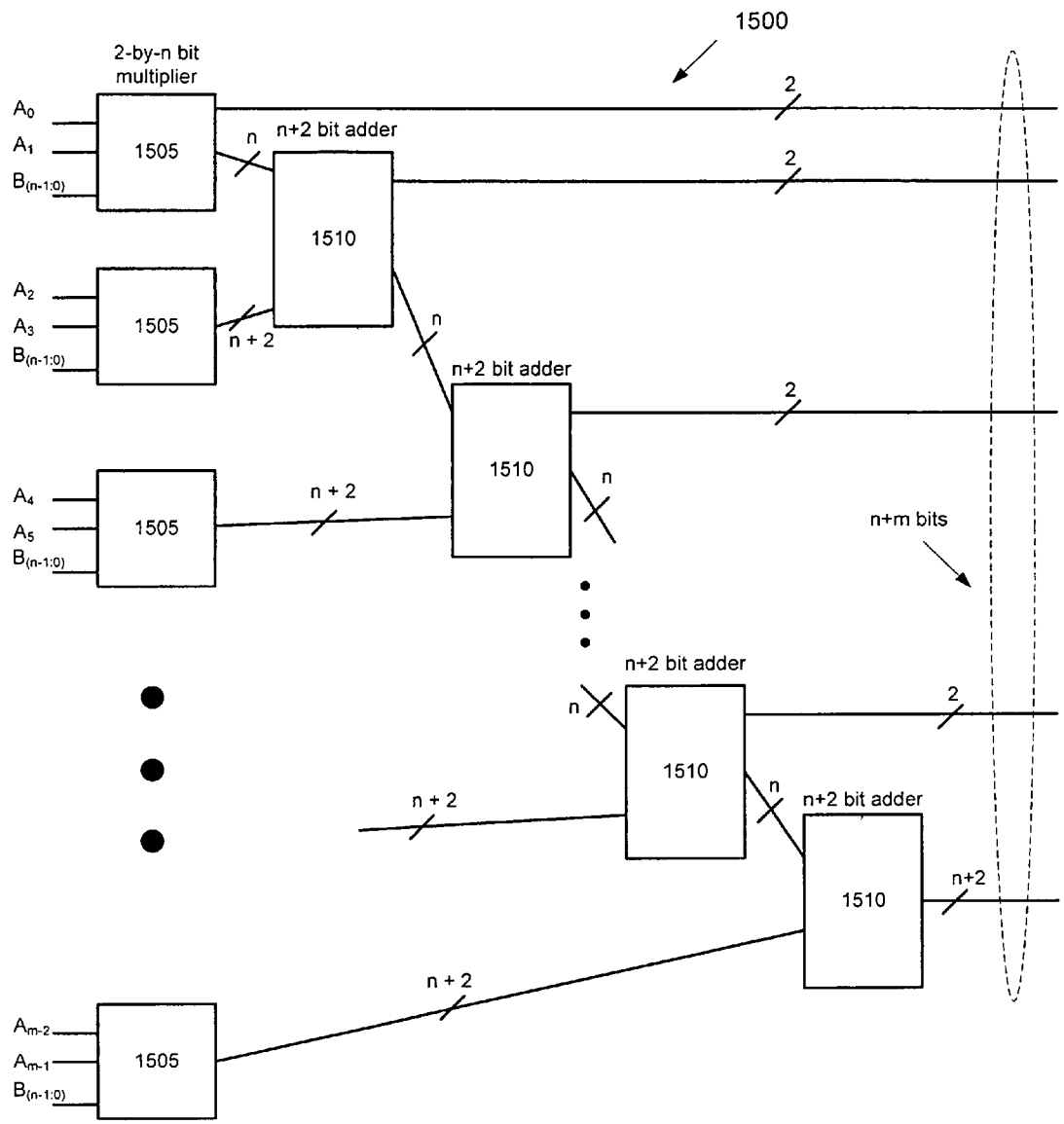
FIG. 15 shows an example of an m-by-n bit multiplier for multiplying two unsigned numbers.

2. Multiplying an m-Bit Value by an n-Bit Value a. Same Size Adders Connected Together in Series FIG. 15 conceptually illustrates how an m-by-n bit multiplier is implemented in some embodiments. As illustrated in FIG. 15, the m-by-n bit multiplier 1500 is comprised of several 2-by-n bit multipliers 1505 and several n+2 bit adders. Each 2-by-n bit multiplier 1505 is similar to the multiplier 800 discussed above. A partial result is generated by adding the output of each 2-by-n bit multiplier to the shifted output of the next multiplier in the chain. Since each multiplier 1505 performs a 2 bit multiplication, the output of the next multiplier must be shifted by 2 bits before being added.

As shown in FIG. 15, the shifting is done by directly outputting the 2 least significant bits of each multiplier 1505 and adding its n most significant bits to n+2 bits results of the next 2-by-n bit multiplier. The final n+m bit result is generated by utilizing an m−1 tree of n+2 bit adders 1510. This type of adder tree has the advantage of limiting the adder sizes to n+2 bits. The adder tree, however, requires m−1 adders. Another type of adder tree is a binary adder tree which will be described further below with reference to FIG. 17.

Figure 16:
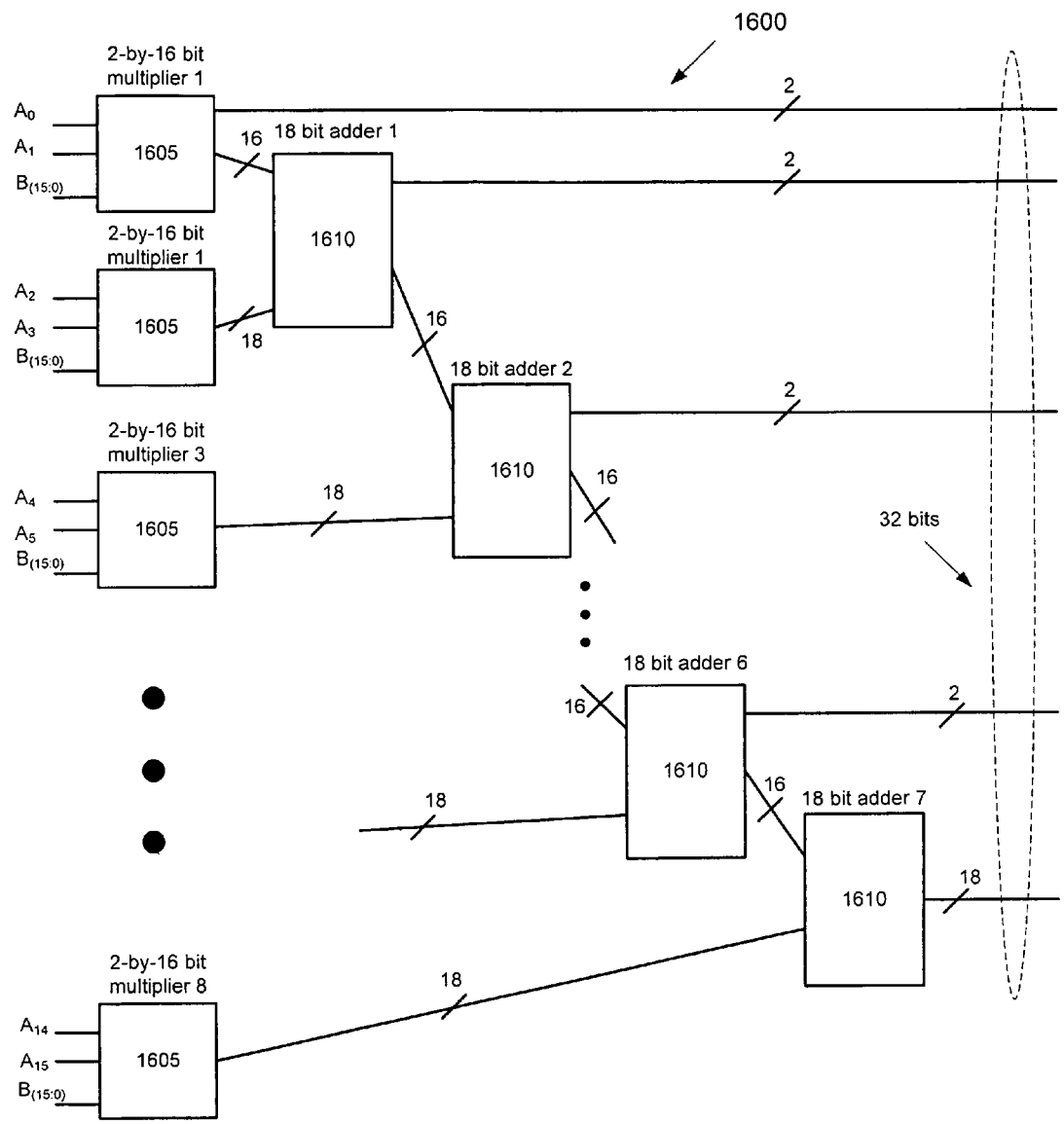
FIG. 16 shows an example of a 16-by-16 bit multiplier for multiplying two unsigned numbers.

An example of utilizing the 2-by-n bit multiplier design of FIG. 15 to perform multiplication is illustrated in FIG. 16. Specifically, FIG. 16 illustrates a 2-by-16 bit multiplier implemented by eight 2-by-16 bit multipliers and seven 18-bit adders. As shown, the adders are all the same size and are connected in series. The multiplication result has 32 bits.

b. Progressively Larger Adders Connected Together in the Form of a Binary Tree

Figure 17:
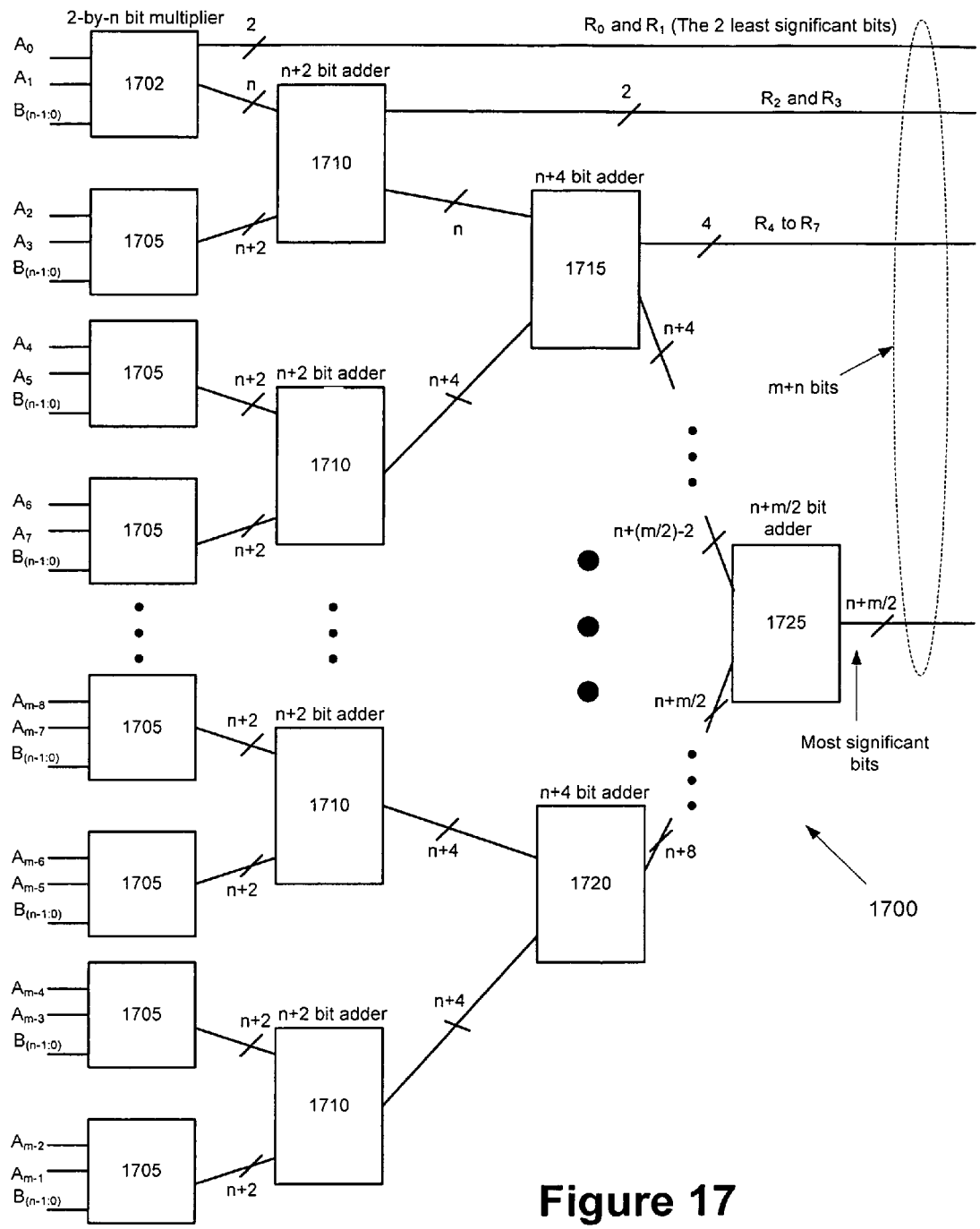
FIG. 17 illustrates an example of an m-by-n bit multiplier for multiplying two unsigned numbers.

In some embodiments, an m-by-n bit multiplier is implemented in which the results of each pair of 2-by-n bit multiplier are added to generate n/2 partial results. These partial results are further added in a similar pair wise fashion to generate the final output. FIG. 17 illustrates an m-by-n bit multiplier 1700 of some embodiments. As shown in this figure, a series of 2-by-n bit multipliers 1702-1705 are utilized to generate n+2 bit partial products. Some embodiments implement these multipliers 1702-1705 using the design described above with reference to FIG. 8. The two least significant bits of the results are directly generated by the first multiplier 1702. The 18 bit outputs of all other multipliers 1705 are added using a binary tree of adders. As shown in FIG. 8, the m-by-n bit multiplier 1700 utilizes an adder tree with adders that can progressively add larger numbers. The advantage of this multiplier (to multiplier 1500) is that, for larger multipliers, using a binary tree of adders would generally require fewer levels of logic.

Figure 18:
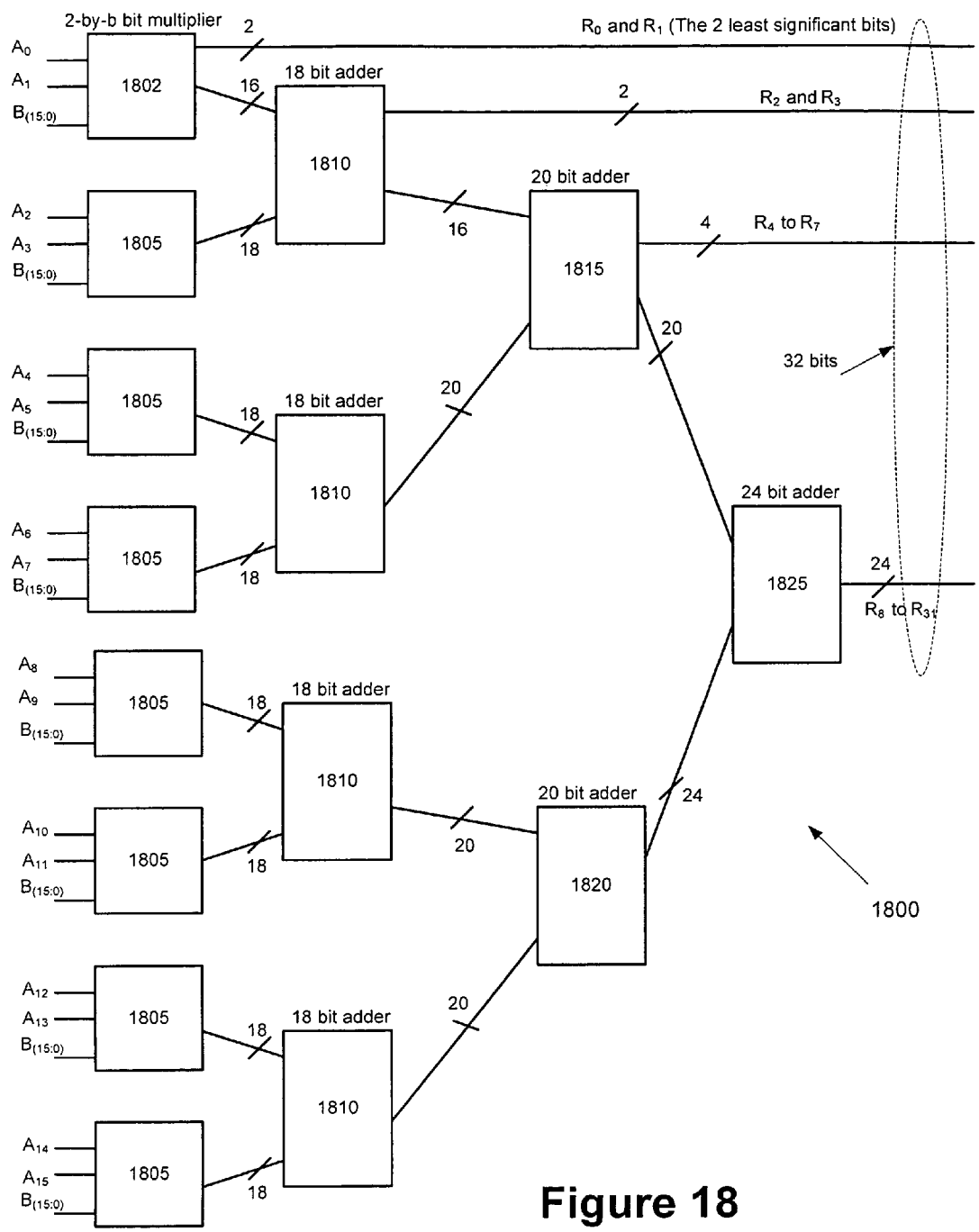
FIG. 18 illustrates an example of a 16-by-16 bit multiplier for multiplying two unsigned numbers.

FIG. 18 illustrates a 16-by-16 bit multiplier 1800 in some embodiments that is implemented using the design shown in FIG. 17. As shown in FIG. 18, a series of 2-by-16 bit multipliers 1802-1805 are utilized to generate 18-bits partial products. The two least significant bits of the results are directly generated by the first multiplier 1802. The 18 bit outputs of all other multipliers 1805 are added using a binary tree of adders.

The first stage of the adder tree has four 18-bit adders 1810. The second stage has two 20-bit adders 1815 and 1820 and the last stage has one 24-bit adder 1825. The 2 least significant bits of the first adder stage and the 4 least significant bit of the second adder stage are directly used as output and the rest of the bits are added as shown in FIG. 18. This method of directly outputting a particular number of the least significant bits of a partial result before adding the rest of the bits to all bits of the next partial result is equivalent of shifting the next partial result by the same particular number of bits. For instance, directly outputting the least significant 4 bits of the first 20-bit adder 1815 and adding its remaining 20 bits to all 24 output bits of adder 1820 is equivalent of shifting the results of the second 20-bit adder 1820 before adding it to the result of first adder 1815. Similar to FIG. 14, an appropriate number of tiles can be allocated to implement the multiplier 1800 of FIG. 16 using a configurable IC.

IV. Two's Complement Multipliers

All multipliers described so far accept unsigned numbers as multiplicand and multiplier. A novel technique is presented in this Section that enables all these multipliers to accept 2's complement numbers as multiplier and multiplicand. The technique will be described by using a 4-by-4 multiplier as an example. A person of ordinary skill in the art would, however, be able to apply the teachings presented here to other types of multipliers to convert them from multipliers for unsigned numbers to multipliers for 2's complement numbers having other sizes of multipliers and multiplicands.

As described in Section III above, the partial results for a 4-by-4 bit unsigned multiplication are as follows:

|   |   |   |   | $B_3$ | $B_2$ | $B_1$ | $B_0$ |
|---|---|---|---|---|---|---|---|
|   |   |   |   | $A_3$ | $A_2$ | $A_1$ | $A_0$ |
|   |   |   |   | $B_3A_0$ | $B_2A_0$ | $B_1A_0$ | $B_0A_0$ |
|   |   |   | $B_3A_1$ | $B_2A_1$ | $B_1A_1$ | $B_0A_1$ |   |
|   |   | $B_3A_2$ | $B_2A_2$ | $B_1A_2$ | $B_0A_2$ |   |   |
|   | $B_3A_3$ | $B_2A_3$ | $B_1A_3$ | $B_0A_3$ |   |   |   |

In order to perform a signed multiplication, it should be noted that when generating the partial results, the most significant bits of the multiplier and multiplicand each have a negative weight. For instance in the 4-by-4 bit multiplication example, the two bits $B_3$ and $A_3$ each have a weight of $-2^3$. The partial products for a 4-by-4 bit signed multiplication will, therefore, be as follows:

|   |   |   |   | $-B_3A_0$ | $B_2A_0$ | $B_1A_0$ | $B_0A_0$ |
|---|---|---|---|---|---|---|---|
|   |   |   | $-B_3A_1$ | $B_2A_1$ | $B_1A_1$ | $B_0A_1$ |   |
|   |   | $-B_3A_2$ | $B_2A_2$ | $B_1A_2$ | $B_0A_2$ |   |   |
|   | $B_3A_3$ | $-B_2A_3$ | $-B_1A_3$ | $-B_0A_3$ |   |   |   |

Instead of using an adder to add the last row of partial products, the sign of all partial products in that row can be negated and the row be subtracted from the previous row. The partial products would be as follows:

|   |   |   |   |   | $-B_3A_0$ | $B_2A_0$ | $B_1A_0$ | $B_0A_0$ |
|---|---|---|---|---|---|---|---|---|
|   |   |   |   | $-B_3A_1$ | $B_2A_1$ | $B_1A_1$ | $B_0A_1$ |   |
|   |   |   | $-B_3A_2$ | $B_2A_2$ | $B_1A_2$ | $B_0A_2$ |   |   |
| -( | $-B_3A_3$ | $B_2A_3$ | $B_1A_3$ | $B_0A_3$) |   |   |   |   |

Next, for each negative entry, the technique replaces $-B_mA_n$ as follows:

$-B_mA_n = B_m(1-A_n) - B_m = B_m\overline{A}_n - B_m$, where $\overline{A}_n$ is negation or logical NOT of $A_n$.

The technique further replaces $-B_m$ with $(-2B_m + B_m)$. Next, $-2B_m$ is replaced by placing $-B_m$ in the next higher column. Applying this technique to the partial products shown above, the partial products would be transformed to the following partial products:

|   |   |   |   |   | $B_3\overline{A}_0$ | $B_2A_0$ | $B_1A_0$ | $B_0A_0$ |
|---|---|---|---|---|---|---|---|---|
|   |   |   | $-B_3$ |   | $B_3$ |   |   |   |
|   |   |   |   | $B_3\overline{A}_1$ | $B_2A_1$ | $B_1A_1$ | $B_0A_1$ |   |
|   |   | $-B_3$ |   | $B_3$ |   |   |   |   |
|   |   |   | $B_3\overline{A}_2$ | $B_2A_2$ | $B_1A_2$ | $B_0A_2$ |   |   |
|   | $-B_3$ |   | $B_3$ |   |   |   |   |   |
| $-($ |   | $B_3\overline{A}_3$ | $B_2A_3$ | $B_1A_3$ | $B_0A_3)$ |   |   |   |
| $-(-B_3$ | $B_3$ |   |   |   | $)$ |   |   |   |

Positive and negative values of $B_3$ in each column cancel each other. After applying the negative sign to the last row, the partial results would be as follows:

|   |   |   |   | $B_3\overline{A}_0$ | $B_2A_0$ | $B_1A_0$ | $B_0A_0$ |
|---|---|---|---|---|---|---|---|
|   |   |   |   | $B_3$ |   |   |   |
|   |   |   | $B_3\overline{A}_1$ | $B_2A_1$ | $B_1A_1$ | $B_0A_1$ |   |
|   |   | $B_3\overline{A}_2$ | $B_2A_2$ | $B_1A_2$ | $B_0A_2$ |   |   |
| $-($ | $B_3\overline{A}_3$ | $B_2A_3$ | $B_1A_3$ | $B_0A_3)$ |   |   |   |
| $B_3$ | $-2B_3$ |   |   |   |   |   |   |

As described above, the $-2B_3$ in a column can be replaced by a $-B_3$ in the next higher column. Therefore, $B_3$ in the last column and $-2B_3$ in the preceding column cancel each other. The partial product would be as follows:

|   |   |   |   | $B_3\overline{A}_0$ | $B_2A_0$ | $B_1A_0$ | $B_0A_0$ |
|---|---|---|---|---|---|---|---|
|   |   |   | $B_3\overline{A}_1$ | $B_2A_1$ | $B_1A_1$ | $B_0A_1$ |   |
|   |   | $B_3\overline{A}_2$ | $B_2A_2$ | $B_1A_2$ | $B_0A_2$ |   |   |
| $-($ | $B_3\overline{A}_3$ | $B_2A_3$ | $B_1A_3$ | $B_0A_3)$ |   |   |   |
|   |   |   |   | $B_3$ |   |   |   |

The $B_3$ in the bottom row is easier to work with if it is replaced by $2B_3 - B_3$. By doing this, $2B_3$ is represented as a $B_3$ entry in the next higher column (which has few entries to add) and $-B_3$ term is worked into the borrow-in ($C_{in}$) of the subtractor for the bottom row. The partial products would be as follows:

|   |   |   | $B_3$ | $B_3\overline{A}_0$ | $B_2A_0$ | $B_1A_0$ | $B_0A_0$ |
|---|---|---|---|---|---|---|---|
|   |   |   | $B_3\overline{A}_1$ | $B_2A_1$ | $B_1A_1$ | $B_0A_1$ |   |
|   |   | $B_3\overline{A}_2$ | $B_2A_2$ | $B_1A_2$ | $B_0A_2$ |   |   |
| $-($ | $B_3\overline{A}_3$ | $B_2A_3$ | $B_1A_3$ | $B_0A_3)$ |   |   |   |
|   |   |   |   | $-B_3$ |   |   |   |

For the subtractor, $X-Y$ is implemented as $X+\overline{Y}+1$, where $+1$ is the borrow-in ($C_{in}$). In order to factor $-B_3$ into $C_{in}$, the value of $-B_3$ is added to the existing borrow of $+1$ which results in $C_{in} = +1 - B_3 = \overline{B}_3$. Also, since the subtrahend is positive, the subtraction requires a leading 0. Some embodiments omit this leading 0 by inverting the carry-out of the subtractor in the carry block.

The final partial products that need to be generated and added or subtracted from each other are as follows:

|   |   |   | $B_3$ | $B_3\overline{A}_0$ | $B_2A_0$ | $B_1A_0$ | $B_0A_0$ |
|---|---|---|---|---|---|---|---|
|   |   |   | $B_3\overline{A}_1$ | $B_2A_1$ | $B_1A_1$ | $B_0A_1$ |   |
| 0 | 0 | $B_3\overline{A}_2$ | $B_2A_2$ | $B_1A_2$ | $B_0A_2$ |   |   |
| $-(0$ | $B_3\overline{A}_3$ | $B_2A_3$ | $B_1A_3$ | $B_0A_3)$ |   |   |   |
|   |   |   |   | $C_{in} = \overline{B}_3$ |   |   |   |

Figure 19:
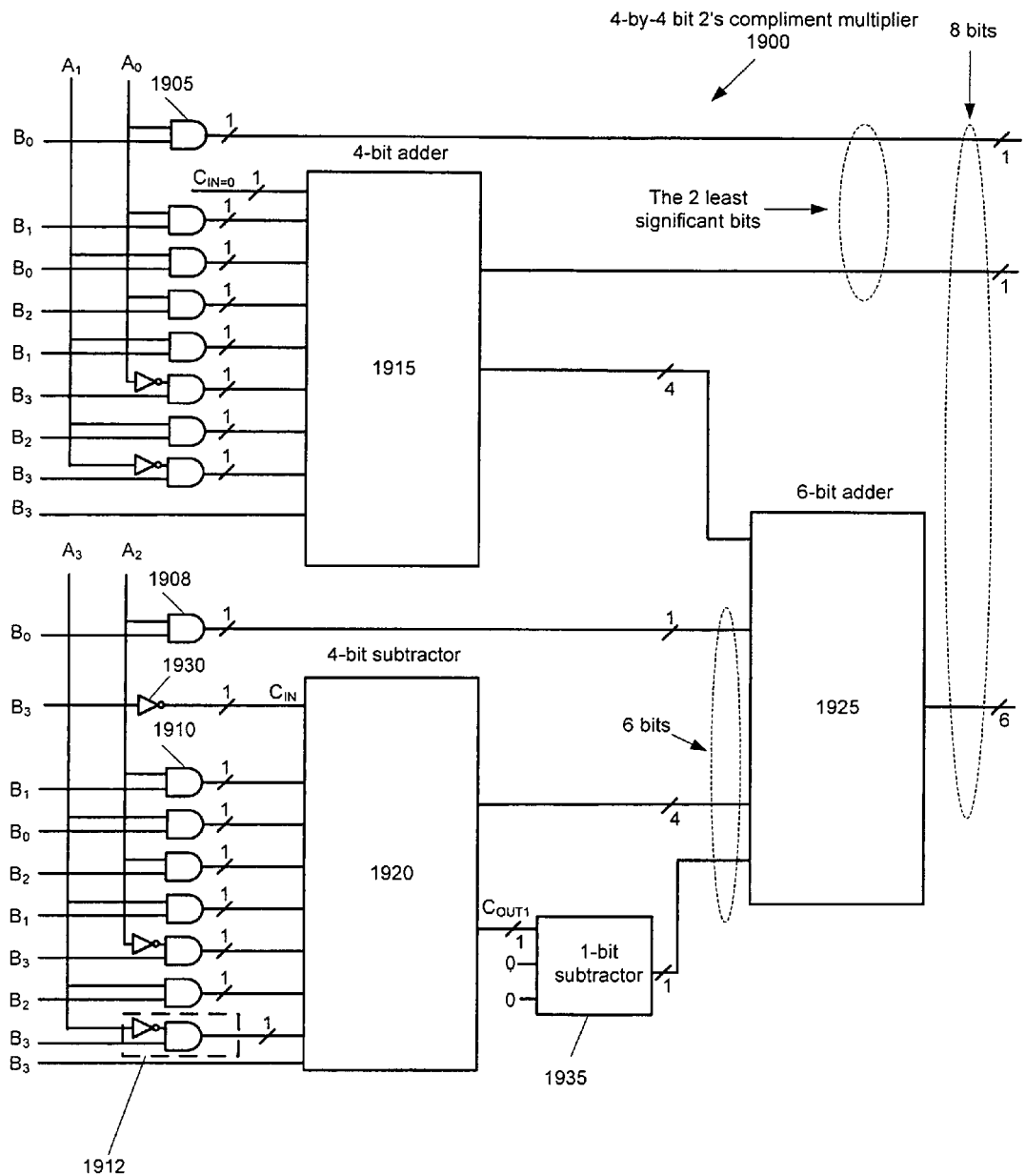
FIG. 19 is an example of a 4-by-4 bit 2's complement multiplier of some embodiments.

FIG. 19 conceptually illustrates implementation of the 4-by-4 signed multiplier of the above example in some embodiments. The partial products $B_jA_k$ and $B_j\overline{A}_k$ are implemented by utilizing AND gates (such as 1905-1910) and AND gates with one of their inputs negated (such as 1912). The 4-bit adder 1915 adds the top two row of the example above. The subtractor 1920 subtracts the fourth row from the third row. The $\overline{B}_3$ entry of the fifth row is implemented by the NOT gate 1930. The output of this NOT gate is used as the carry-in (borrow-in) of the 4-bit subtractor 1920. The output of the AND gate 1905 is used as the least significant bit of the results. Also, the least significant bit of the 4-bit adder 1915 is set out as the second least significant bit of the result. The remaining 4 bits of adder 1915 results are added to the 6-bit output of subtractor 1920. The 1-bit subtractor 1935 is used to invert the carry-out of the subtractor.

Figure 20:
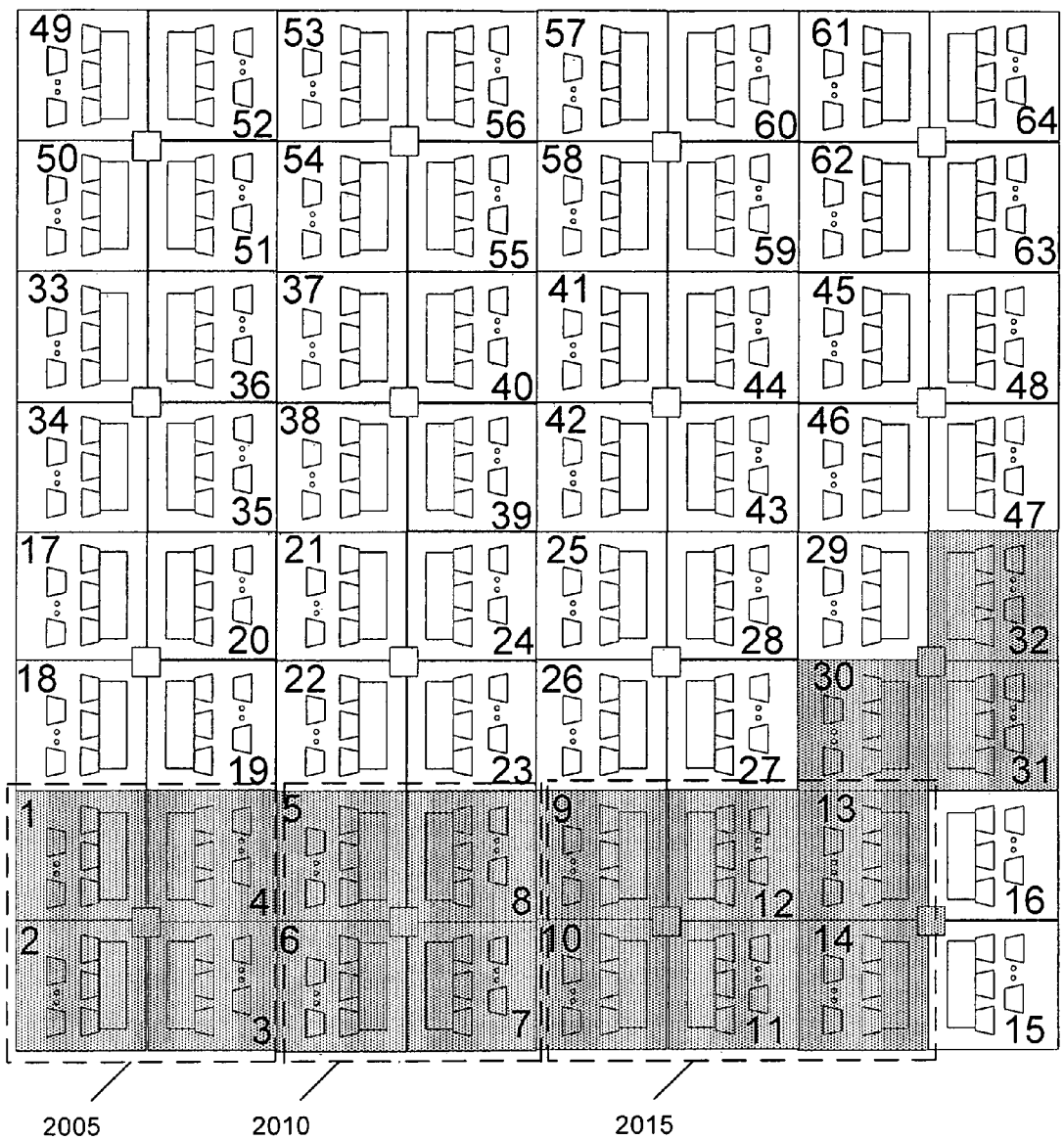
FIG. 20 illustrates a configurable IC doing 4-by-4 bit 2's compliment multiplication in some embodiments.

FIG. 20 illustrates an implementation of multiplier 1900 in some embodiments using a configurable IC. The 4-tile group 2005 implements the 4-bit adder 1915. The 4-tile group 2010 implements the 4-bit subtractor 1920. The 6-tile group 2015 implements the 6-bit adder 1925. Also, some individual tiles such as tiles 30, 31, and 32 are used to implement the 1-bit subtractor 1935, and the two AND gates 1905-1908 and their associated pass-through LUTs. The AND gates (such as 1905-1910), the NOT gate 1930, and the AND gates with one negated input (such as 1910) are implemented by HMUXs in some embodiments.

Figure 21:
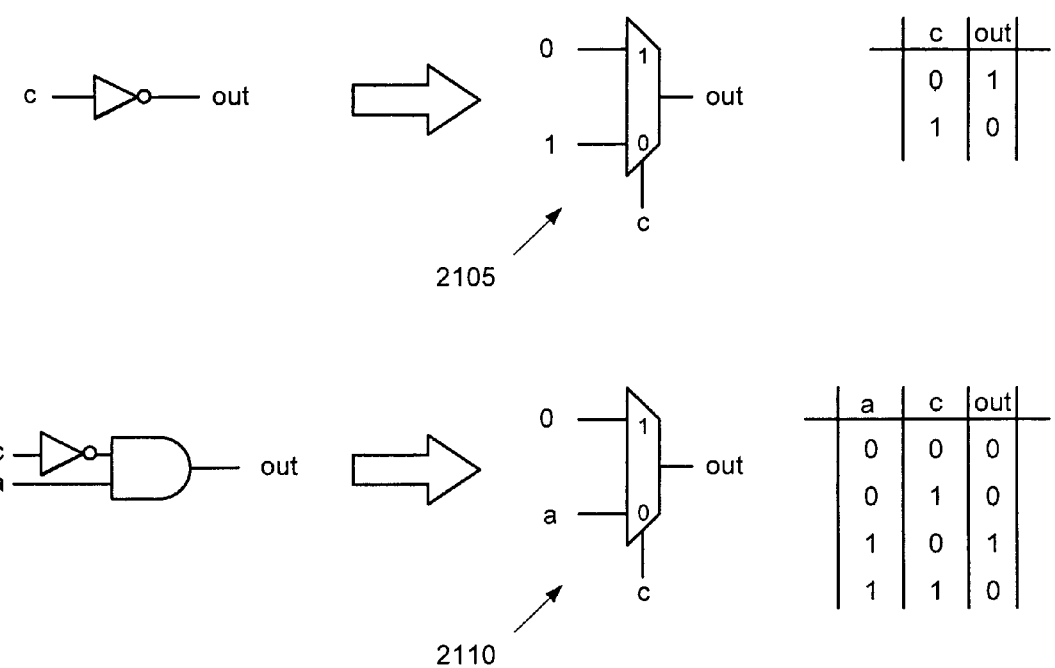
FIG. 21 illustrates how a NOT gate and an AND gate with one inverted input can be implemented using an HMUX.

An HMUX implementing an AND gate was described with reference to FIG. 6, above. FIG. 21 illustrates how a NOT gate (such as 1930) is implemented using an HMUX 2105. The first input of the HMUX 2105 is set to 1 and its second input is set to 0. The bit value to be negated is connected to the select line of the HMUX 2105. If the bit value is 0, the output would be 1. Similarly, if the bit value is 0, the output would be 1. HMUX 2105 would, therefore, function as a NOT gate.

FIG. 21 also illustrates how an HMUX 2110 is used to operate as and AND gate with one of its inputs negated. The value to be negated is connected to the select line of the HMUX 2110. The other input of the AND gate is connected to the first input of the HMUX 2110. The second input of the HMUX is set to 0. The HMUX 2110 would operate as an AND gate with one of its inputs negated.

V. Performing Mathematical and Logical Operations in Multiple Sub-Cycles

As described in Section II above, a configurable IC is an IC that has configurable circuits and a reconfigurable IC is an IC that can reconfigure during runtime. A reconfigurable IC is utilized in some embodiments to save space or to speedup the operation or both.

A. Implementing an Adder/Subtractor Using Reconfigurable ICs and Sub-Cycles

As described above with reference to FIG. 12, more complex adders can be implemented using 4-bit adders. Also, as described in Section III above, one 4-LUT group and one additional 1-input LUT can be used to implement either a 4-bit adder or a 4-bit subtractor. Therefore, the implementation 1200 shown in FIG. 12 can also operate as a subtractor. The LUTs can be configured to either perform an add or a subtraction operation. In the following discussion, an adder is used as an example. A person of ordinary skill in the art, however, would be able to apply the same discussion to implement a subtractor.

Figure 22:
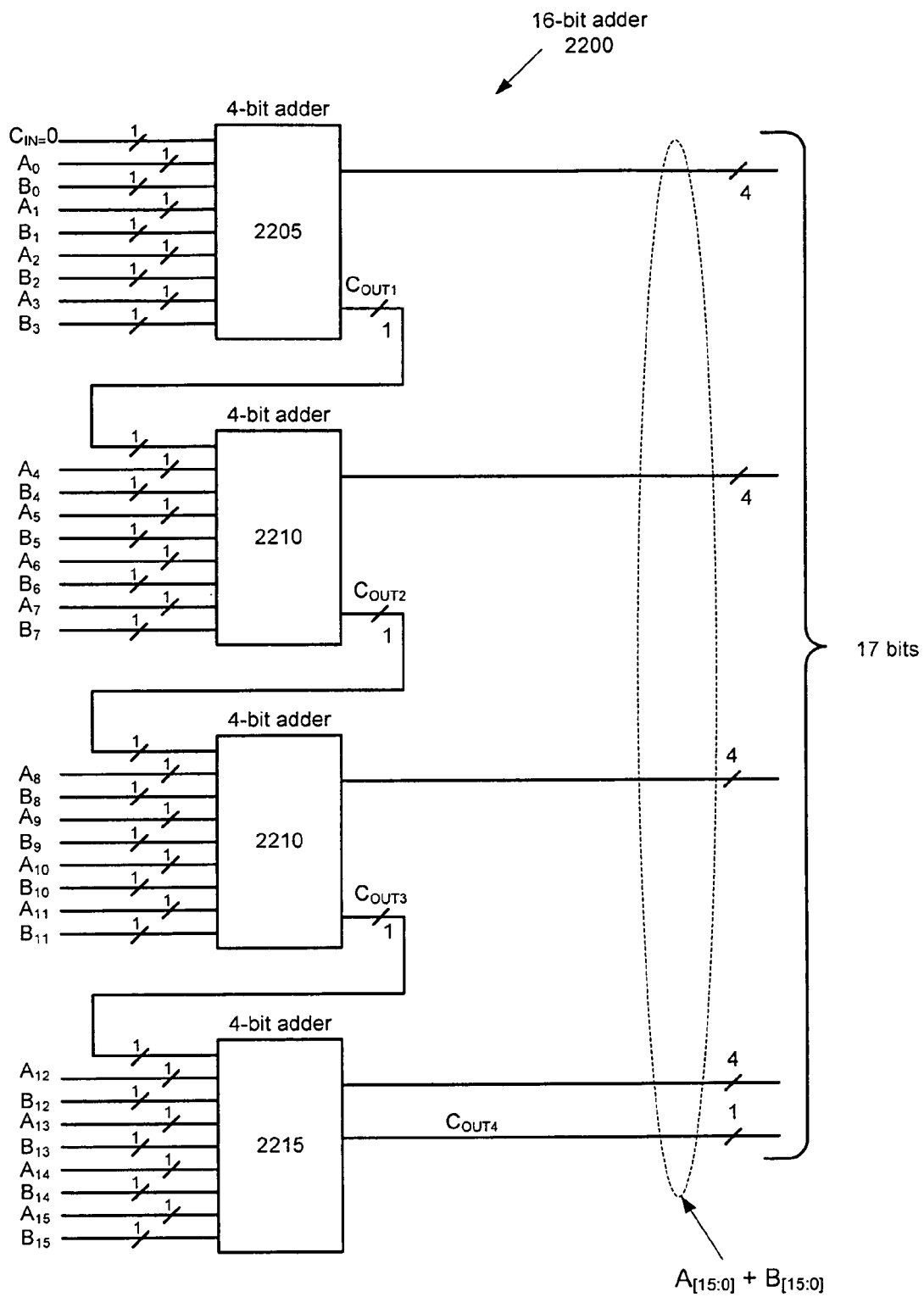
FIG. 22 illustrates implementing a 16-bit adder using four 4-bit adders.

FIG. 22 conceptually illustrates a 16-bit adder implemented by connecting four 4-bit adders in some embodiments. The carry-out of the first 4-bit adder 2205 is connected to carry-in of the next 4-bit adder 2210. The output has seventeen bits. Adder 2205 generates the four least significant bits of the results. Adder 2215 generates the five most significant bits of the results. Carry-out of adder 2215 is the most significant bit of the result.

Figure 23:
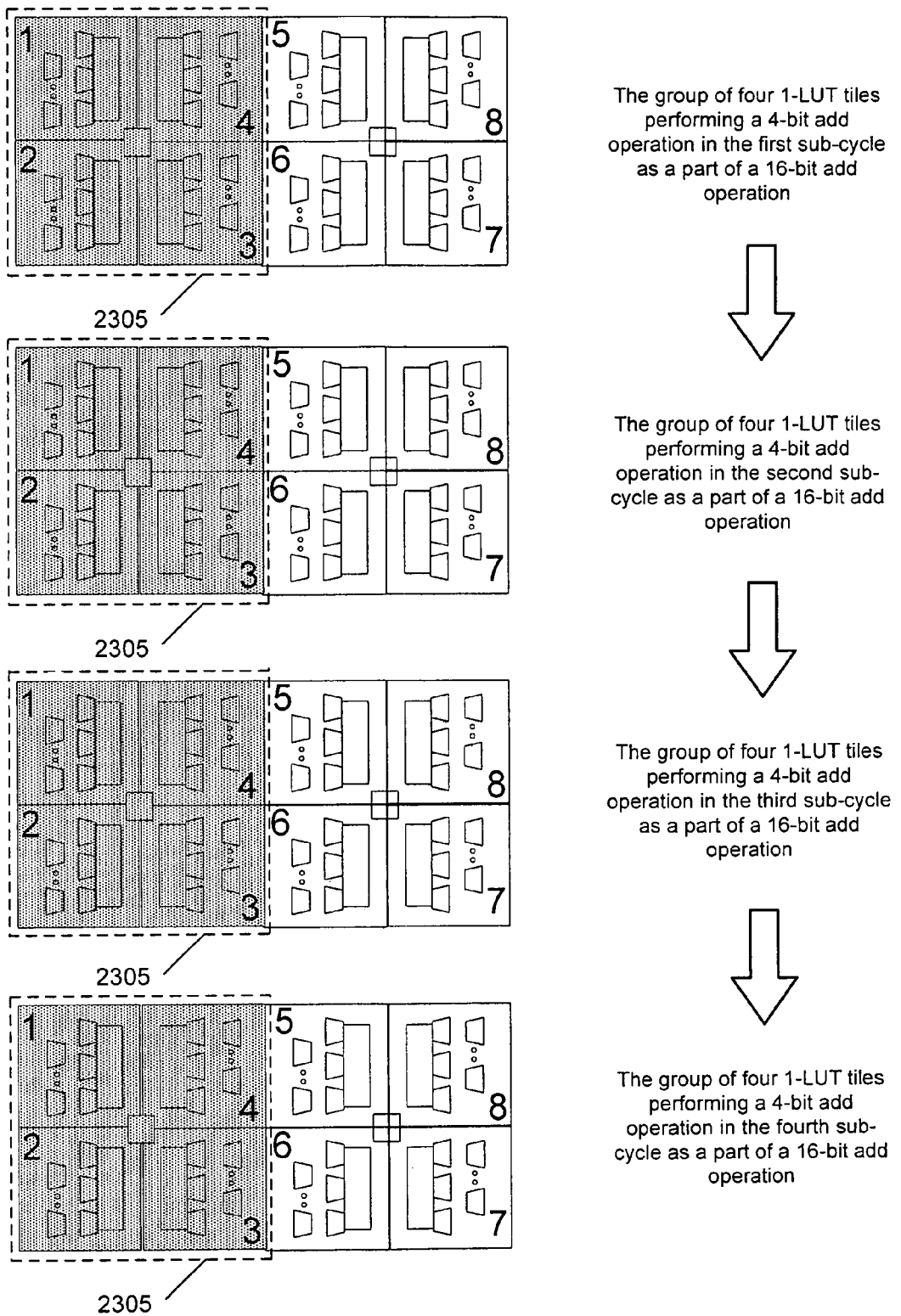
FIG. 23 illustrates a reconfigurable IC implementing a 16-bit adder in four sub-cycles in some embodiments.

FIG. 23 illustrates how a 16-bit adder is implemented in some embodiments utilizing a reconfigurable IC. The 16-bit addition is performed in four sub-cycles. In each sub-cycle, a 4-bit partial result is generated and stored. The 4-LUT tile is reconfigured and is utilized to generate the next partial result. The carry-out of each sub-cycle is used as carry-in of the next sub-cycle. The last sub-cycle generates four bit of addition result and one bit carry-out which is the most significant bit of the 16-bit addition result.

More specifically, after the first sub-cycle in FIG. 23, the least significant four bits of the final result are generated and latched for the duration of the operation. The carry out generated in the first sub-cycle is latched and is used as the carry in of the second sub-cycle. Subsequently, the second sub-cycle generates and latches the second four bits of final result for the duration of the operation. The carry out generated in this sub-cycle is latched and is used as the carry in of the third sub-cycle. Similarly, the third sub-cycle generates and latches the third four bits of the results for the duration of the operation. The carry out of the third sub-cycle is latched and is used as the carry in of the fourth sub-cycle. Finally, the fourth sub-cycle generates the next four bits of the result. The carry out of the fourth sub-cycle is the most significant bit of the result. The final 17 bits of the result consists of the carry out and the four bits of results generated during the last sub-cycle and the three 4-bit partial results generated and latched during sub-cycles one through three.

A person of ordinary skill in the art would realize that the same 16-bit addition may be performed in different number of sub-cycles and with different number of tiles. For instance, the same operation may be performed in two sub-cycle using two 4-LUT tiles. Other adders with different number of bits are also readily implemented in a similar fashion as shown in FIG. 22 and FIG. 23.

B. Implementing a Multiplier Using Reconfigurable ICs and Sub-Cycles 1. 2-by-n Multipliers As described in Section III above, in some embodiments, a multiplier such as 900 is implemented by utilizing a configurable IC as illustrated in FIGS. 11 and 10. The multiplier implemented in FIG. 10 requires 9 tiles. In some embodiments, if the individual tiles or the sets of 4 tiles can operate faster than the primary clock, it would be possible to reconfigure the same set of tiles to perform different operations during different sub-cycles.

Figure 24:
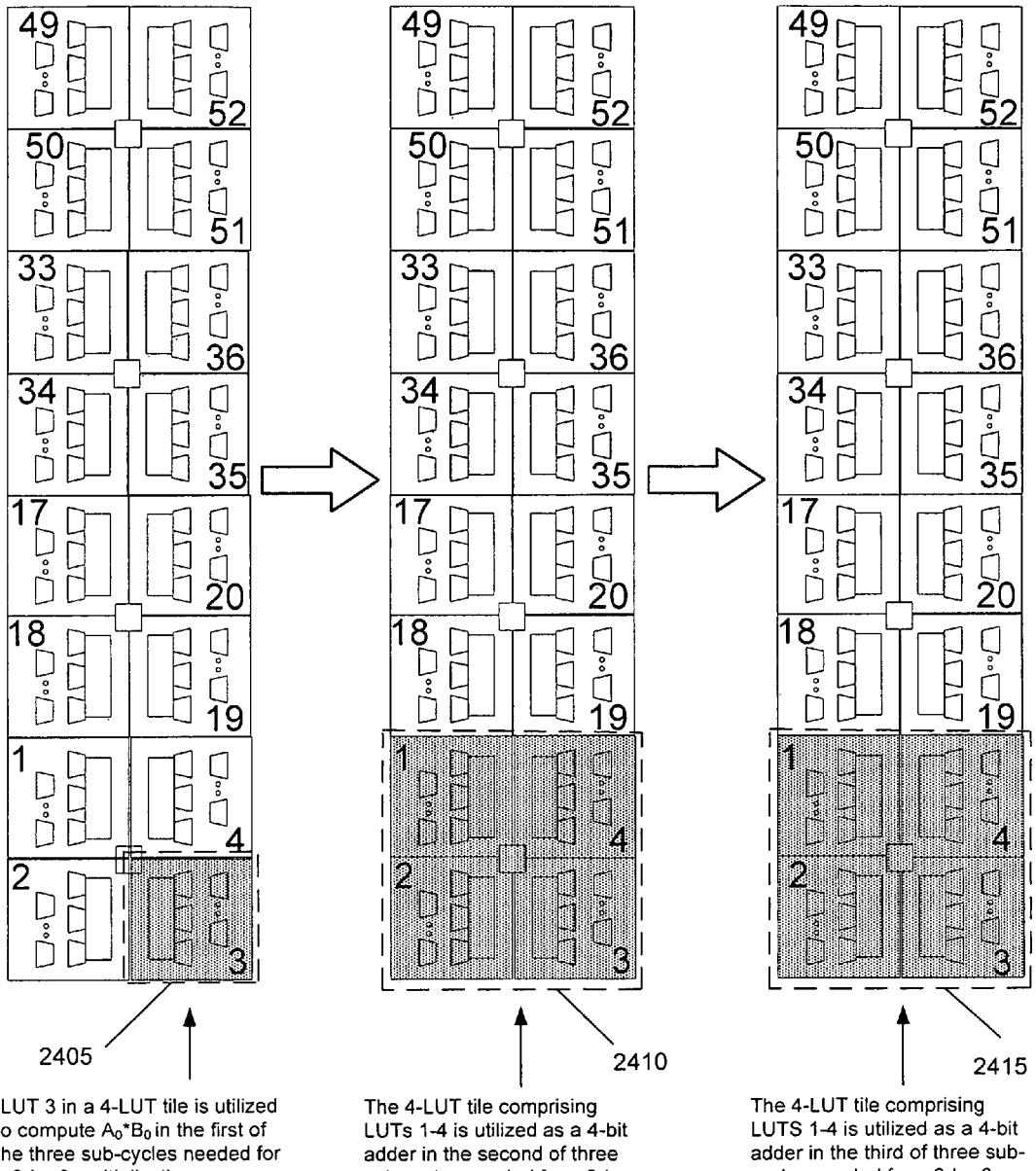
FIG. 24 illustrates a reconfigurable IC doing a 2-by-8 bit multiplication in several sub-cycles.

For instance, as illustrated in FIG. 24, if the primary clock runs at X MHz but each individual tile or each set of 4 tiles can operate at 4×MHz clock rate, only 4 tiles would be required to implement the 2-by-8 bit multiplier of FIG. 10. For simplicity, FIG. 24 only shows a portion of the same reconfigurable IC during different sub-cycles. Three sub-cycles are needed to perform the multiply operation. However, these three sub-cycles need not be consecutively done during the 4 sub-cycle period. In some embodiment, for example, sub-cycles 1, 2, and 3 out of four may be used. In some other embodiments, sub-cycles 1, 3, and 4 or 2, 3, and 4 may be used.

As illustrated in FIG. 24, in the first sub-cycle, tile 3 (2405) is used to compute $A_0B_0$. The four tile group 1-4 (2410) is then reconfigured and is used in the second sub-cycle to perform a 4-bit add operation. The same tile group is then reconfigured and is used in the third sub-cycle to perform the second add operation. At the end of each sub-cycle, the results are latched and are either used in the subsequent sub-cycles or are used for generating the final output. A person of ordinary skill in the art would realize that other ways of implementing the same multiplier is possible. For instance, if the tiles can only operate at twice the speed of the primary clock, the whole operation can be performed in 2 sub-cycles by using five tiles. In the first sub-cycle a group of 4-LUT tiles and one individual tile can be used to generate $A_0B_0$ and perform the first addition operation. In the next sub-cycle, the same 4-LUT tile may be used to perform the second addition operation.

Similarly, other 2-by-n bit multipliers may be implemented using a reconfigurable IC. For instance, if the tiles can operate in multiple clock rate of the primary clock rate, a 2-by-16 bit multiplier may be implemented by using a 4-LUT tile in 5 sub-cycles. The 5 sub-cycles may be part of a 6 sub-cycle or 8 sub-cycle, or n sub-cycle operation. The same multiplier may be implemented using a 4-LUT tile and one individual tile in 4 sub-cycles. In a similar fashion as described above, the individual tile and the 4-LUT tile will generate $A_0B_0$ and the result of one of the additions in a sub-cycle. The same 4-LUT tile will be used in 3 other sub-cycles to generate the result of the other three 4-bit additions required to perform the 2-by-16 multiplication. It will be obvious to a person of ordinary skill in the art that other combination of tiles or sub-cycles may be utilized to implement same or other 2-by-n multipliers.

2. m-by-n Multipliers

Some embodiments implement the m-by-n bit multipliers described in Section III above and the two's complement multiplier described in Section IV above, by utilizing a reconfigurable IC. In these embodiments, a set of logic circuits that perform a particular operation in one sub-cycle can be reconfigured to perform different operations in other sub-cycles. For example, the 16-by-16 bit multiplier 1800 described in Section III is implemented in some embodiments by utilizing a reconfigurable IC. Table 1 illustrates many ways of implementing a 16-bit by 16-bit unsigned multiplier depending on factors such as the primary (or user) clock frequency, number of available sub-cycles, required maximum latency, multiplicand and multiplier sizes, and the amount of serialization that can be performed.

Some embodiments that can divide the multiplication into a more serial fashion convert the stage 3 adder 1825 into an accumulator in which the outputs of the stage 2 adders 1815 are accumulated to perform the stage 3 addition function. Some embodiments perform further serialization by merging both stage 2 adders 1815-1820 and stage 3 adder 1825 into an accumulator stage. Yet, some other embodiments even merge stage 1 adders 1810, stage 2 adders 1820, and stage 3 adder 1825 into a single accumulator. Table 1 tabulates different mapping results for implementing the 16-by-16 bit adder 1800 in different embodiments. Similarly, a two's complement multiplier (such as multiplier 1900) can be implemented using different number of spacetime LUTs and different number of sub-cycles. In some embodiments, if the individual tiles or groups of tiles can operate faster than the primary clock, each one of multi-bit adders and subtractors in a two's complement multiplier (such as subtractor 1920 and adders 1915 & 1925) can be configured to operate on a sub-cycle basis.

TABLE 1

Multiplier Mapping Results

| Clock Rate (MHz) | Spacetime | Latency (Sub-cycles) | Throughput (Multiplications/Sub-cycle) | Spacetime LUTs | Implementation |
| --- | --- | --- | --- | --- | --- |
| 400 | 2 | 6 | 1/2 | 272 | Full parallel |
| 400 | 2 | 6 | 2/2 | 544 | Full parallel |
| 400 | 2 | 7 | 1/2 | 296 | STAGE3ADD converted to accumulator |
| 200 | 4 | 6 | 1/4 | 272 | Full parallel |
| 200 | 4 | 6 | 2/4 | 544 | Full parallel |
| 200 | 4 | 6 | 4/4 | 1088 | Full parallel |
| 200 | 4 | 7 | 1/4 | 296 | STAGE3ADD converted to accumulator |
| 200 | 4 | 7 | 2/4 | 592 | STAGE3ADD converted to accumulator |
| 200 | 4 | 7 | 1/4 | 288 | STAGE2ADD, STAGE3ADD converted to accumulator |
| 100 | 8 | 6 | 1/8 | 272 | Full parallel |
| 100 | 8 | 6 | 2/8 | 544 | Full parallel |
| 100 | 8 | 6 | 3/8 | 816 | Full parallel |
| 100 | 8 | 6 | 4/8 | 1088 | Full parallel |
| 100 | 8 | 6 | 5/8 | 1360 | Full parallel |
| 100 | 8 | 6 | 6/8 | 1632 | Full parallel |
| 100 | 8 | 6 | 7/8 | 1904 | Full parallel |
| 100 | 8 | 6 | 8/8 | 2176 | Full parallel |
| 100 | 8 | 7 | 1/8 | 296 | STAGE3ADD converted to accumulator |
| 100 | 8 | 7 | 2/8 | 592 | STAGE3ADD converted to accumulator |
| 100 | 8 | 7 | 4/8 | 1184 | STAGE3ADD converted to accumulator |
| 100 | 8 | 7 | 1/8 | 288 | STAGE2ADD, STAGE3ADD converted to accumulator |
| 100 | 8 | 7 | 2/8 | 576 | STAGE2ADD, STAGE3ADD converted to accumulator |
| 100 | 8 | 9 | 1/8 | 280 | STAGE1ADD, STAGE2ADD, and STAGE3ADD converted to accumulator |
| 100 | 8 | 16 | 1/16 | 256 | 16 1-bit partial products summed over 16 Sub-cycles |

C. Add-Compare-Select Function

The Add-Compare-Select (ACS) function is a key building block in the Viterbi decoding algorithm. Viterbi decoding is an important algorithm in engineering fields such as wireless digital communications systems. The overall speed of a Viterbi decoder is largely determined by the speed of the ACS unit. Multiple ACS units are required for fast parallel implementations.

Figure 25:
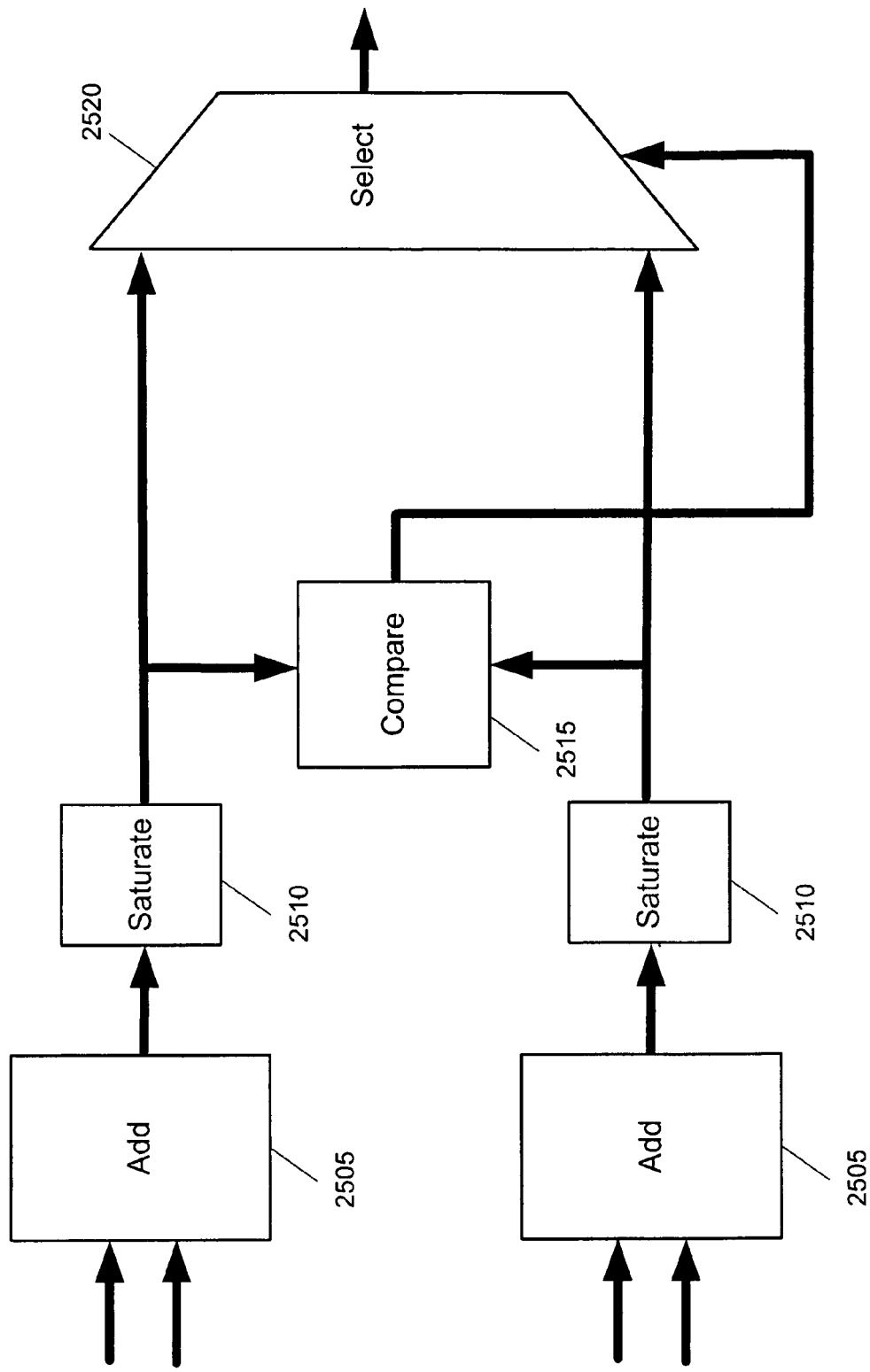
FIG. 25 illustrates an Add-Compare-Select (ACS) block diagram of some embodiments.
Figure 26:
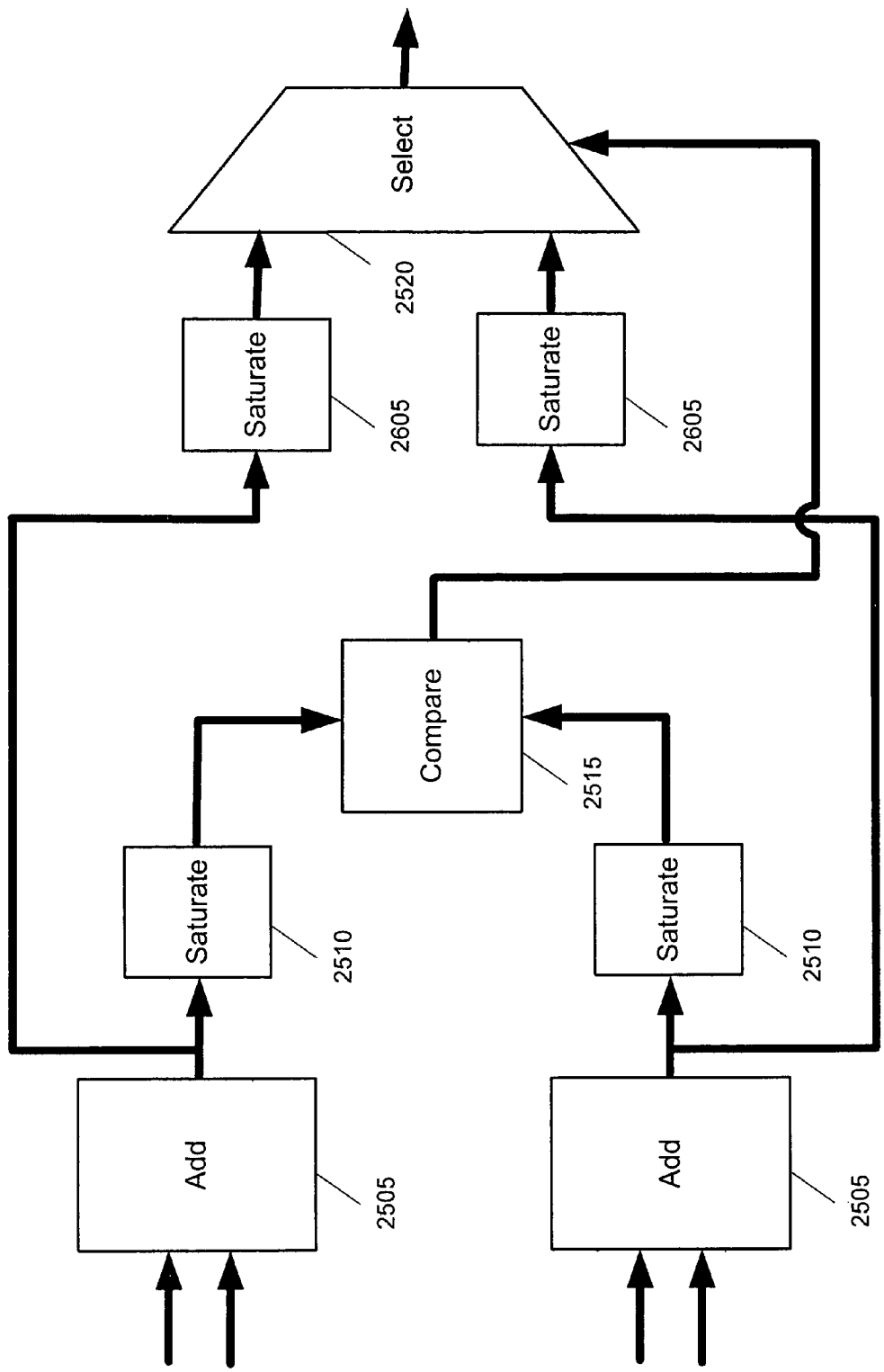
FIG. 26 illustrates Distribute Saturate function of some embodiments.

FIG. 25 illustrates a block diagram of an ACS unit in some embodiments. As illustrated in this figure, an ACS unit is comprised of two adders 2505, two saturate units 2510, one compare unit 2515, and one select unit 2520. Each adder 2505 receives two positive inputs. The two inputs are added and the results are sent to corresponding saturate units that ensure the values are capped at a maximum level rather than wrapping around. The two outputs of the saturate units 2510 are compared by the compare unit 2515. The output of the compare unit is connected to the select line of the select unit 2520 in such a way that the smaller of the two values compared is sent to the output of the select unit. As illustrated in FIG. 26, some embodiments use a different set of saturate units 2605 to saturate the output of the adders 2505 and connecting the results to the input of the select unit 2525. As will be described further below, the compare and select functions are implemented by LUTs and saturate function is performed by the HMUXs. Since each LUT is associated with several HMUXs, replicating the saturate function does not add any space overhead and would speed up the execution of the ACS unit.

Figure 27:
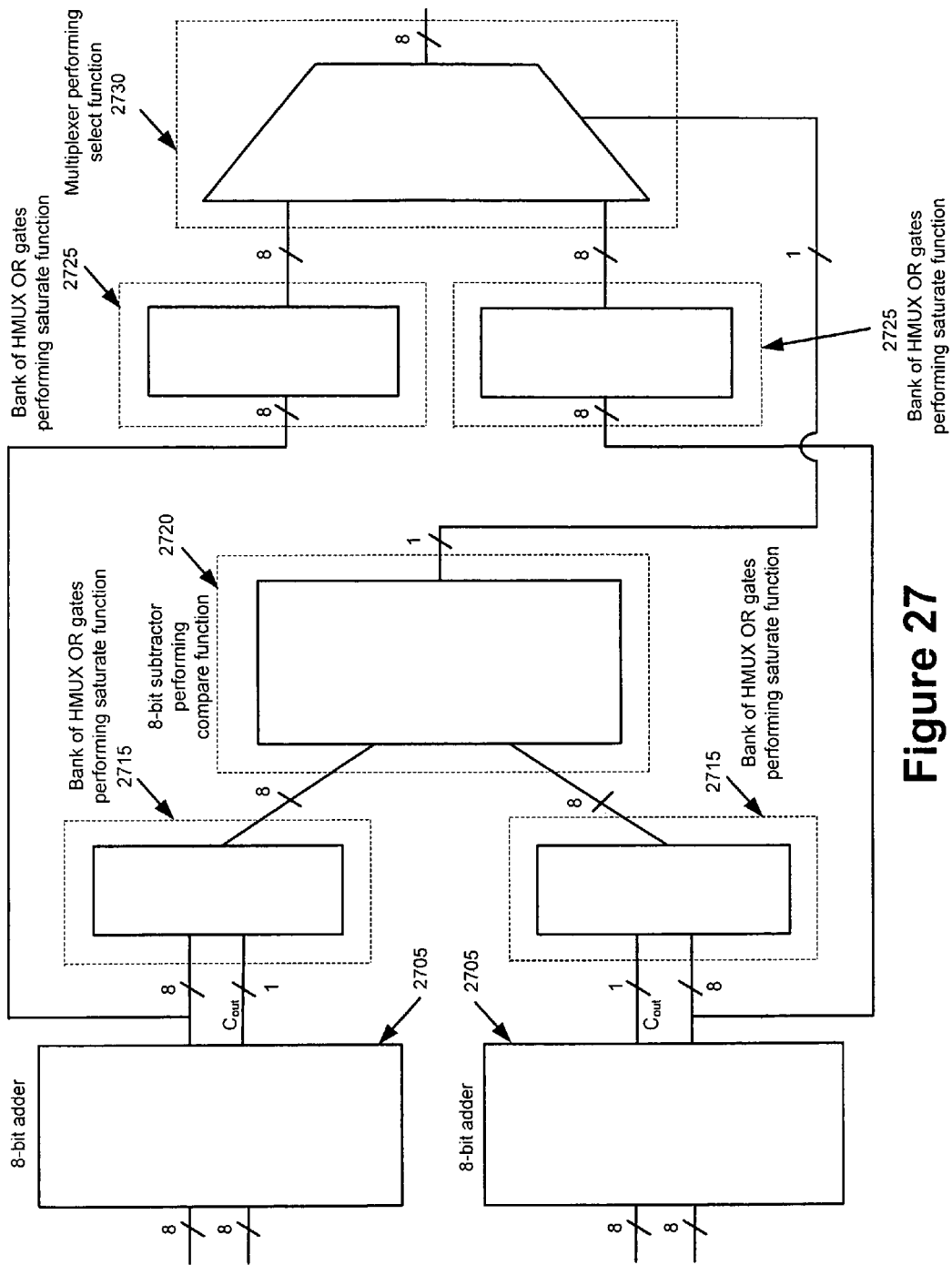
FIG. 27 illustrates components used to implement an ACS in some embodiments.

FIG. 27 conceptually illustrates how the block diagram of FIG. 26 is implemented in some embodiments. As an example, the diagram in FIG. 27 depicts the inputs to the adders as 8-bit numbers. A person of ordinary skill in the art, however, would recognize that any number of bits may be used for the input values without deviating from what is described here.

Figure 28:
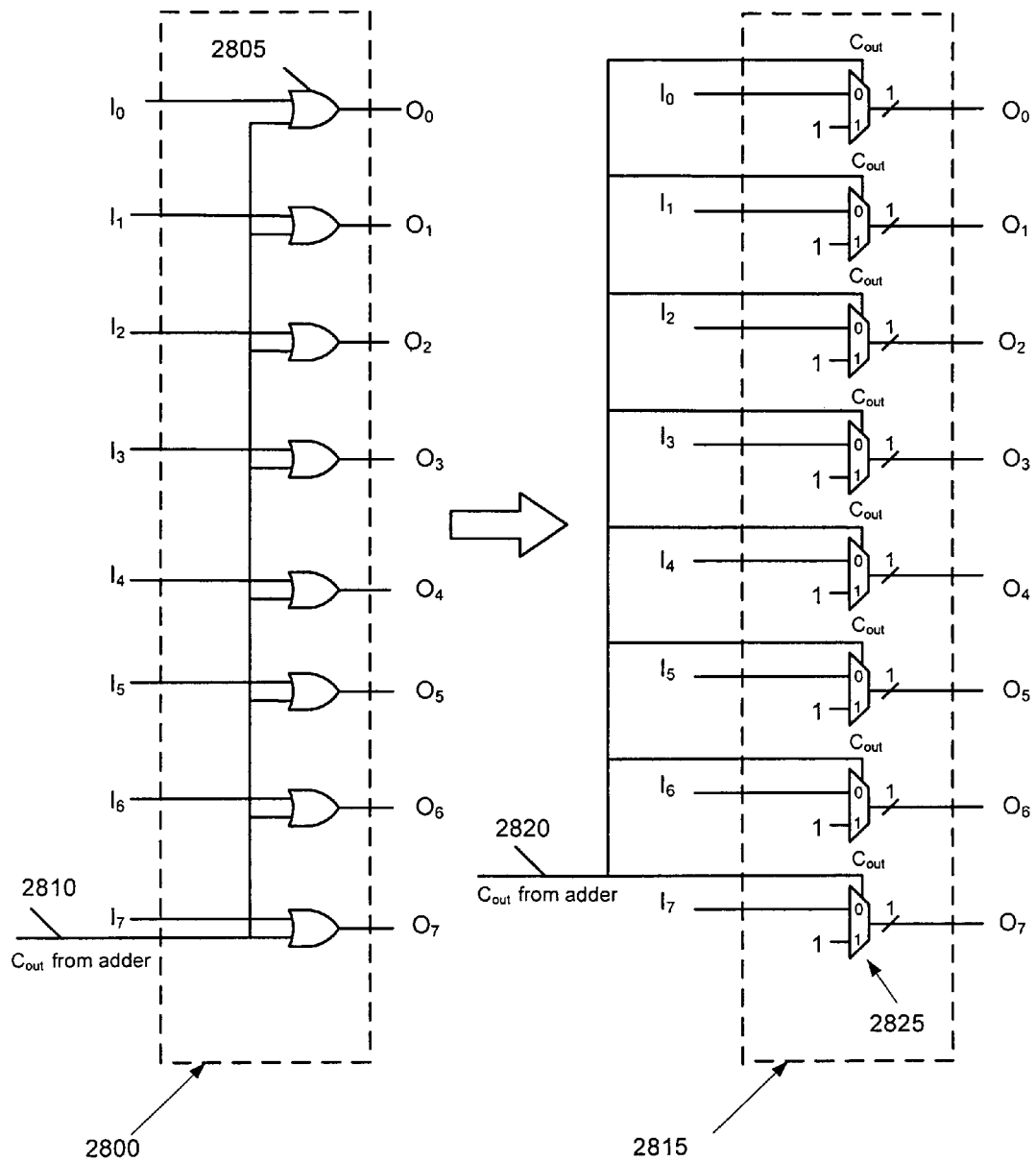
FIG. 28 shows how a bank of OR gates are implemented by using HMUXs in some embodiments to saturate the output of an adder.

In some embodiments, the saturate function 2715 is implemented by a bank of HMUXs configured as OR gates. FIG. 28 illustrates how a bank of OR gates 2800 perform the saturate function. The carry-out of the adders 2705 indicates whether the addition result has to be saturated. A carry-out value of 1 indicates that the result has exceeded the 8-bit maximum, in which case the results should be forced to all 1's. On the other hand, a carry-out value of 0 indicates that the results has not reached the maximum and the output of the addition should remain unchanged In FIG. 28, the carry-out of a particular adder is connected as one of the inputs of each OR gate 2805 in the bank of eight OR gates 2800. The other input of each OR gate 2805 is connected to one of the output bits of the particular adder. If the carry out is 0, the output $O_0$-$O_7$ of the OR gates 2805 will be the same as their input bits $I_0$-$I_7$. If, on the other hand, the carry-out of the adder is 1, the output bits $O_0$-$O_7$ of all OR gates will be set to 1.

Some embodiments implement the bank of OR gates 2800 by utilizing HMUXs. Each HMUX 2825 in the HMUX bank 2815 is configured by connecting the carry-out 2820 of the adder to its select line. The first input line $I_0$-$I_7$ of each HMUX 2825 receives one of the adder output bits. The second input line of each HMUX is set to 1. With this configuration, each HMUX operates as an OR gate, i.e., the only time that the output bit of an HMUX 2825 is 0 would be when both the select line and the first input are 0.

Figure 29:
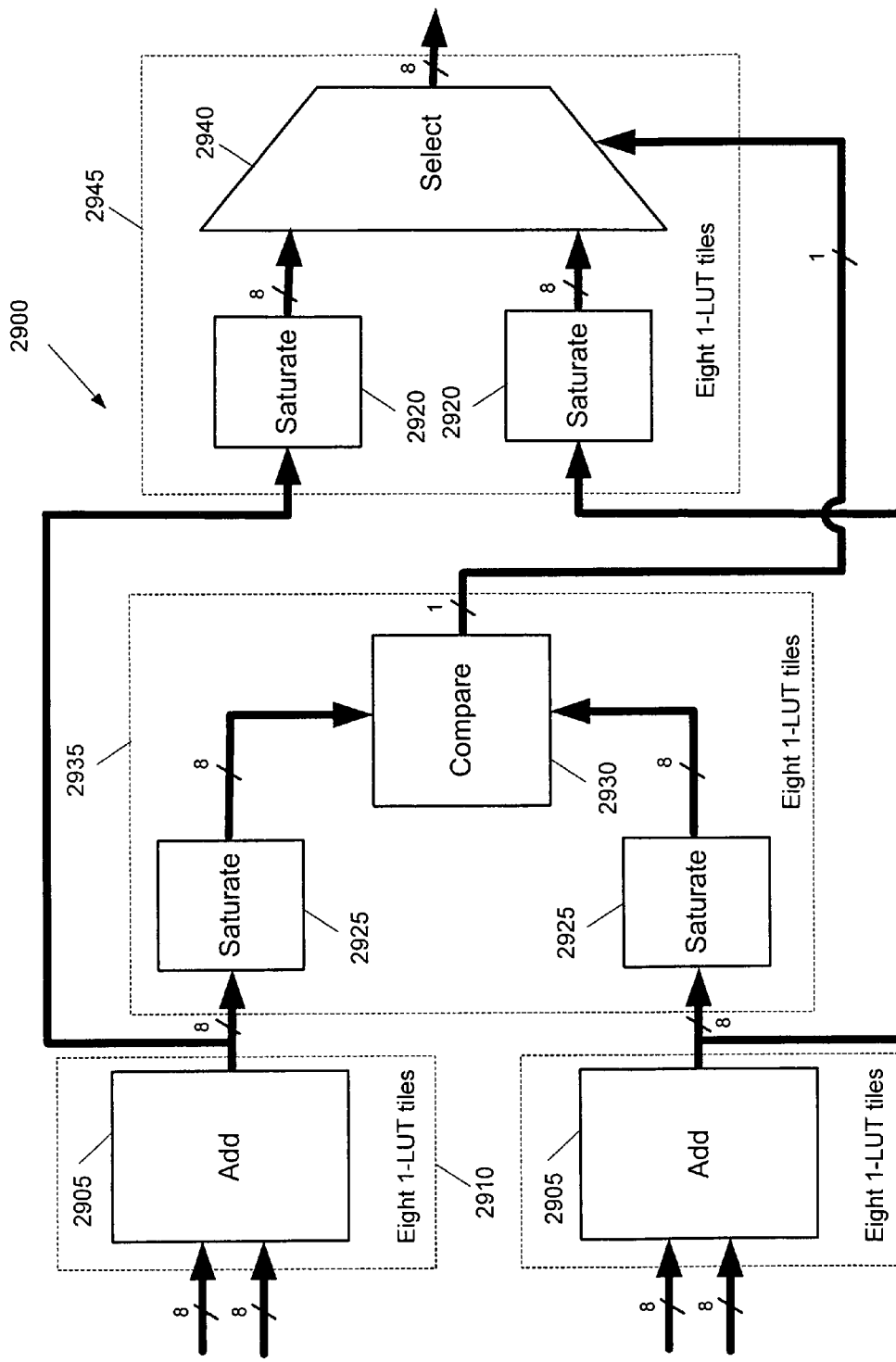
FIG. 29 illustrates the ACS resources vs. space in some embodiments.
Figure 30:
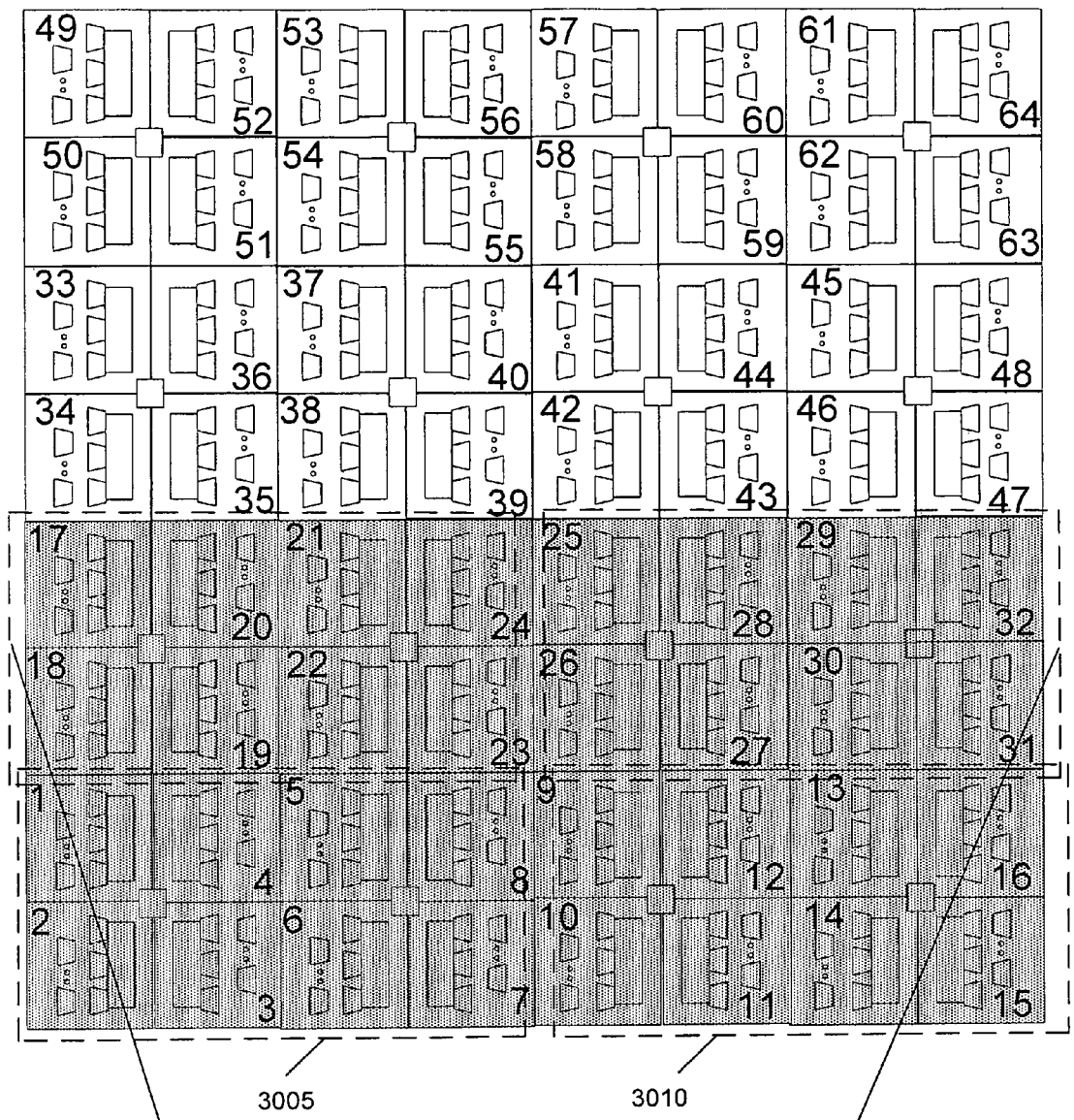
FIG. 30 illustrates a configurable IC implementing an ACS in some embodiments.

Referring back to FIG. 27, the compare function is implemented by an 8-bit subtractor. The borrow-out of the subtractor is used as the control line of the select function. The borrow-out is used to set the output of the select unit to the smaller of the two values that are being compared. The select function is implemented by utilizing an 8-bit multiplexer. Detailed techniques of implementing n-bit multiplexer using 2-bit HMUXs are described in the above-mentioned U.S. patent application Ser. No. 11/082,221. In some embodiments, the ACS unit shown in FIG. 27 is implemented by utilizing groups of configurable IC tiles where both subtractors used to implement the compare function and the multiplexer used to implement the select function are configured utilizing LUTs. FIG. 29 illustrates the block diagram of one such implementation 2900. Four groups of eight 1-LUT tiles are utilized to implement the ACS. Each adder 2905 is implemented by one group of eight tiles 2910. The two saturate units 2925 and the compare unit 2930 are implemented by one group 2935 of eight 1-LUT tiles. The two saturate units 2920 and the select unit 2940 are implemented by another group 2945 of eight 1-LUT tiles. FIG. 30 illustrates one way of allocating tiles to implement ACS 2900 in some embodiments. The groups of eight 1-LUT tiles 3005 and 3010 are utilized to implement the two adders. The two groups of eight 1-LUT tiles 3015 and 3020 are utilized to implement the two blocks 2935 and 2945 shown in FIG. 29.

Figure 31:
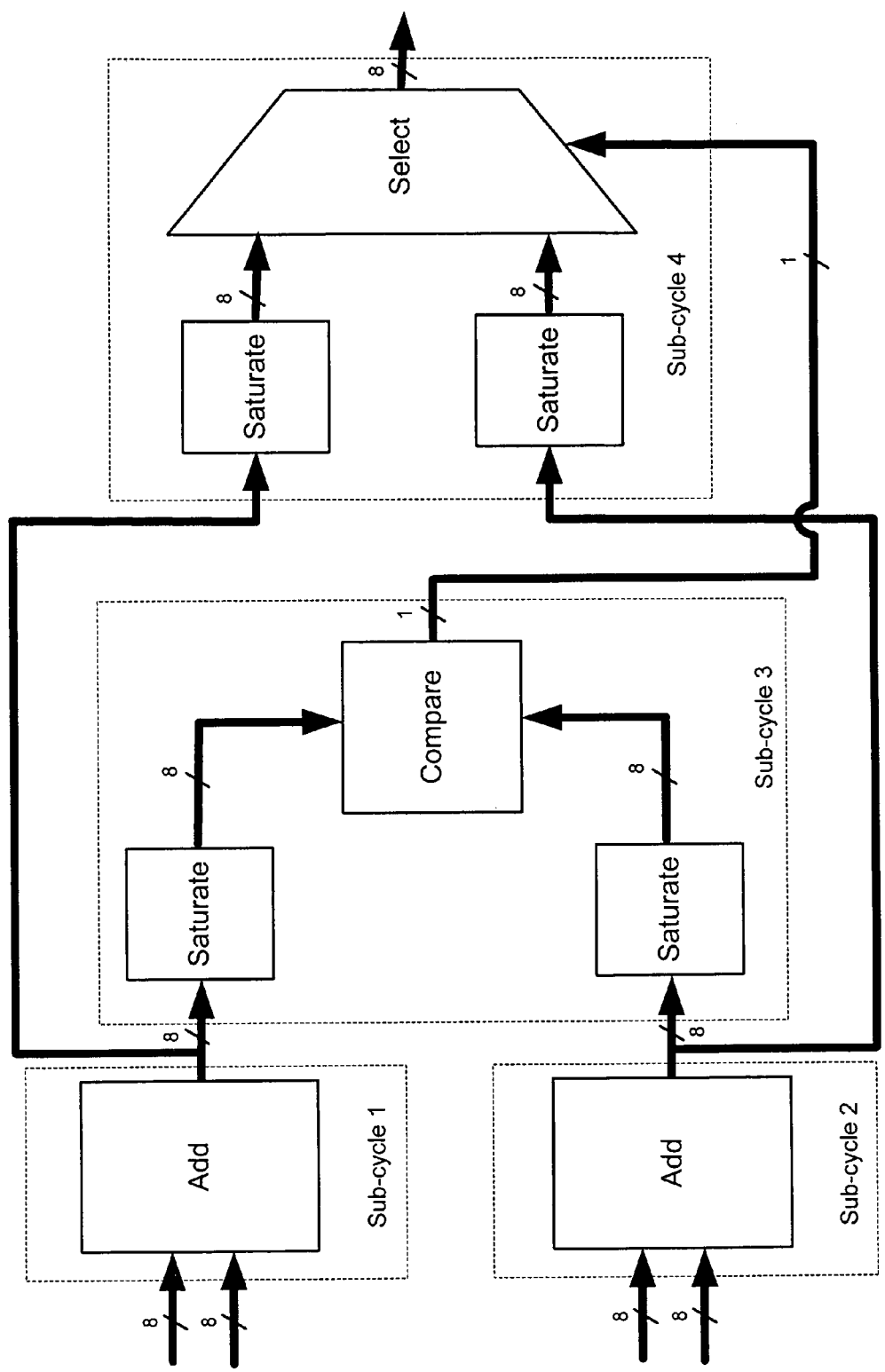
FIG. 31 illustrates the ACS resources vs. time in some embodiments.
Figure 32:
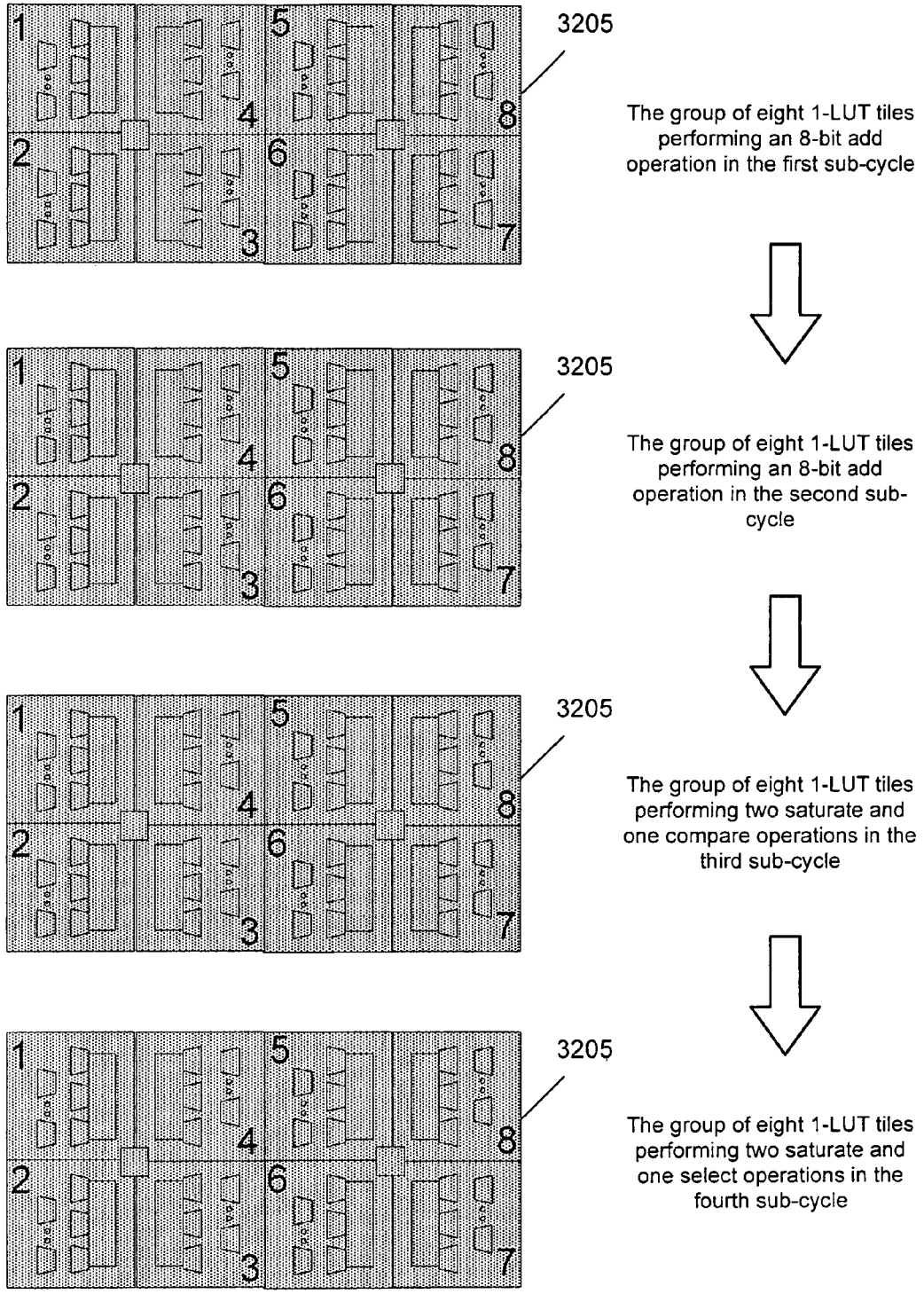
FIG. 32 illustrates a reconfigurable IC implementing an ACS in four sub-cycles in some embodiments.

If the eight 1-LUT tiles can operate on a faster clock rate than the primary clock, some embodiments can save on the number of tiles used by performing the operation of each group of 8-tiles in a different sub-cycle. For instance, FIG. 31 illustrates a block diagram of how the ACS resources are allocated in some embodiments using four sub-cycles. FIG. 32 illustrates how tiles in a reconfigurable IC of some embodiments may be allocated to implement block diagram of FIG. 31.

As shown in FIG. 32, the same group of tiles 3205 is used in four different sub-cycles to perform the two add, the saturate/compare, and the saturate/select functions. One important aspect of the ACS design of the embodiments described above is the fact that adding the extra two saturate units 2605 of FIG. 26 did not add any time or space overhead. Specifically, the extra space available in the eight 1-LUT tile group 3205 is utilized to perform the two saturate operations during the fourth sub-cycle. Also, the corresponding saturate operations are performed in the same sub-cycle as the select operation. Therefore, due to the special features of the configurable IC disclosed, the addition of the two extra saturate operations did not add any extra overhead. Instead, it enhanced the overall performance by utilizing the available HMUXs in each tile to avoid extra routing of the output of one saturate unit to both compare and select units. Specifically, the configurable IC discussed enables efficient replication of multiple functions across several sub-cycles within the same logic and routing resource. Another feature shown in FIG. 32 is utilizing the same circuits to perform mathematical operations (such as add or compare) in some sub-cycles and logical operations (such as select) in other sub-cycles.

In the example described above by reference to FIGS. 25-32, a saturate function is replicated in two sub-cycles. In each of these sub-cycles, the saturation function is implemented by a set of HMUXs. One of ordinary skill in the art will realize, however, that a function can be replicated in more than two sub-cycles. Also, different types of logic circuits might implement a function in the same or different sub-cycles. For instance, the saturate function illustrated in FIG. 26 can be implemented by a set of logic circuits in the third sub-cycle, and a set of HMUXs in the fourth sub-cycle. In the fourth sub-cycle, the output of the set of HMUXs would then be provided to a set of logic circuits that implement the select operation. Even this implementation of the saturate function (with the logic circuits in the third sub-cycle and the HMUXs in the fourth sub-cycle) is advantageous, as it uses HMUXs in the signal path to the logic circuits that perform the select operation. In other words, this implementation does not waste routing and logic resources to replicate the saturation function in the fourth sub-cycle.

VI. Electronics System

Figure 33:
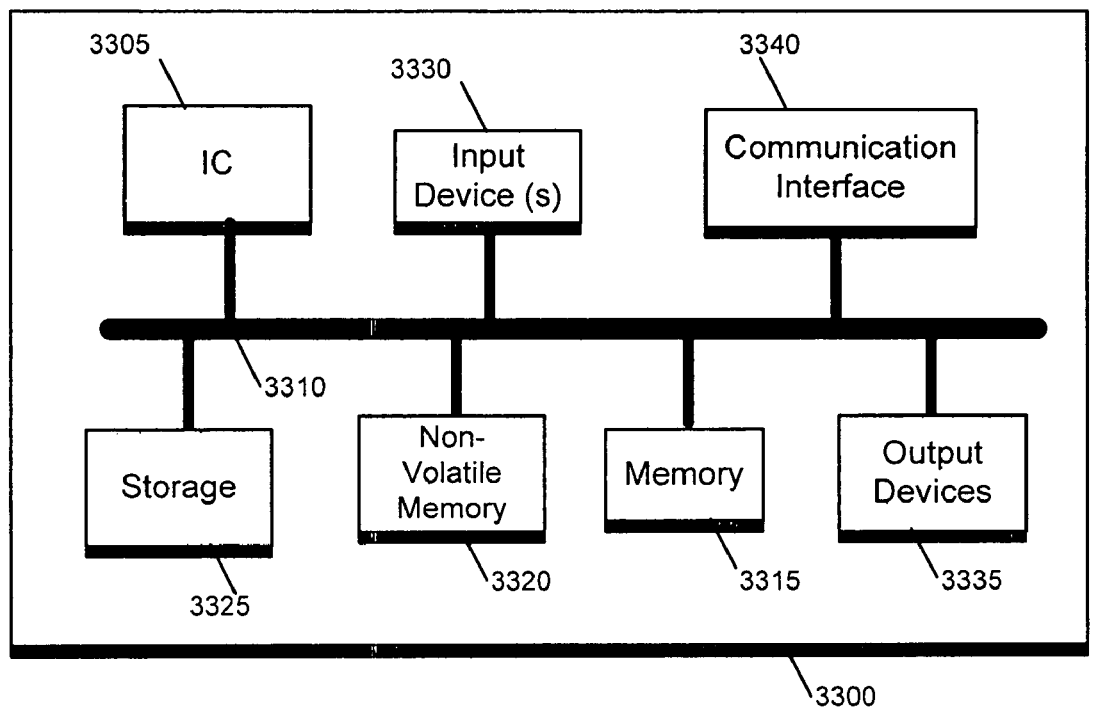
FIG. 33 conceptually illustrates an example of an electronics system that includes an IC of the invention.

FIG. 33 conceptually illustrates a more detailed example of an electronics system 3300 that has an IC 3305, which implements some of the above described inventions (such as using hybrid interconnect/logic circuits to do multiplication, using hybrid interconnect/logic circuits to enable efficient replication of a function in several sub-cycles, performing two's complement multiplication, and performing mathematical operations in sub-cycles). The system 3300 can be a stand-alone computing or communication device, or it can be part of another electronic device. As shown in FIG. 33, the system 3300 not only includes the IC 3305, but also includes a bus 3310, a system memory 3315, a non-volatile memory 3320, a storage device 3325, input devices 3330, output devices 3335, and communication interface 3340. In some embodiments, the non-volatile memory 3320 stores configuration data and re-loads it at power-up. Although the non-volatile memory 3320 is shown outside of the IC 3305, in some embodiments, the non-volatile memory is either on the same die or the same package as the IC 3305.

The bus 3310 collectively represents all system, peripheral, and chipset interconnects (including bus and non-bus interconnect structures) that communicatively connect the numerous internal devices of the system 3300. For instance, the bus 3310 communicatively connects the IC 3310 with the non-volatile memory 3320, the system memory 3315, and the permanent storage device 3325.

From these various memory units, the IC 3305 receives data for processing and configuration data for configuring the IC's configurable logic and/or interconnect circuits. When the IC 3305 has a processor, the IC also retrieves from the various memory units instructions to execute. The non-volatile memory 3320 stores static data and instructions that are needed by the IC 3310 and other modules of the system 3300. The storage device 3325, on the other hand, is read-and-write memory device. This device is a non-volatile memory unit that stores instruction and/or data even when the system 3300 is off. Like the storage device 3325, the system memory 3315 is a read-and-write memory device. However, unlike storage device 3325, the system memory is a volatile read-and-write memory, such as a random access memory. The system memory stores some of the instructions and/or data that the IC needs at runtime.

The bus 3310 also connects to the input and output devices 3330 and 3335. The input devices enable the user to enter information into the system 3300. The input devices 3330 can include touch-sensitive screens, keys, buttons, keyboards, cursor-controllers, microphone, etc. The output devices 3335 display the output of the system 3300.

Finally, as shown in FIG. 33, bus 3310 also couples system 3300 to other devices through a communication interface 3340. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. For example, although numerous embodiments were described by reference to flat tile architectures, one of ordinary skill in the art will realize that these embodiments could be implemented in other configurable IC architectures.

Also, in some embodiments, the position of many circuits (e.g., of routing and input-select interconnects in aligned tile layouts) are topologically illustrated in the figures. The actual physical location of these circuits may be different in different embodiments. For instance, in a computation aligned tile layout that has logic circuits and routing and input-select interconnects, some embodiments position (1) the logic circuits in the center of the aligned tile layout, (2) position the input-select interconnects above, below, to the right, and to the left of the centrally located logic circuits, and (3) position the routing interconnects in the remaining corner areas of the aligned tile layout with other circuits.

Many embodiments described above include input select interconnects for the logic circuits. Other embodiments, however, might not use such interconnects. Thus, one of ordinary skill in the art would understand that the invention is not to be limited by the foregoing illustrative details, but rather is to be defined by the appended claims.

I claim:

1. An integrated circuit ("IC") for performing a signed multiplication, the IC comprising:
   a set of configurable logic circuits, each configurable logic circuit for configurably performing a set of functions on a set of inputs; and
   a plurality of input select interconnect circuits for selecting the input set supplied to each configurable logic circuit,
   wherein the input select interconnect circuits multiply each individual bit of a first operand by every bit of a second operand to generate partial multiplication results,
   wherein the configurable logic circuits shiftably add all partial results except one partial result which is shiftably subtracted,
   wherein at least one of the input select interconnect circuits is configured to perform a logical NOT operation on a most significant bit of one of the operands and utilize a result of the NOT operation as a carry-in to perform a subtraction operation.

2. The IC of claim 1, wherein some of said input select interconnect circuits are configured to perform a logical AND operation on an individual bit of the first operand and an inverted individual bit of the second operand.

3. The IC of claim 1 further comprising:
   at least one multi-bit subtractor comprising a set of configurable logic circuits and their associated input select interconnect circuits to perform said shiftably subtracting of said one partial result.

4. The IC of claim 3 further comprising:
   at least one first-type multi-bit adder comprising a set of configurable logic circuits and their associated input select interconnect circuits to perform said shiftably adding of said partial results.

5. The IC of claim 1 further comprising:
   a configurable logic circuit and its associated input select interconnect circuits for generating a least significant bit of a multiplication result,
   wherein one of the associated input select interconnect circuits of the logic circuit is a hybrid interconnect/logic circuit implementing an AND operation.

6. An integrated circuit ("ICD") for performing a signed multiplication, the IC comprising:
   a set of configurable logic circuits, each configurable logic circuit for configurably performing a set of functions on a set of inputs; and
   a plurality of input select interconnect circuits for selecting the input set supplied to each configurable logic circuit,
   wherein the input select interconnect circuits multiply each individual bit of a first operand by every bit of a second operand to generate partial multiplication results,
   wherein the configurable logic circuits shiftably add all partial results except one partial result which is shiftably subtracted,
   wherein each operand has a most significant bit, wherein the most significant bit of the second operand is negated by a hybrid interconnect/logic circuit and is utilized as a carry-in for shiftably subtracting of said one partial result.

7. The IC of claim 6, wherein the most significant bit of each operand is considered to have a negative weight when generating said partial results.

8. The IC of claim 6, wherein the first operand has a least significant bit, wherein one of said partial multiplication results that is generated by multiplying the least significant bit of the first operand to every bit of the second operand is appended to have a most significant bit equal to the most significant bit of the second operand.

9. An integrated circuit ("ICD") for performing a signed multiplication, the IC comprising:
   a set of configurable logic circuits, each configurable logic circuit for configurably performing a set of functions on a set of inputs;
   a plurality of input select interconnect circuits for selecting the input set supplied to each configurable logic circuit,
   wherein the input select interconnect circuits multiply each individual bit of a first operand by every bit of a second operand to generate partial multiplication results,
   wherein the configurable logic circuits shiftably add all partial results except one partial result which is shiftably subtracted;
   at least one multi-bit subtractor comprising a first group of configurable logic circuits and their associated input select interconnect circuits to perform said shiftably subtracting of said one partial result;
   at least one first-type multi-bit adder comprising a second group of configurable logic circuits and their associated input select interconnect circuits to perform said shiftably adding of said partial results; and
   at least one second-type multi-bit adder comprising a third group of configurable logic circuits and their associated input select interconnect circuits to add a result of said at least one multi-bit subtractor and said at least one first-type first multi-bit adder.

10. An integrated circuit ("ICD") for performing a signed multiplication, the IC comprising
    a set of configurable logic circuits, each configurable logic circuit for configurably performing a set of functions on a set of inputs;
    a plurality of input select interconnect circuits for selecting the input set supplied to each configurable logic circuit,
    wherein the input select interconnect circuits multiply each individual bit of a first operand by every bit of a second operand to generate partial multiplication results,
    wherein the configurable logic circuits shiftably add all partial results except one partial result which is shiftably subtracted;
    at least one multi-bit first subtractor comprising a group of configurable logic circuits and their associated input select interconnect circuits to perform said shiftably subtracting of said one partial result; and a second subtractor to invert a carry-out of said multi-bit first subtractor.

11. An electronics system comprising:

an integrated circuit ("IC") for performing a signed multiplication, the IC comprising:

a set of configurable logic circuits, each configurable logic circuit for configurably performing a set of functions on a set of inputs; and a plurality of input select interconnect circuits for selecting the input set supplied to each configurable logic circuit, wherein the input select interconnect circuits multiply each individual bit of a first operand by every bit of a second operand to generate partial multiplication results, wherein the configurable logic circuits shiftably add all partial results except one partial result which is shiftably subtracted, wherein each multiplication operand has a most significant bit, wherein at least one of the input select interconnect circuits is configured to perform a logical NOT operation on a most significant bit of one of the operands and utilize a result of the NOT operation as a carry-in to perform a subtraction operation.

12. The electronics system of claim 11, wherein the most significant bit of each operand is considered to have a negative weight when generating said partial results.

13. The electronics system of claim 11, wherein the first operand has a least significant bit, wherein one of said partial multiplication results that is generated by multiplying the least significant bit of the first operand to every bit of the second operand is appended to have a most significant bit equal to the most significant bit of the second operand.

14. The electronic system of claim 11 further comprising a non-volatile memory for storing configuration data and for supplying configuration data to the IC when the IC powers up.

* * * * *